(12) United States Patent
Han et al.

(10) Patent No.: US 9,178,162 B2
(45) Date of Patent: Nov. 3, 2015

(54) COMPOUND FOR ORGANIC LIGHT-EMITTING DEVICE AND ORGANIC LIGHT-EMITTING DEVICE INCLUDING THE SAME

(71) Applicant: SAMSUNG DISPLAY CO., LTD., Yongin-si, Gyeonggi-Do (KR)

(72) Inventors: Sang-Hyun Han, Yongin (KR); Seok-Hwan Hwang, Yongin (KR); Young-Kook Kim, Yongin (KR); Hye-Jin Jung, Yongin (KR); Jin-O Lim, Yongin (KR); Soo-Yon Kim, Yongin (KR); Eun-Jae Jeong, Yongin (KR); Jun-Ha Park, Yongin (KR); Eun-Young Lee, Yongin (KR); Hee-Joo Ko, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 199 days.

(21) Appl. No.: 13/766,734

(22) Filed: Feb. 13, 2013

(65) Prior Publication Data

US 2014/0014916 A1    Jan. 16, 2014

(30) Foreign Application Priority Data

Jul. 11, 2012 (KR) .......................... 10-2012-0075742

(51) Int. Cl.
  *H01L 51/00* (2006.01)
  *C09K 11/06* (2006.01)
  *H01L 51/50* (2006.01)

(52) U.S. Cl.
  CPC .............. *H01L 51/006* (2013.01); *C09K 11/06* (2013.01); *H01L 51/0052* (2013.01); *H01L 51/0059* (2013.01); *H01L 51/0061* (2013.01); *H01L 51/0067* (2013.01); *C09K 2211/1007* (2013.01); *C09K 2211/1011* (2013.01); *C09K 2211/1014* (2013.01); *C09K 2211/1029* (2013.01); *C09K 2211/1044* (2013.01); *C09K 2211/1059* (2013.01); *H01L 51/5012* (2013.01)

(58) Field of Classification Search
  None
  See application file for complete search history.

(56) References Cited

U.S. PATENT DOCUMENTS 7,053,255 B2   5/2006   Ikeda et al.
7,233,019 B2   6/2007   Ionkin et al.

(Continued)

FOREIGN PATENT DOCUMENTS

| JP | 2006-273737 A | 10/2006 |
| KR | 10-2006-0006760 | 1/2006 |
| KR | 10-2007-0119470 | 12/2007 |
| KR | 10-2008-0039057 | 5/2008 |
| KR | 10-2010-0026373 | 3/2010 |
| KR | 10-2010-0118258 | 11/2010 |
| WO | WO 2010/126233 A1 | 11/2010 |

*Primary Examiner* — J. L. Yang
(74) *Attorney, Agent, or Firm* — Christie, Parker & Hale, LLP

(57) ABSTRACT

Embodiments of the present invention are directed to a compound represented by Formula 1, and to an organic light-emitting device including the compound.

20 Claims, 1 Drawing Sheet

Formula 1

(56) References Cited

U.S. PATENT DOCUMENTS

| | | |
|---|---|---|
| 2005/0156164 A1 | 7/2005 | Sotoyama |
| 2007/0290610 A1 | 12/2007 | Park et al. |
| 2008/0100207 A1* | 5/2008 | Park et al. .................. 313/504 |
| 2011/0042656 A1* | 2/2011 | Burroughes et al. ........... 257/40 |

* cited by examiner

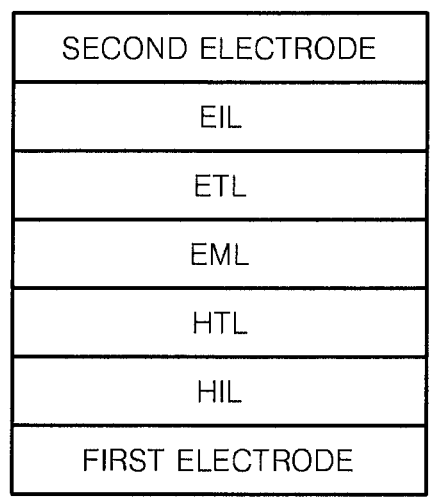

COMPOUND FOR ORGANIC LIGHT-EMITTING DEVICE AND ORGANIC LIGHT-EMITTING DEVICE INCLUDING THE SAME

CROSS-REFERENCE TO RELATED PATENT APPLICATION

This application claims priority to and the benefit of Korean Patent Application No. 10-2012-0075742, filed on Jul. 11, 2012 in the Korean Intellectual Property Office, the entire content of which is incorporated herein by reference.

BACKGROUND

1. Technical Field

The present invention relates to a compound for organic light-emitting devices, and an organic light-emitting device including the compound.

2. Description of the Related Art

Organic light-emitting devices (OLEDs) are self-emitting devices having advantages such as wide viewing angles, good contrast, quick response speeds, high brightness, and good driving voltage characteristics. Also, OLEDs can provide multicolored images.

A typical OLED has a structure including a substrate, and an anode, a hole transport layer (HTL), an emission layer (EML), an electron transport layer (ETL), and a cathode are sequentially stacked on the substrate. In this regard, the HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons recombine in the EML to generate excitons. When the excitons drop from an excited state to a ground state, light is emitted.

A major factor affecting the luminescent efficiency of OLEDs is the luminescent material. Light-emitting materials that are currently used include fluorescent materials or phosphorescent materials, but these materials are not satisfactory in terms of efficiency, driving voltage, and lifetime.

SUMMARY OF THE INVENTION

Embodiments of the present invention are directed to a novel compound for an organic light-emitting device with improved characteristics, and a high-efficiency, low-voltage, high-luminance, and long-lifetime organic light-emitting device including the compound. The novel compound has improved electrical characteristics, good charge transporting capabilities, improved emission capability, and a glass transition temperature ($T_g$) high enough to prevent crystallization. The novel compound is suitable as an electron transporting material for fluorescent or phosphorescent devices of any color, or as a red, green, blue, or white light-emitting material with higher emission efficiency and longer lifetime than existing host materials. The novel compound also has appropriate color coordinates.

According to an aspect of the present invention, a compound for an organic light-emitting device is represented by Formula 1 below.

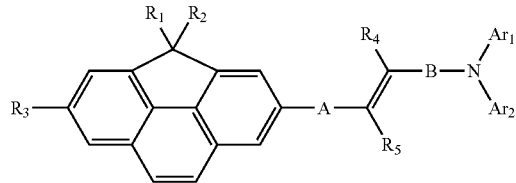

Formula 1

In Formula 1, $R_1$, $R_2$, $R_3$, $R_4$, and $R_5$ are each independently a hydrogen atom, a deuterium atom, a halogen atom, a cyano group, a substituted or unsubstituted $C_1$-$C_{60}$ alkyl group, a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group.

$Ar_1$ and $Ar_2$ are each independently a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group.

A and B are each independently a bond; a divalent linker with a substituted or unsubstituted $C_6$-$C_{60}$ arylene group, a substituted or unsubstituted $C_3$-$C_{60}$ heteroarylene group, or a substituted or unsubstituted $C_6$-$C_{60}$ condensed polycyclic group; or a linker with at least two linked groups selected substituted or unsubstituted $C_6$-$C_{60}$ arylene groups, substituted or unsubstituted $C_3$-$C_{60}$ heteroarylene groups, or substituted or unsubstituted $C_6$-$C_{60}$ condensed polycyclic groups. However, A and B are not both a phenylene group or a bond.

According to another aspect of the present invention, an organic light-emitting device includes a first electrode, a second electrode, and an organic layer between the first electrode and the second electrode. The organic layer includes the compound of Formula 1 described above.

According to another aspect of the present invention, a flat panel display device includes the above-described organic light-emitting device, in which the first electrode of the organic light-emitting device is electrically connected to a source electrode or a drain electrode of a thin-film transistor.

BRIEF DESCRIPTION OF THE DRAWING

The above and other features and advantages of the present invention will become more apparent by reference to the following detailed description when considered in conjunction with the attached drawing in which:

FIG. 1 is a schematic of a structure of an organic light-emitting device according to an embodiment of the present invention.

DETAILED DESCRIPTION

As used herein, the term "and/or" includes any and all combinations of one or more of the associated listed items. Expressions such as "at least one of," when preceding a list of elements, modify the entire list of elements and do not modify the individual elements of the list.

According to an aspect of the present invention, an organic light-emitting compound is represented by Formula 1 below.

Formula 1

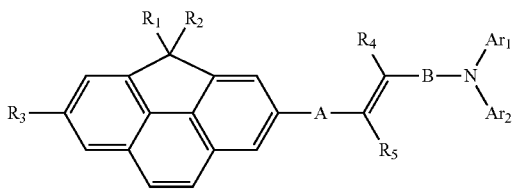

in Formula 1, $R_1$, $R_2$, $R_3$, $R_4$, and $R_5$ are each independently a hydrogen atom, a deuterium atom, a halogen atom, a cyano group, a substituted or unsubstituted $C_1$-$C_{60}$ alkyl group, a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group.

$Ar_1$ and $Ar_2$ are each independently a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group.

A and B are each independently a bond; a divalent linker with a substituted or unsubstituted $C_6$-$C_{60}$ arylene group, a substituted or unsubstituted $C_3$-$C_{60}$ heteroarylene group, or a substituted or unsubstituted $C_6$-$C_{60}$ condensed polycyclic group; or a linker with at least two linked groups selected from substituted or unsubstituted $C_6$-$C_{60}$ arylene groups, substituted or unsubstituted $C_3$-$C_{60}$ heteroarylene groups, or substituted or unsubstituted $C_6$-$C_{60}$ condensed polycyclic groups. However, A and B are not both a phenylene group or a bond.

According to embodiment of the present invention, the compound of Formula 1 may have higher luminescent efficiency and improved lifetime characteristics, as compared with existing dopant materials. Thus, an organic light-emitting device manufactured using the compound may have a longer lifetime, and higher power efficiency with improved power consumption.

Substituents in the compound of Formula 1 will now be described in detail.

In some embodiments, $R_1$, $R_2$, $R_3$, $R_4$, and $R_5$ in Formula 1 above may be each independently a hydrogen atom, a deuterium atom, a cyano group, a halogen atom, a substituted or unsubstituted $C_1$-$C_{30}$ alkyl group, a substituted or unsubstituted $C_6$-$C_{40}$ aryl group, a substituted or unsubstituted $C_3$-$C_{30}$ heteroaryl group, or a substituted or unsubstituted $C_6$-$C_{30}$ condensed polycyclic group. $Ar_1$ and $Ar_2$ may be each independently a substituted or unsubstituted $C_6$-$C_{30}$ aryl group, a substituted or unsubstituted $C_3$-$C_{30}$ heteroaryl group, or a substituted or unsubstituted $C_6$-$C_{30}$ condensed polycyclic ring. A and B may be each independently a bond; a divalent linker with a substituted or unsubstituted $C_6$-$C_{30}$ arylene group, a substituted or unsubstituted $C_3$-$C_{30}$ heteroarylene group, a substituted or unsubstituted $C_6$-$C_{30}$ condensed polycyclic group; or a linker with at least two linked groups selected from substituted or unsubstituted $C_6$-$C_{60}$ arylene groups, substituted or unsubstituted $C_3$-$C_{60}$ heteroarylene groups, or substituted or unsubstituted $C_6$-$C_{60}$ condensed polycyclic groups.

In some embodiments, $R_4$ and $R_5$ in Formula 1 may be each independently a hydrogen atom, a deuterium atom, a substituted or unsubstituted $C_1$-$C_{30}$ alkyl group, or a substituted or unsubstituted $C_6$-$C_{30}$ aryl group.

In some other embodiments, $R_1$, $R_2$, $R_3$, $R_4$, and $R_5$ in Formula 1 may be each independently a hydrogen atom, a deuterium atom, a halogen group, a cyano group, a substituted or unsubstituted $C_1$-$C_{20}$ alkyl group, or one of the groups represented by Formulae 2a to 2e below.

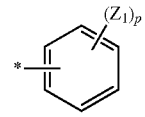

2a

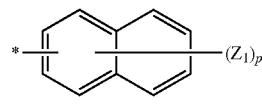

2b

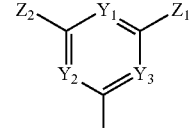

2c

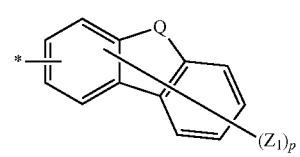

2d

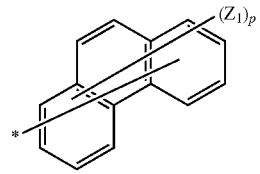

2e

In Formulae 2a to 2e above, $Y_1$, $Y_2$, and $Y_3$ are each independently a linking group represented by —N=, —N($R_{20}$)—, or —C($R_{21}$)=.

Q is a linking group represented by —C($R_{30}$)($R_{31}$)—, —N($R_{32}$)—, —S—, or —O—.

$Z_1$, $Z_2$, $R_{20}$, $R_{21}$, $R_{30}$, $R_{31}$, and $R_{32}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxyl group, or a carboxyl group.

p is an integer from 1 to 9.

* indicates a binding site.

In some other embodiments, A and B in Formula 1 above may be each independently a bond, one of the groups represented by Formulae 3a to 3e below, or a linker with at least two of the groups represented by Formulae 3a to 3e connected to each other (*indicates a binding site).

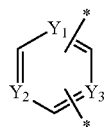

3a

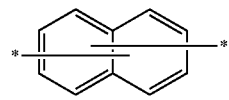

3b

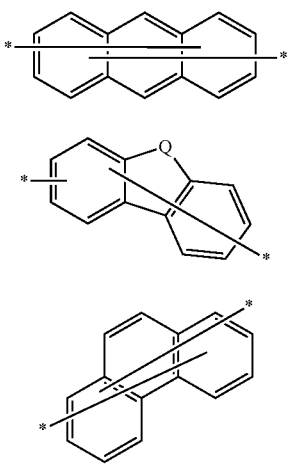

In Formulae 3a to 3e, $Y_1$, $Y_2$, and $Y_3$ are each independently a linking group represented by —N═, —N($R_{20}$)—, or —C($R_{21}$)═.

Q is a linking group represented by —C($R_{30}$)($R_{31}$)—, —N($R_{32}$)—, —S—, or —O—.

$R_{20}$, $R_{21}$, $R_{30}$, $R_{31}$, and $R_{32}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxyl group, or a carboxyl group.

In some embodiments, $Ar_1$ and $Ar_2$ in Formula 1 may be each independently one of the groups represented by Formulae 4a to 4e below.

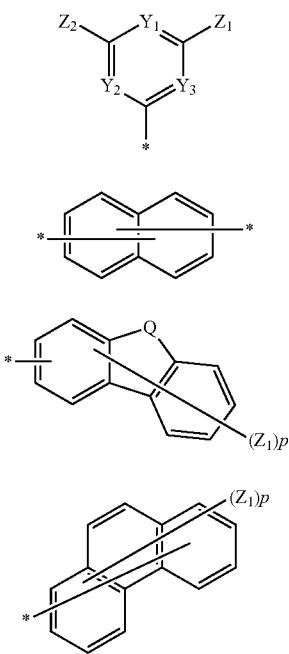

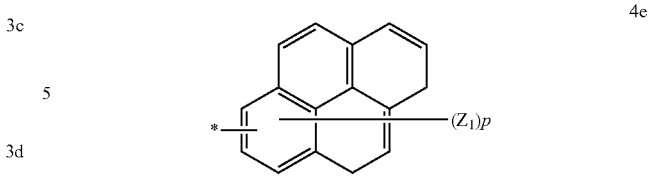

In Formulae 4a to 4e, $Y_1$, $Y_2$, and $Y_3$ are each independently a linking group represented by —N═, —N($R_{20}$)—, or —C($R_{21}$)═.

Q is a linking group represented by —C($R_{30}$)($R_{31}$)—, —N($R_{32}$)—, —S—, or —O—.

$Z_1$, $Z_2$, $R_{20}$, $R_{21}$, $R_{30}$, $R_{31}$, and $R_{32}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxyl group, or a carboxyl group. Adjacent $R_{30}$ and $R_{31}$ groups may optionally link to form a ring;

p is an integer from 1 to 9.

* indicates a binding site.

In some other embodiments, $Ar_1$ and $Ar_2$ in Formula 1 above may be linked together to form a ring.

Hereinafter, substituents described with reference to the formulae will now be described in detail. In this regard, the numbers of carbon atoms in the substituents are presented only for illustrative purposes, and do not limit the characteristics of the substituents The unsubstituted $C_1$-$C_{60}$ alkyl group, as used herein, may be linear or branched. Examples of the alkyl group include, but are not limited to, a methyl group, an ethyl group, a propyl group, an isobutyl group, a sec-butyl group, a pentyl group, an iso-amyl group, a hexyl group, a heptyl group, an octyl group, a nonanyl group, and a dodecyl group. To obtain the substituted $C_1$-$C_{60}$ alkyl group, at least one hydrogen atom of the alkyl group may be substituted with a heavy hydrogen atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, or a $C_4$-$C_{16}$ heteroaryl group.

The unsubstituted $C_2$-$C_{60}$ alkenyl group indicates an unsaturated alkyl group having at least one carbon-carbon double bond in the center or at a terminal end of the alkyl group. Examples of the alkenyl group include, but are not limited to, an ethenyl group, a propenyl group, a butenyl group, and the like. To obtain the substituted $C_2$-$C_{60}$ alkenyl group, at least one hydrogen atom in the unsubstituted alkenyl group may be substituted with the substituents described above in connection with the alkyl group.

The unsubstituted $C_2$-$C_{60}$ alkynyl group indicates an alkyl group having at least one carbon-carbon triple bond in the center or at a terminal end of the alkyl group. Non-limiting examples of the unsubstituted $C_2$-$C_{20}$ alkynyl group include acetylene, propylene, phenylacetylene, naphthylacetylene, isopropylacetylene, t-butylacetylene, and diphenylacetylene. To obtain the substituted $C_2$-$C_{60}$ alkynyl group, at least one hydrogen atom in the alkynyl group may be substituted with the substituents described above in connection with the alkyl group.

The unsubstituted $C_3$-$C_{60}$ cycloalkyl group indicates a $C_3$-$C_{60}$ cyclic alkyl group. To obtain the substituted $C_3$-$C_{60}$ cycloalkyl group, at least one hydrogen atom in the cycloalkyl group may be substituted with the substituents described above in connection with the $C_1$-$C_{60}$ alkyl group.

The unsubstituted $C_1$-$C_{60}$ alkoxy group indicates a group having a structure of —OA in which A is an unsubstituted $C_1$-$C_{60}$ alkyl group as described above. Nonlimiting examples of the unsubstituted $C_1$-$C_{60}$ alkoxy group include a methoxy group, an ethoxy group, a propoxy group, an isopropyloxy group, a butoxy group, and a pentoxy group. To obtain the substituted $C_1$-$C_{60}$ alkoxy group, at least one hydrogen atom of the alkoxy group may be substituted with the substituents described above in connection with the alkyl group.

The unsubstituted $C_6$-$C_{60}$ aryl group indicates a carbocyclic aromatic system containing at least one ring. When the group contains at least two rings, they may be fused to each other or linked to each other by a single bond. The term 'aryl' refers to an aromatic system, such as phenyl, naphthyl, or anthracenyl. To obtain the substituted $C_6$-$C_{60}$ aryl group, at least one hydrogen atom in the aryl group may be substituted with the substituents described above in connection with the unsubstituted $C_1$-$C_{60}$ alkyl group.

Non-limiting examples of the substituted or unsubstituted $C_6$-$C_{60}$ aryl group include a phenyl group, a $C_1$-$C_{10}$ alkylphenyl group (for example, ethylphenyl group), a halophenyl group (for example, o-, m-, and p-fluorophenyl groups, dichlorophenyl groups), a cyanophenyl group, dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, o-, m-, and p-toryl groups, o-, m-, and p-cumenyl groups, a mesityl group, a phenoxyphenyl group, a ($\alpha,\alpha$-dimethylbenzene) phenyl group, a (N,N'-dimethyl)aminophenyl group, a (N,N'-diphenyl)aminophenyl group, a pentalenyl group, an indenyl group, a naphthyl group, a halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrysenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The unsubstituted $C_3$-$C_{60}$ heteroaryl group, as used herein, includes one, two or three hetero atoms selected from N, O, P and S. When the group includes at least two rings, they may be fused to each other or linked to each other by a single bond. Non-limiting examples of the unsubstituted $C_4$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolyl group, an isoquinolyl group, and a dibenzothiophene group. In addition, to obtain the substituted $C_3$-$C_{60}$ heteroaryl group, at least one hydrogen atom in the heteroaryl group may be substituted with the substituents described above in connection with the unsubstituted $C_1$-$C_{60}$ alkyl group.

The unsubstituted $C_6$-$C_{60}$ aryloxy group is a group represented by —$OA_1$ in which $A_1$ may be a $C_6$-$C_{60}$ aryl group. An example of the aryloxy group is aphenoxy group. To obtain the substituted $C_5$-$C_{60}$ aryloxy group, at least one hydrogen atom in the aryloxy group may be substituted with the substituents described above in connection with the unsubstituted $C_1$-$C_{60}$ alkyl group.

The unsubstituted $C_6$-$C_{60}$ arylthio group is represented by —$SA_1$ where $A_l$ may be a $C_6$-$C_{60}$ aryl group. Non-limiting examples of the arylthio group include a benzenethio group and a naphthylthio group. To obtain the substituted $C_6$-$C_{60}$ arylthio group, at least one hydrogen atom in the arylthio group may be substituted with the substituents described above in connection with the unsubstituted $C_1$-$C_{60}$ alkyl group.

The unsubstituted $C_6$-$C_{60}$ condensed polycyclic group, as used herein, refers to a substituent including at least two rings in which at least one aromatic ring and/or at least one non-aromatic ring are fused to each other, or refers to a substituent having an unsaturated group in a ring that may not form a conjugate structure. The unsubstituted $C_6$-$C_{60}$ condensed polycyclic group is distinct from the aryl group or heteroaryl group in terms of being non-aromatic.

Non-limiting examples of the compound represented by Formula 1 include Compounds 1 to 91 represented by the following formulae.

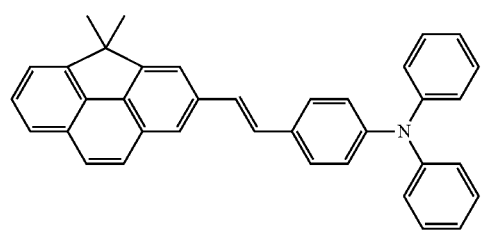

1

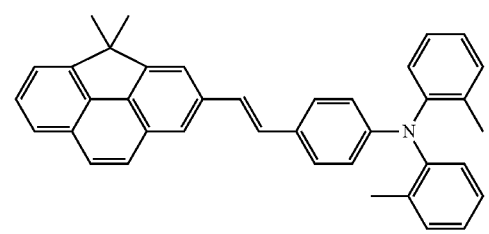

2

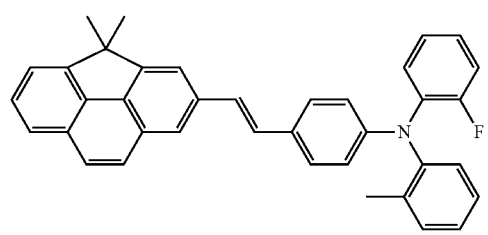

3

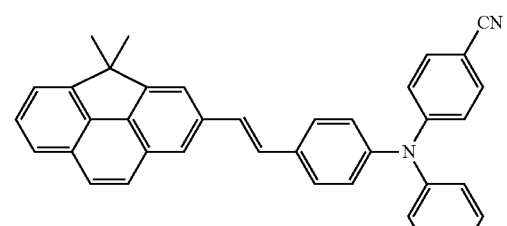

4

-continued
5
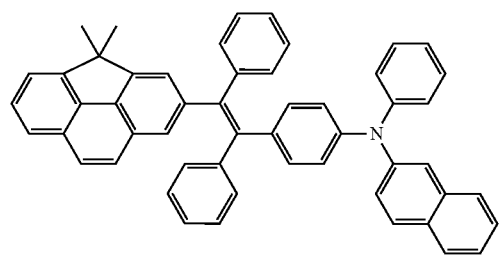
6
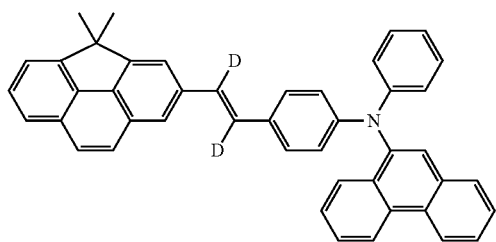
7
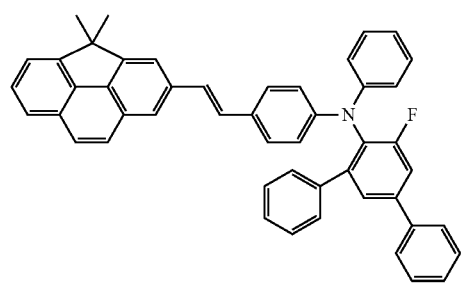
8
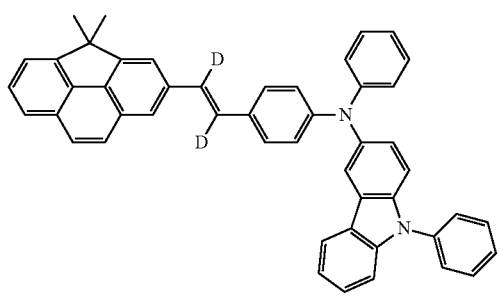
9
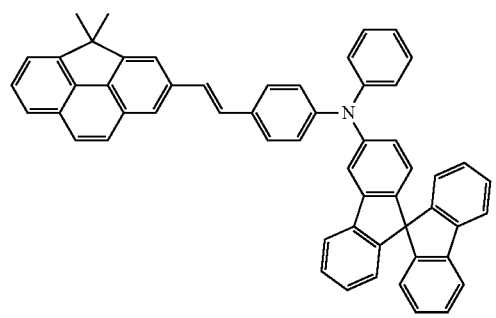
10
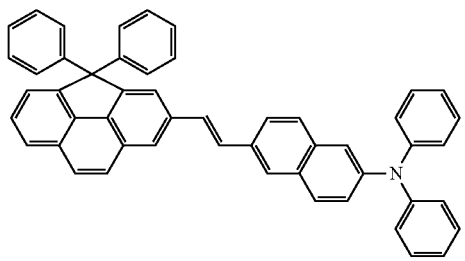
11
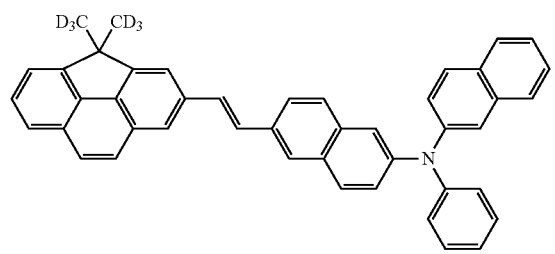
12
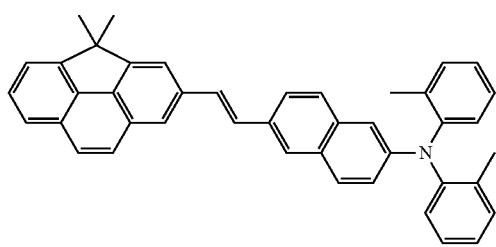
13
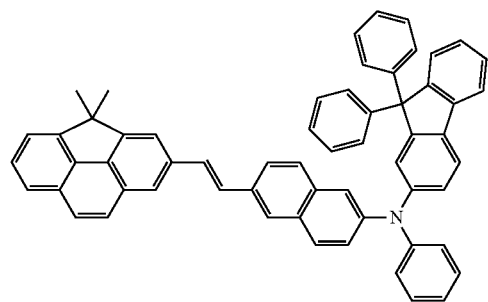
14
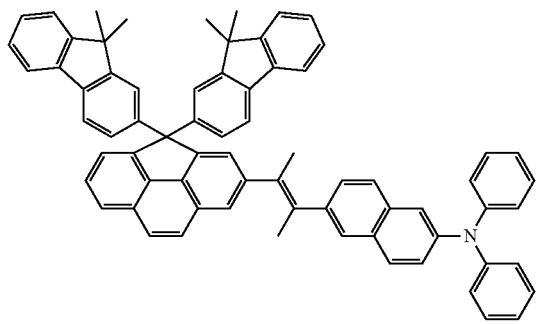

-continued
15
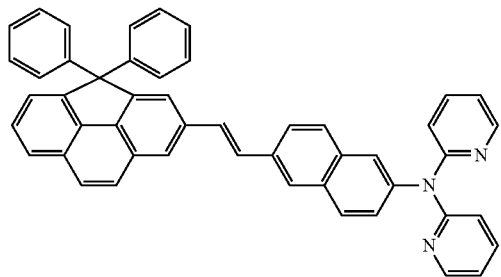
16
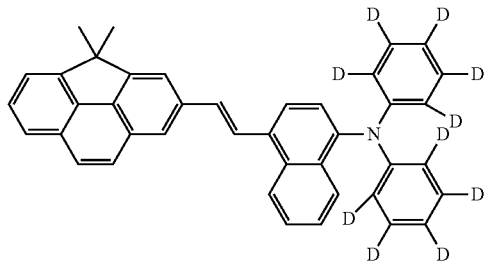
17
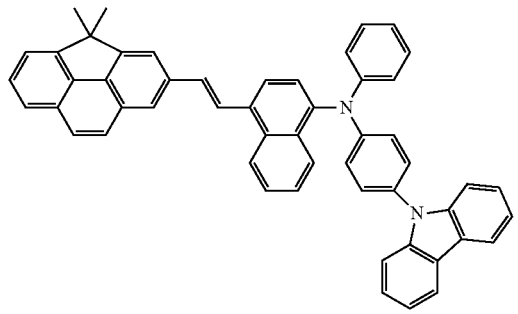
18
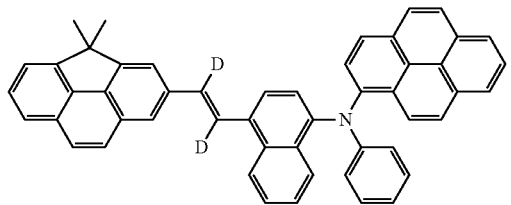
19
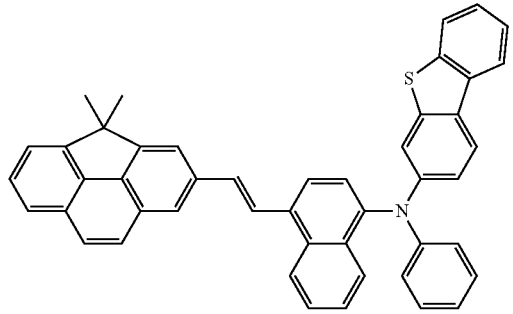
20
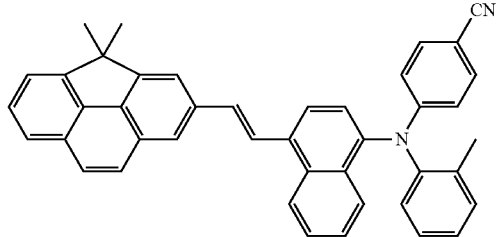
21
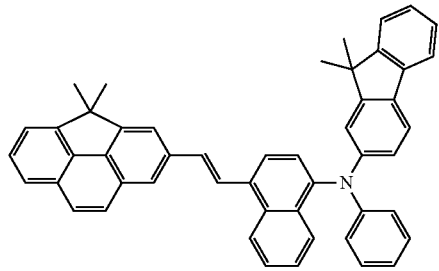
22
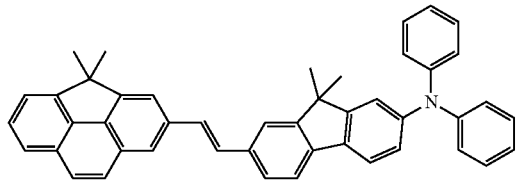
23
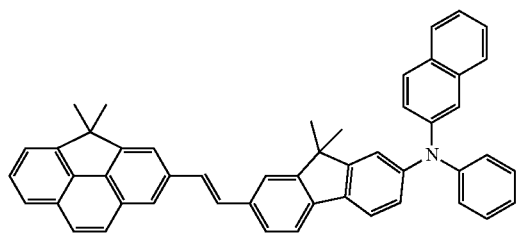
24
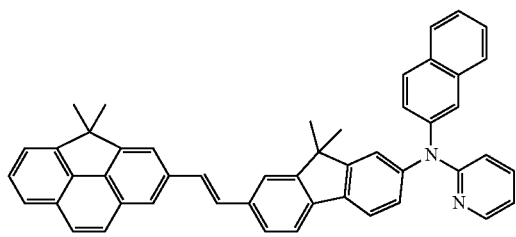

-continued
25
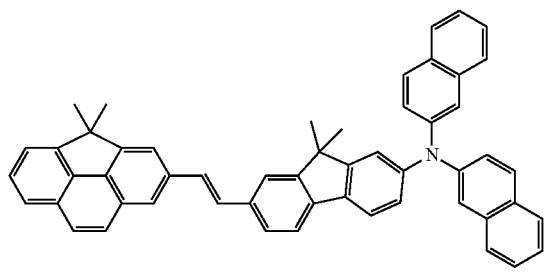
26
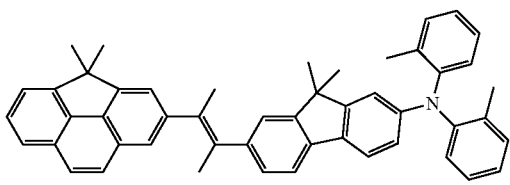
27
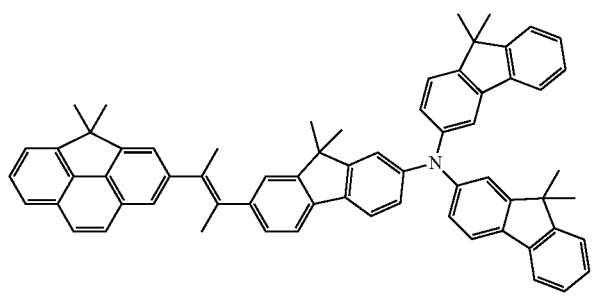
28
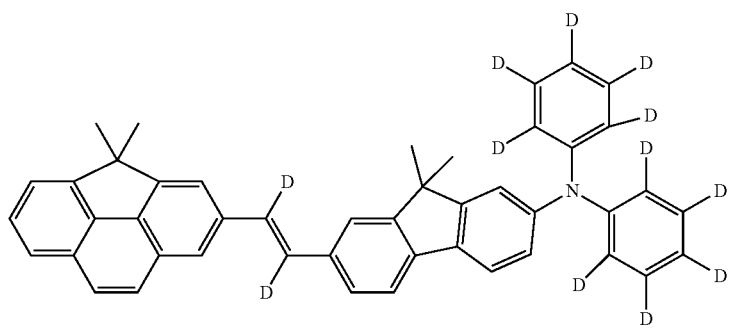
29
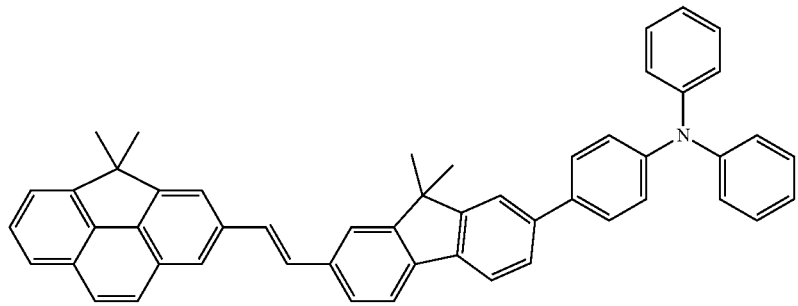
30
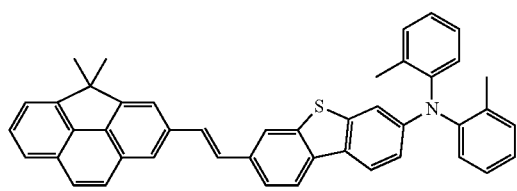
31
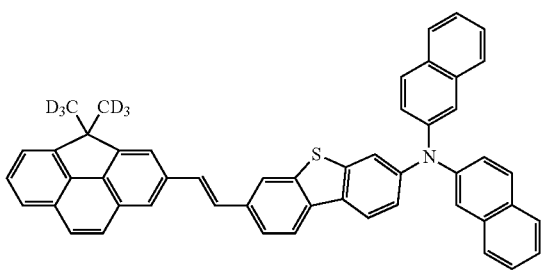
32

-continued
33
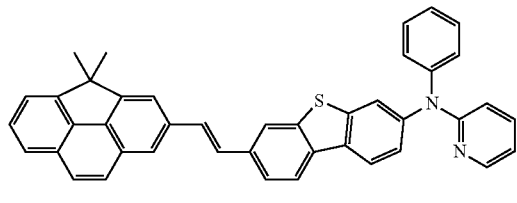
34
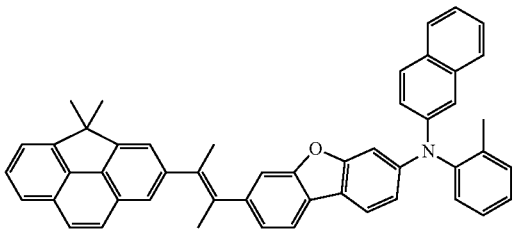
35
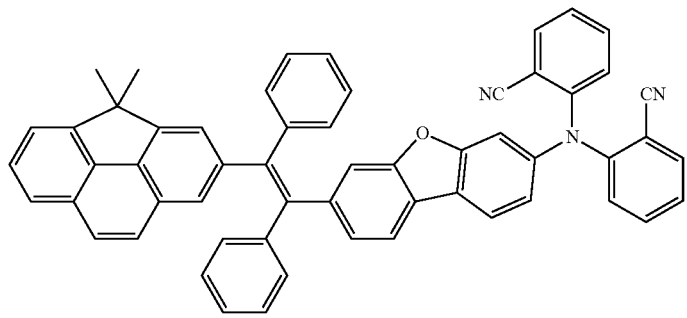
36
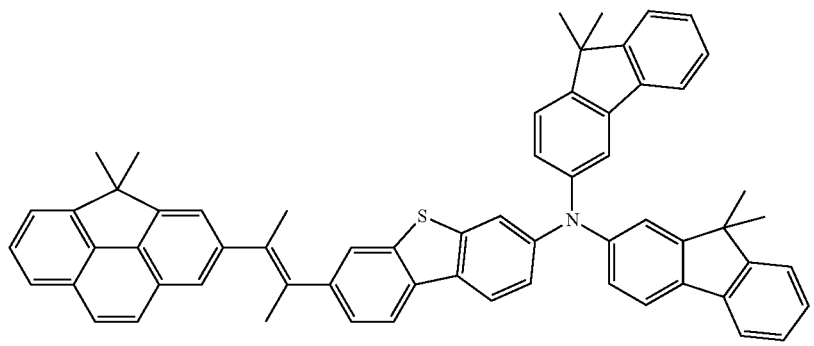
37
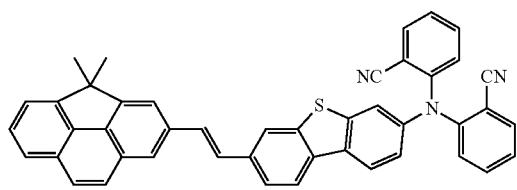
38
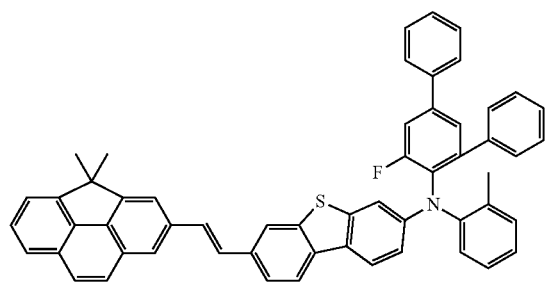
39
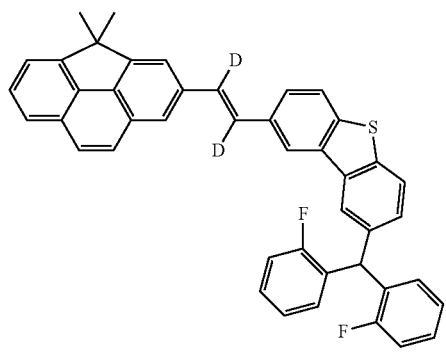
40
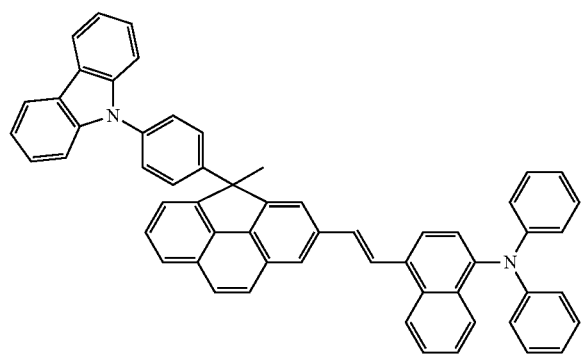

-continued
41
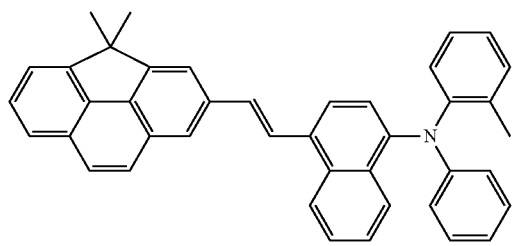
42
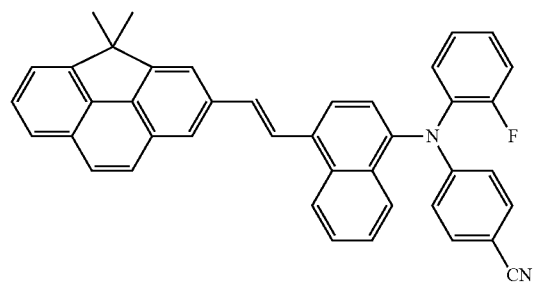
43
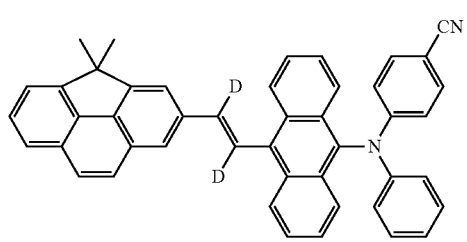
44
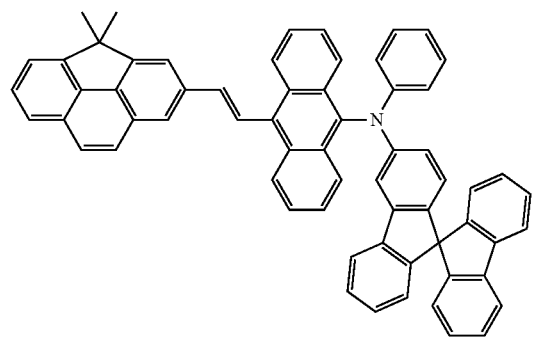
45
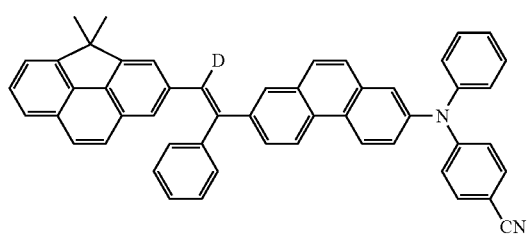
46
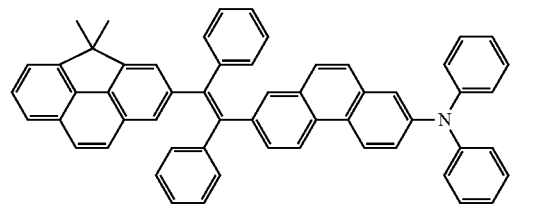
47
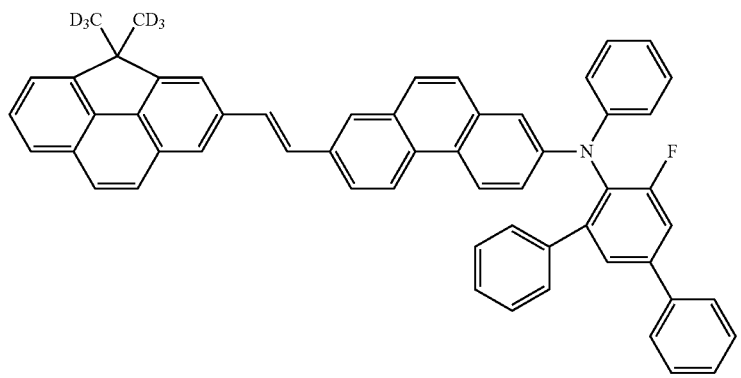
48
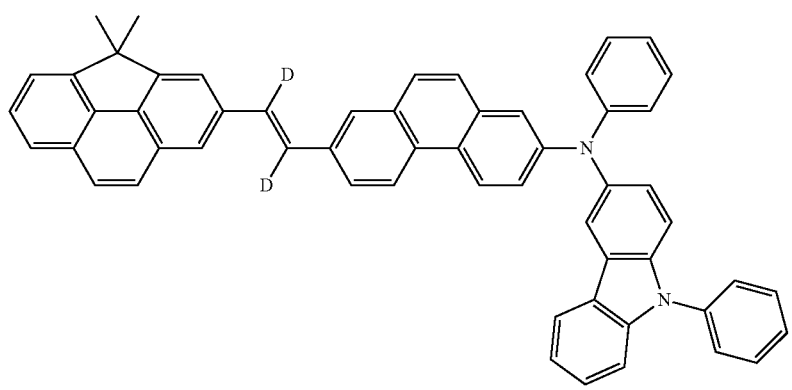

-continued
49
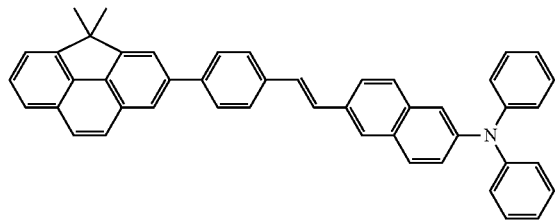
50
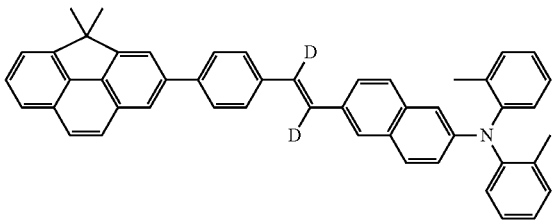
51
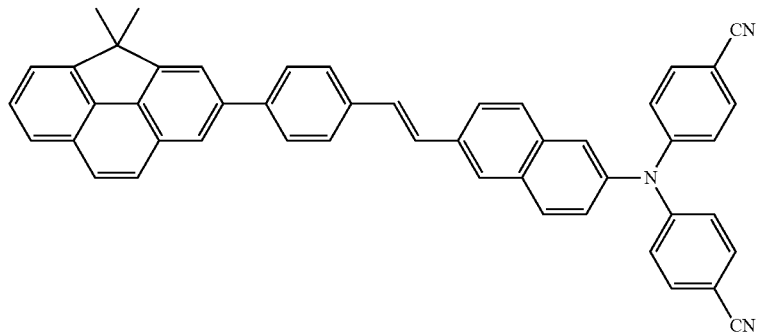
52
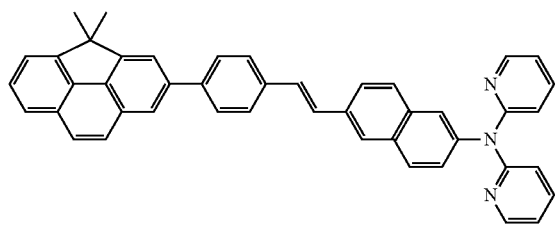
53
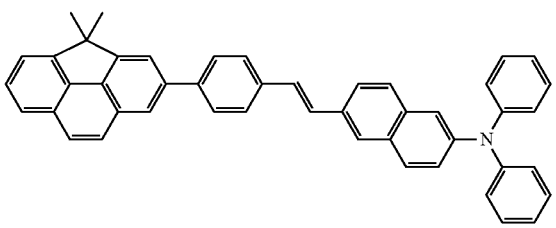
54
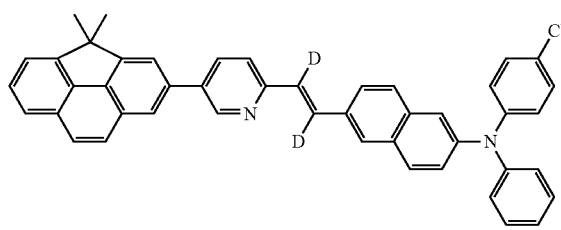
55
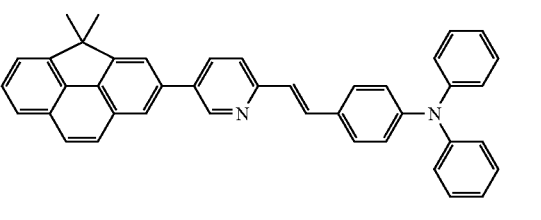
56
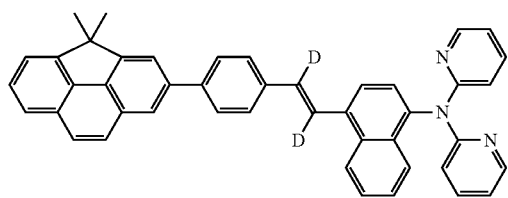
57
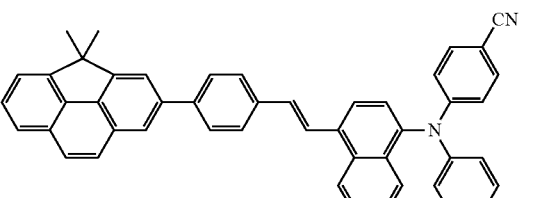
58
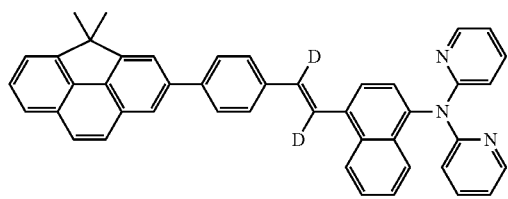
59
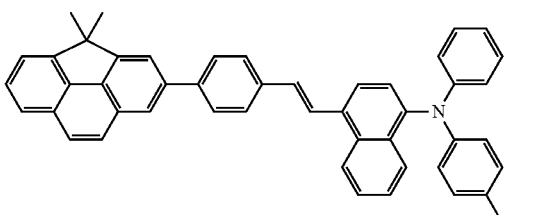

-continued
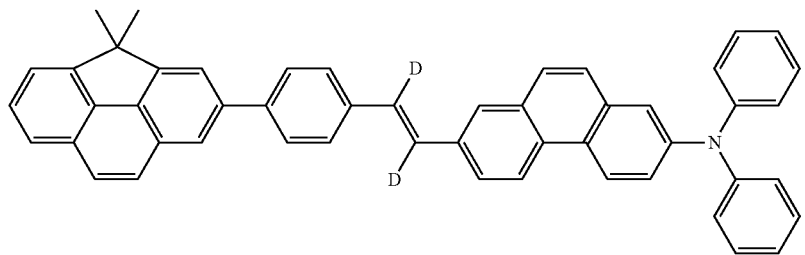
60
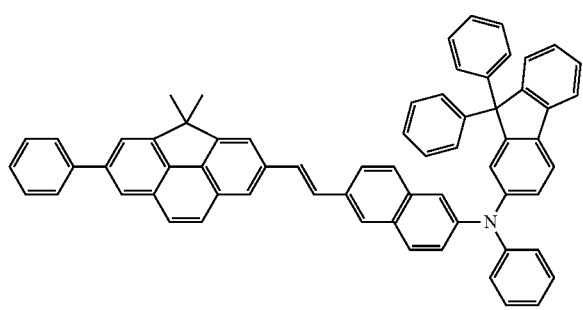
61
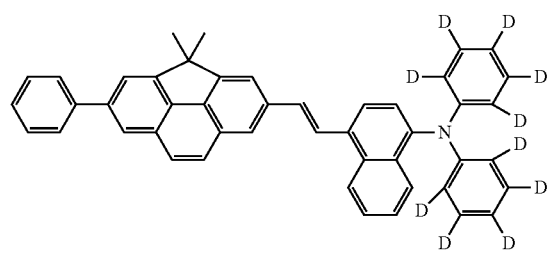
62
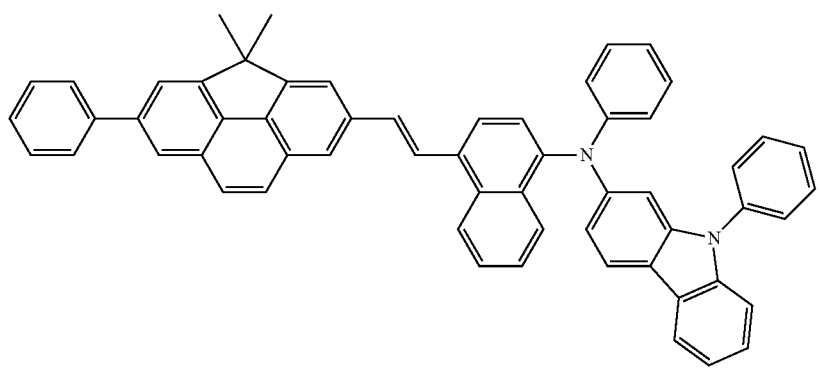
63
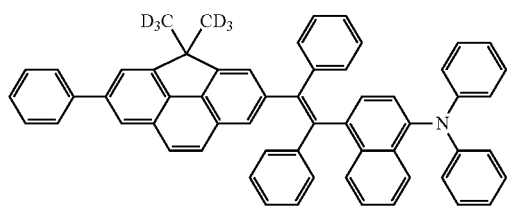
64
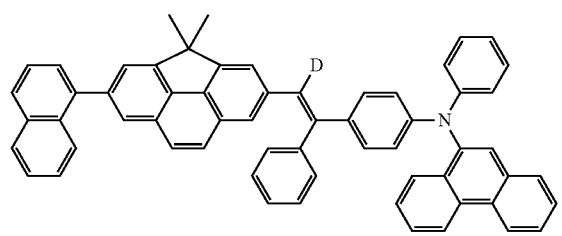
65
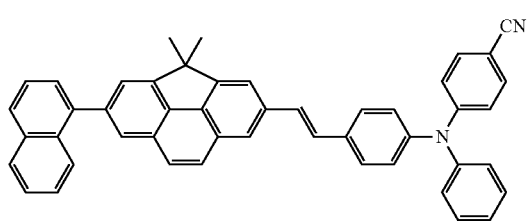
66
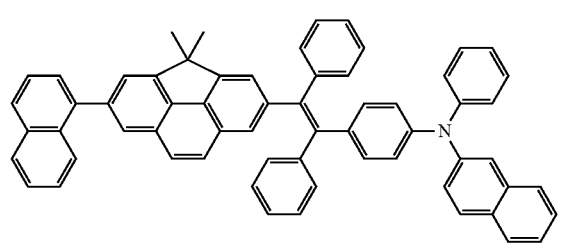
67

-continued
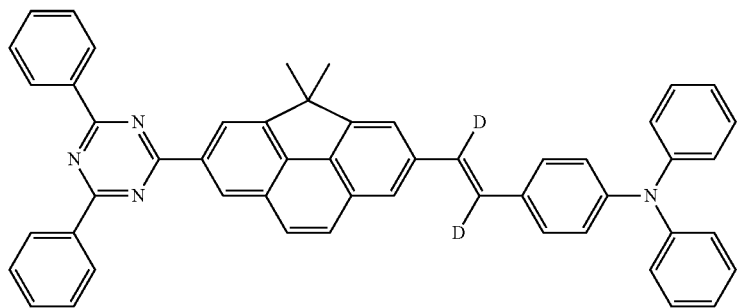
68
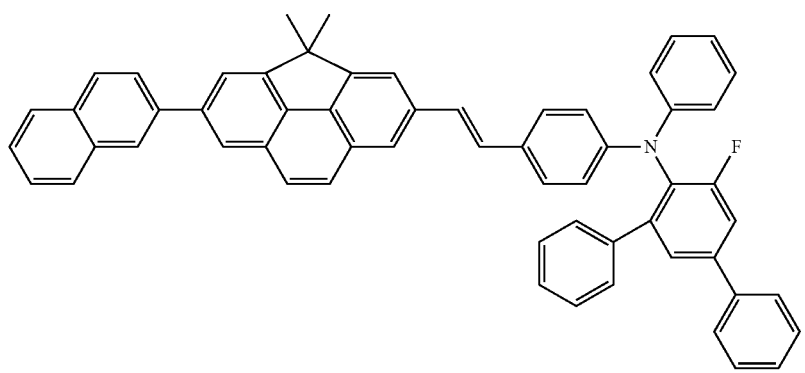
69
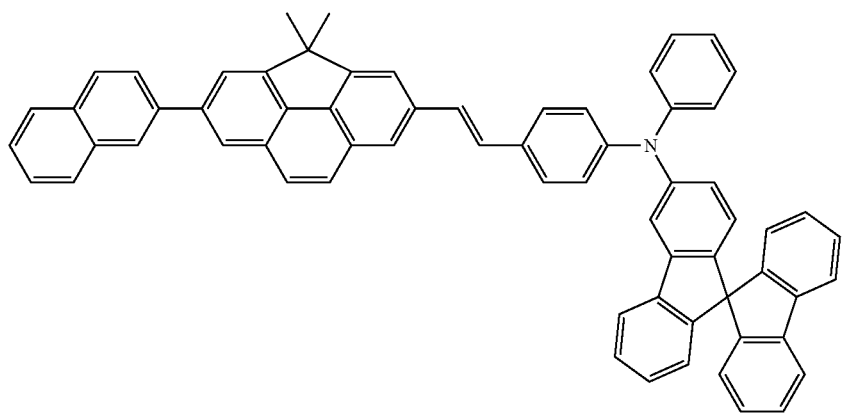
70
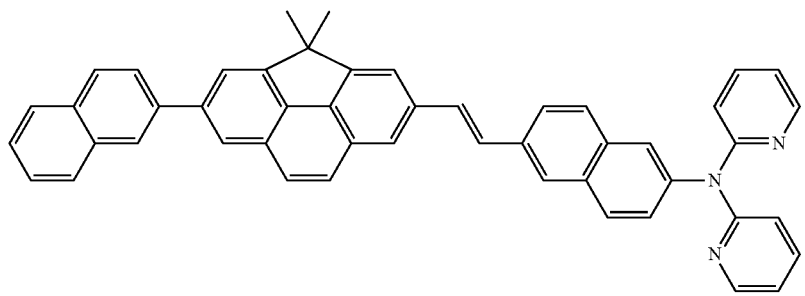
71

72
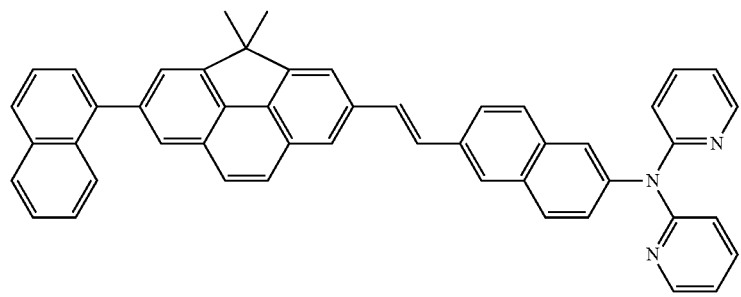
73
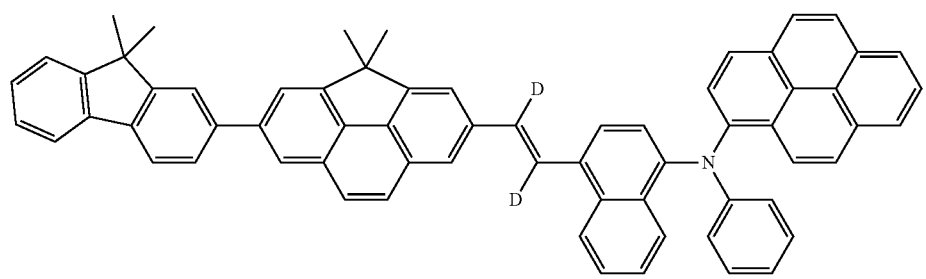
74
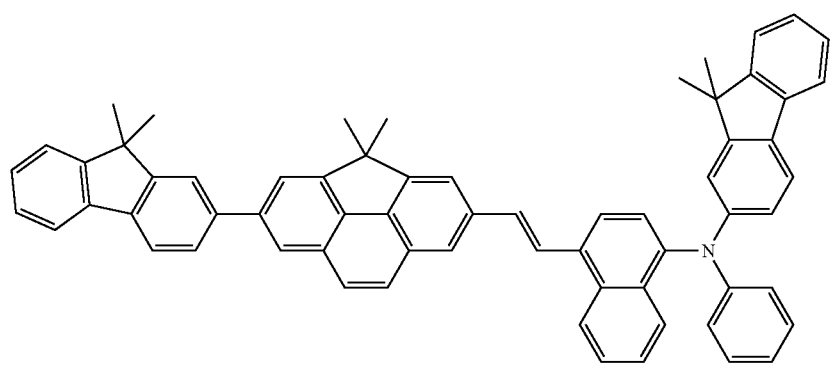
75
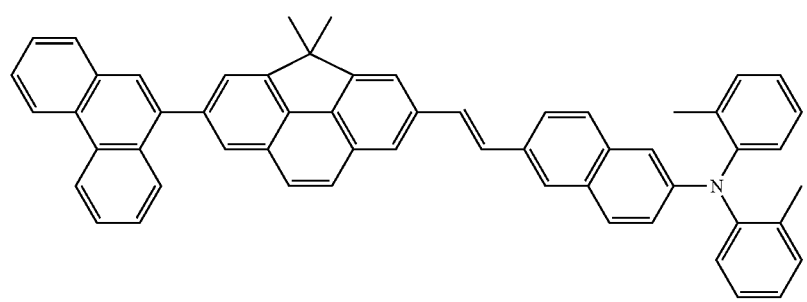
76
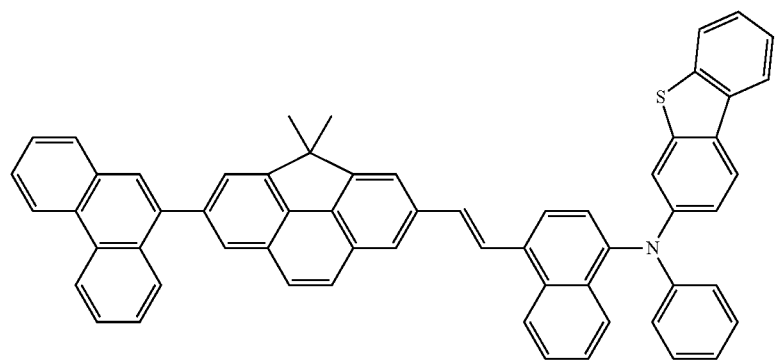

77
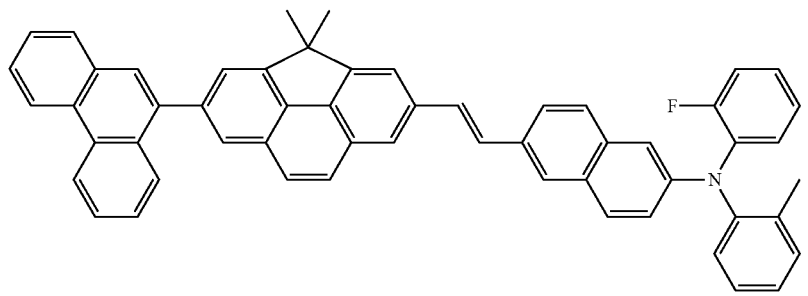
78
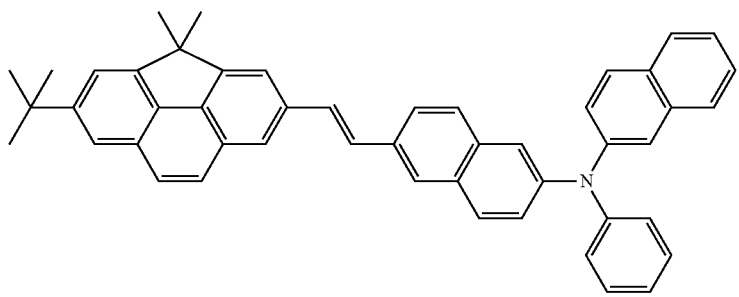
79
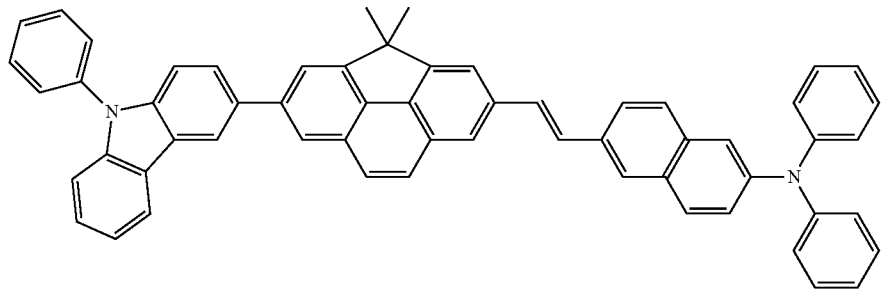
80
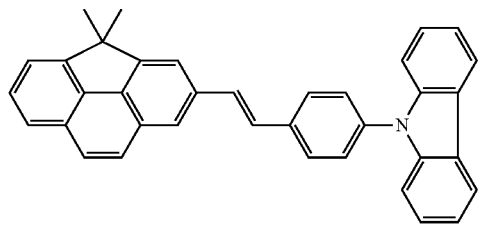
81
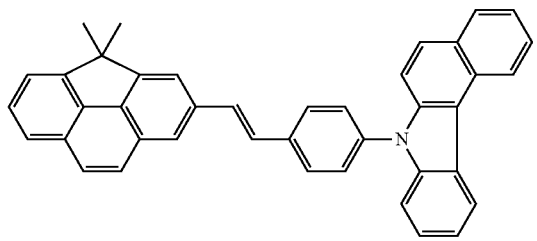
82
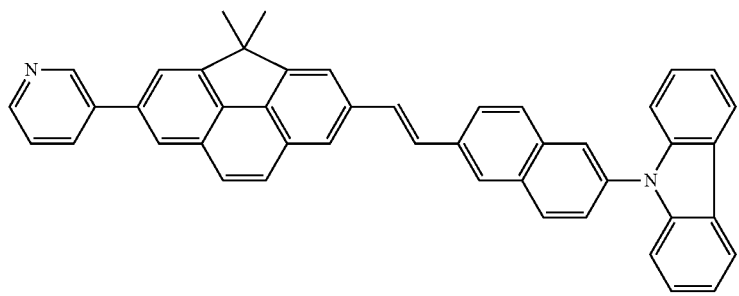

83

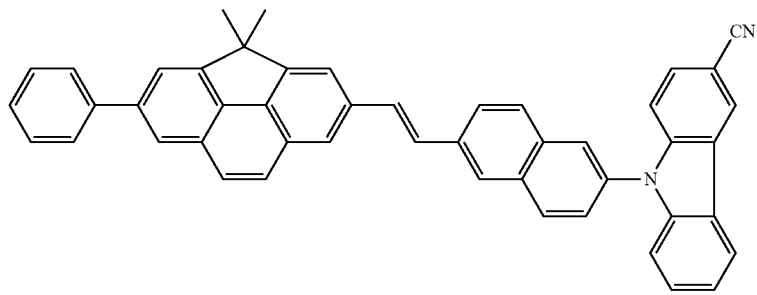

84

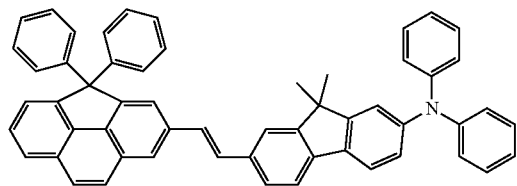

85

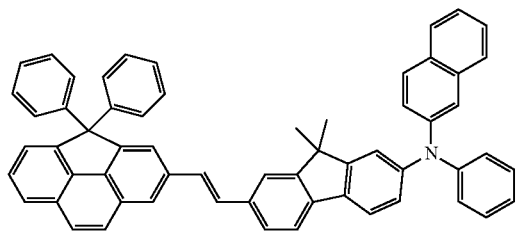

86

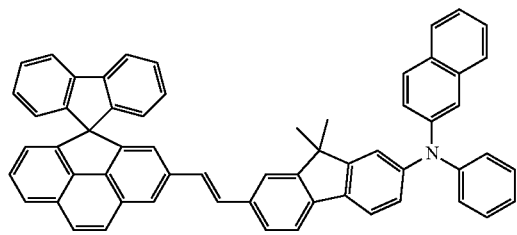

87

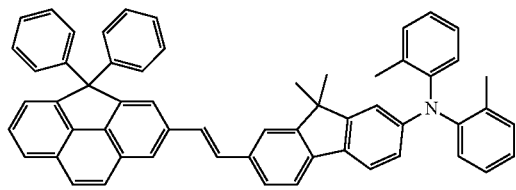

88

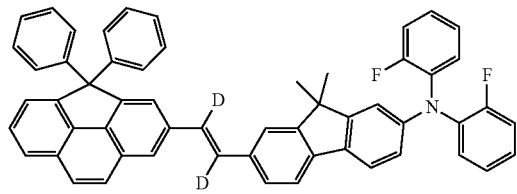

89

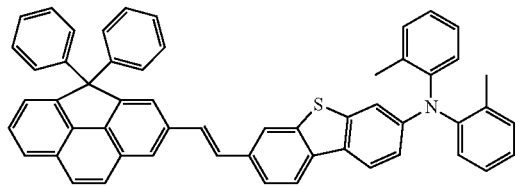

90

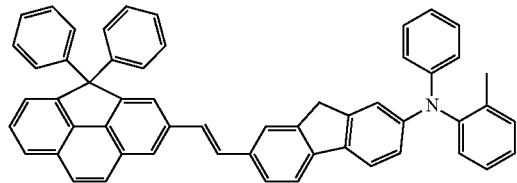

91

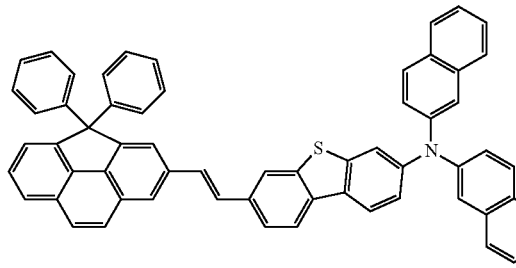

According to another aspect of the present invention, an organic light-emitting device includes a first electrode, a second electrode, and an organic layer between the first electrode and the second electrode. The organic layer includes the compound of Formula 1 described above.

The organic layer may include at least one layer selected from a hole injection layer, a hole transport layer, a functional layer having both hole injection and hole transport capabilities (hereinafter, "H-functional layer"), a buffer layer, an electron blocking layer, an emission layer, a hole blocking layer, an electron transport layer, an electron injection layer, and a functional layer having both electron injection and electron transport capabilities (hereinafter, "E-functional layer").

In some embodiments, the organic layer may be an emission layer, and the compound of Formula 1 may be used as a host or a dopant in a fluorescent or phosphorescent device.

In some embodiments, the organic light-emitting device may include an electron injection layer, an electron transport layer, an emission layer, a hole injection layer, a hole transport layer, or a functional layer having both hole injection and transport capabilities. The emission layer may include the compound of Formula 1 above, and an anthracene-based compound, an arylamine-based compound or a styryl-based compound.

In some other embodiments, the organic light-emitting device may include an electron injection layer, an electron transport layer, an emission layer, a hole injection layer, a hole transport layer, or a functional layer having both hole injection and transport capabilities. At least one of a red emission layer, a green emission layer, a blue emission layer, or a white emission layer of the emission layer may include a phosphorescent compound. At least one of the hole injection layer, the hole transport layer, or the functional layer having both hole injection and hole transport capabilities may include a charge-generating material. In some embodiments, the charge-generating material may be a p-dopant, and the p-dopant may be a quinone derivative, a metal oxide or a cyano group-containing compound.

In some embodiments, the organic layer may include an electron transport layer, and the electron transport layer may include an electron-transporting organic compound and a metal complex. The metal complex may be a lithium (Li) complex.

The term "organic layer," as used herein, refers to a single layer and/or a plurality of layers disposed between the first and second electrodes of the organic light-emitting device.

The organic layer may include an emission layer, and the emission layer may include the compound of Formula 1 described above. The organic layer may include at least one of a hole injection layer, a hole transport layer, or a functional layer having both hole injection and hole transport capabilities (hereinafter, "H-functional layer"). At least one of the hole injection layer, the hole transport layer, or the functional layer having both hole injection and hole transport capabilities may include the compound of Formula 1.

The compound of Formula 1 in the emission layer may serve as a fluorescent dopant. For example, the compound of Formula 1 may serve as a blue fluorescent dopant, emitting blue light. The compound of Formula 1 in the emission layer may serve as a fluorescent or phosphorescent host, emitting red light, green light, or blue light.

FIG. 1 is a schematic view of an organic light-emitting device according to an embodiment of the present invention. Hereinafter, a structure of an organic light-emitting device according to an embodiment of the present invention and a method of manufacturing the same will be described with reference to FIG. 1.

A substrate (not shown) may be any substrate conventionally used in organic light-emitting devices. In some embodiments the substrate may be a glass substrate or a transparent plastic substrate with high mechanical strength, thermal stability, transparency, surface smoothness, ease of handling, and water resistance.

The first electrode may be formed by depositing or sputtering a first electrode-forming material on the substrate. When the first electrode is an anode, a material having a high work function may be used as the first electrode-forming material to facilitate hole injection. The first electrode may be a reflective electrode or a transparent electrode. Suitable first electrode-forming materials include transparent and conductive materials such as ITO, IZO, $SnO_2$, and ZnO. The first electrode may be formed as a reflective electrode using magnesium (Mg), aluminum (Al), aluminum-lithium (Al—Li), calcium (Ca), magnesium-indium (MgIn), magnesium-silver (Mg—Ag), or the like.

The first electrode may have a single-layer structure or a multi-layered structure including at least two layers. For example, the first electrode may have a three-layered structure of ITO/Ag/ITO, but is not limited thereto.

An organic layer(s) is formed on the first electrode.

The organic layer may include a hole injection layer (HIL), a hole transport layer (HTL), a buffer layer (not shown), an emission layer (EML), an electron transport layer (ETL), or an electron injection layer (EIL).

The HIL may be formed on the first electrode by vacuum deposition, spin coating, casting, Langmuir-Blodgett (LB) deposition, or the like.

When the HIL is formed using vacuum deposition, the vacuum deposition conditions may vary according to the compound that is used to form the HIL, and the desired structural and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL and the desired structural and thermal properties of the HIL to be formed. For example, the coating rate may be in a range of about 2000 rpm to about 5000 rpm, and the temperature at which heat treatment is performed to remove solvent after coating may be in a range of about 80° C. to about 200° C. However, the coating conditions are not limited thereto.

The HIL may be formed of any material commonly used to form a HIL. Examples of the material that can be used to form the HIL include, but are not limited to, N,N'-di phenyl-N,N'-bis-[4-(phenyl-m-tolyl-amino)-phenyl]-biphenyl-4,4'-diamine, (DNTPD), a phthalocyanine compound such as copperphthalocyanine, 4,4',4"-tris (3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (Pani/CSA), and polyaniline/poly(4-styrenesulfonate (PANI/PSS).

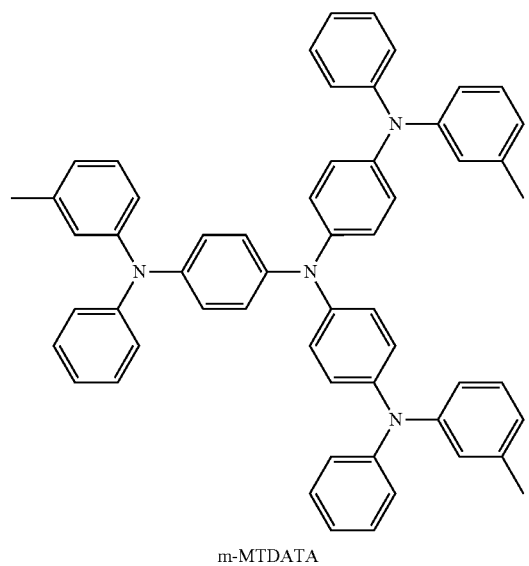

m-MTDATA

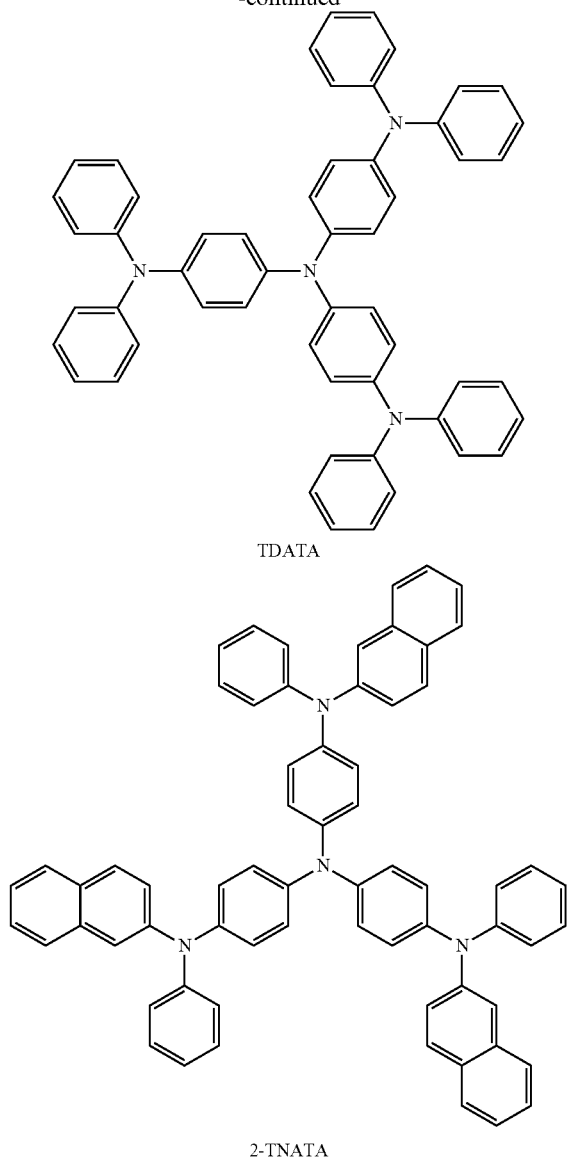

TDATA

2-TNATA

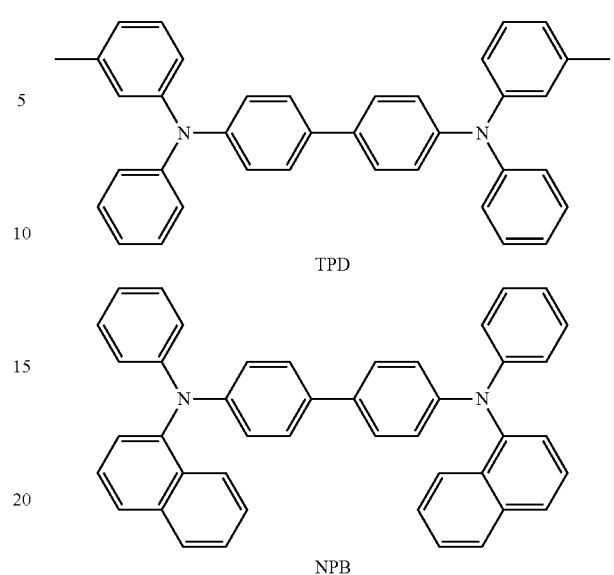

TPD

NPB

The thickness of the HTL may be from about 50 Å to about 2000 Å, and in some embodiments, may be from about 100 Å to about 1500 Å. When the thickness of the HTL is within these ranges, the HTL may have good hole transporting ability without substantially increasing driving voltage.

The H-functional layer (having both hole injection and hole transport capabilities) may contain at least one hole injection layer material and at least one hole transport layer material. The thickness of the H-functional layer may be from about 500 Å to about 10,000 Å, and in some embodiments, may be from about 100 Å to about 1,000 Å. When the thickness of the H-functional layer is within these ranges, the H-functional layer may have good hole injection and transport capabilities without substantially increasing driving voltage.

In some embodiments, at least one of the HIL, HTL, and H-functional layer may include at least one of a compound of Formula 300 below and a compound of Formula 350 below.

The thickness of the HIL may be from about 100 Å to about 10000 Å, and in some embodiments, may be from about 100 Å to about 1000 Å. When the thickness of the HIL is within these ranges, the HIL may have good hole injecting ability without substantially increasing driving voltage.

Then, a HTL may be formed on the HIL by vacuum deposition, spin coating, casting, Langmuir-Blodgett (LB) deposition, or the like. When the HTL is formed by vacuum deposition or spin coating, the conditions for deposition or coating may be similar to those for the formation of the HIL, though the conditions for the deposition or coating may vary according to the material that is used to form the HTL.

The HTL may be formed of any materials conventionally used to form an HTL. Non-limiting examples of suitable HTL forming materials include carbazole derivatives, such as N-phenylcarbazole or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine) (NPB).

Formula 300

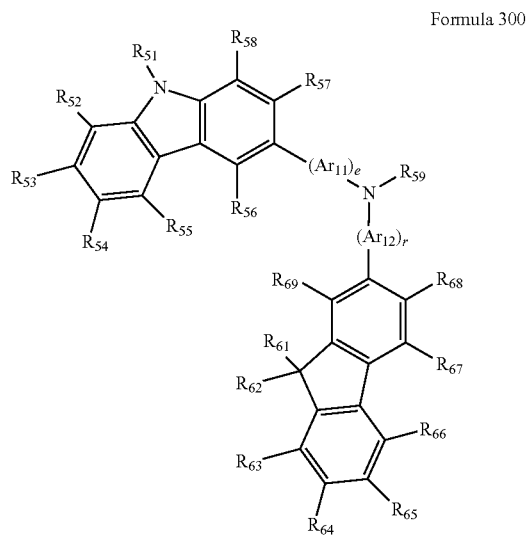

Formula 350

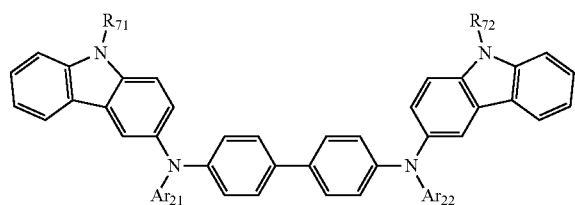

In Formulae 300 and 350, $Ar_{11}$, $Ar_{12}$, $Ar_{21}$ and $Ar_{22}$ may be each independently a substituted or unsubstituted $C_6$-$C_{60}$ arylene group.

In Formula 300, e and f may be each independently an integer from 0 to 5, for example, may be 0, 1, or 2. In a non-limiting embodiment, e may be 1, and f may be 0.

In Formulae 300 and 350, $R_{51}$ to $R_{58}$, $R_{61}$ to $R_{69}$, and $R_{71}$ to $R_{72}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, and a substituted or unsubstituted $C_6$-$C_{60}$ arylthio group. In some non-limiting embodiments, $R_{51}$ to $R_{58}$, $R_{61}$ to $R_{69}$, $R_{71}$, and $R_{72}$ may be each independently one of a hydrogen atom; a deuterium atom; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group or a $C_1$-$C_{10}$ alkoxy group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, or a phosphoric acid group or a salt thereof; a phenyl group; a naphthyl group; an anthryl group; a fluorenyl group; a pyrenyl group; or a phenyl group, a naphthyl group, an anthryl group, a fluorenyl group, or a pyrenyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, or a $C_1$-$C_{10}$ alkoxy group.

In Formula 300, $R_{59}$ may be independently a phenyl group, a naphthyl group, an anthryl group, a biphenyl group, or a pyridyl group; or a phenyl group, a naphthyl group, an anthryl group, a biphenyl group, or a pyridyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a substituted or unsubstituted $C_1$-$C_{20}$ alkyl group, or a substituted or unsubstituted $C_1$-$C_{20}$ alkoxy group.

In an embodiment, the compound of Formula 300 may be a compound represented by Formula 300A below.

Formula 300A

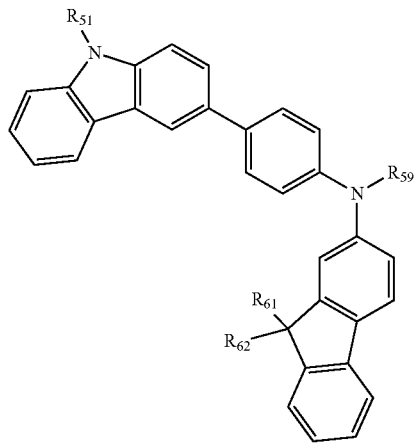

$R_{51}$, $R_{61}$, $R_{62}$ and $R_{59}$ in Formula 300A are as defined above, and thus a detailed description thereof will not be provided here.

In some non-limiting embodiments, at least one of the HIL, HTL, and H-functional layer may include at least one of the compounds represented by Formulae 301 to 320 below.

301

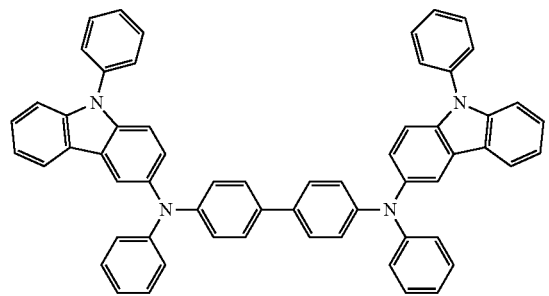

302

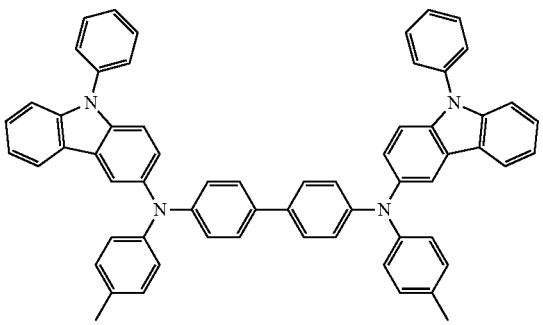

-continued
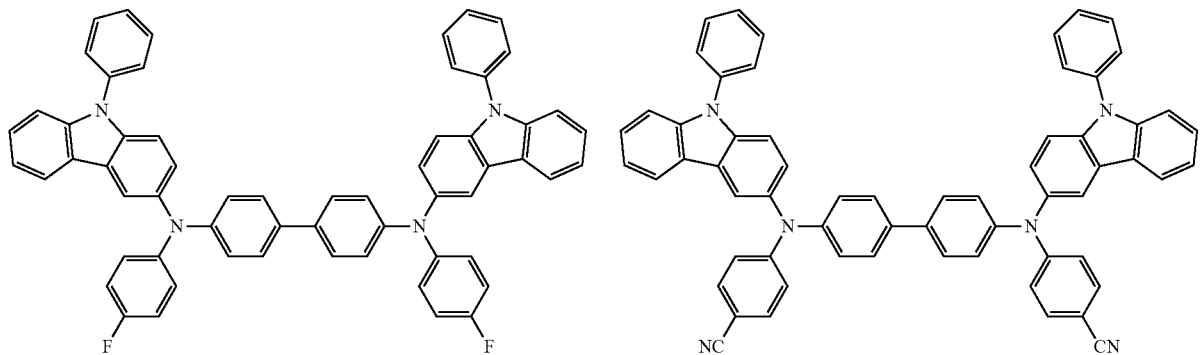
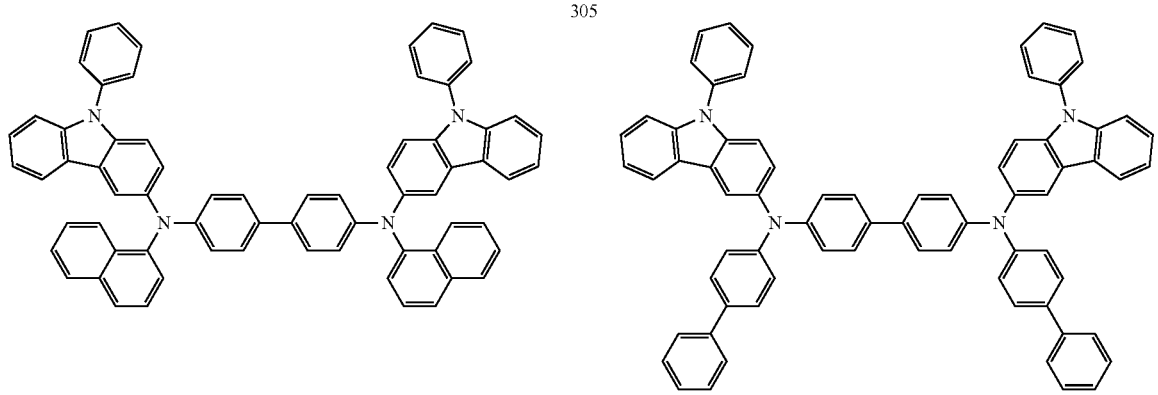
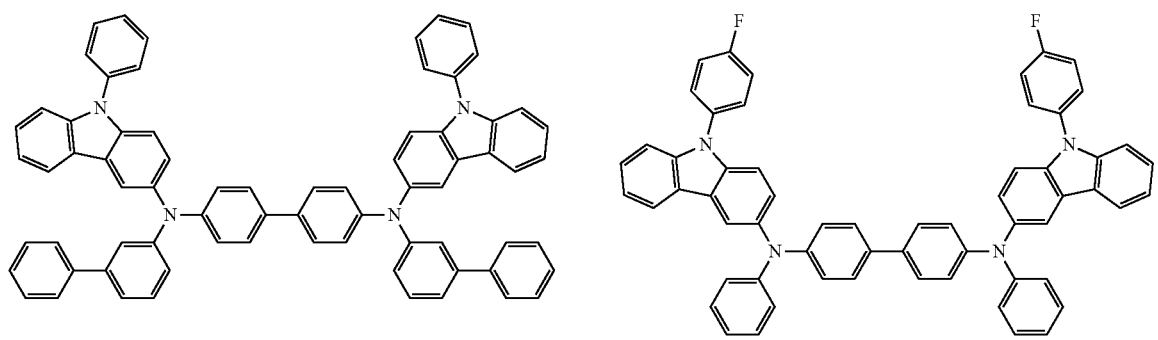
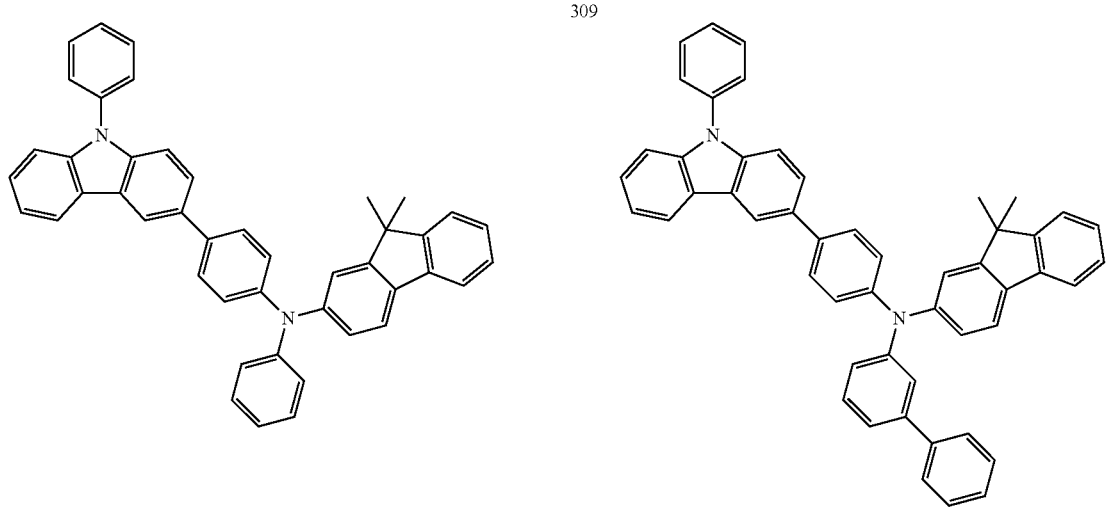

311
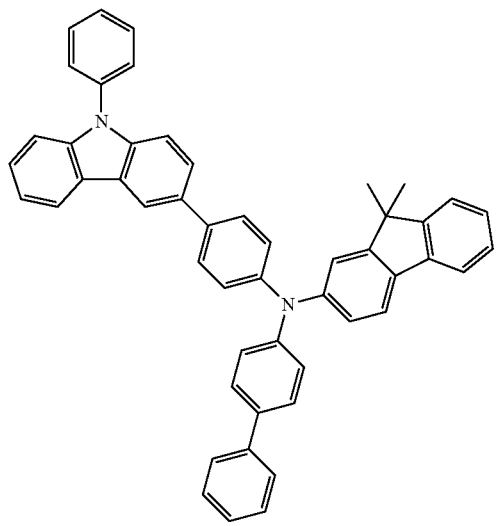
312
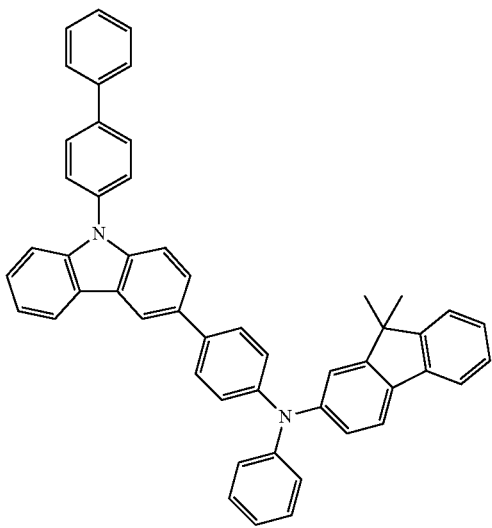
313
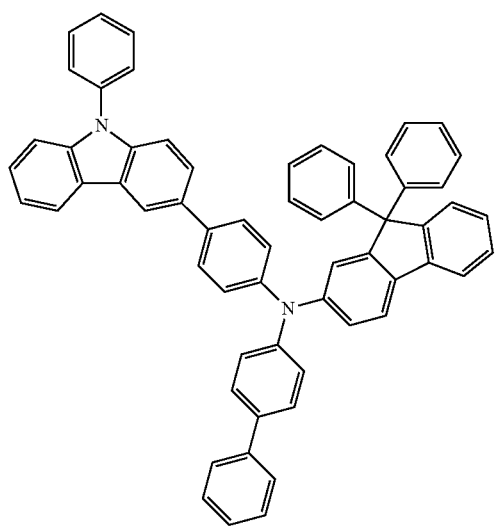
314
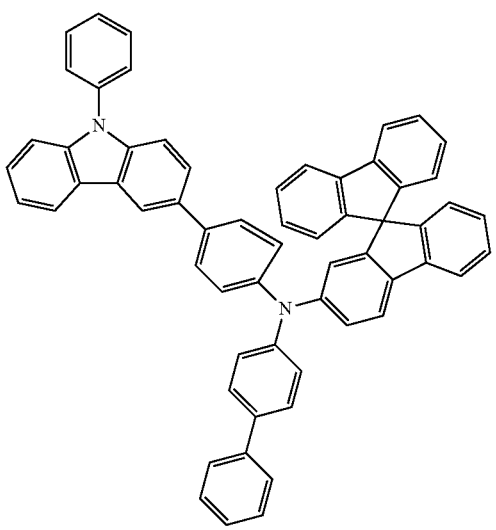
315
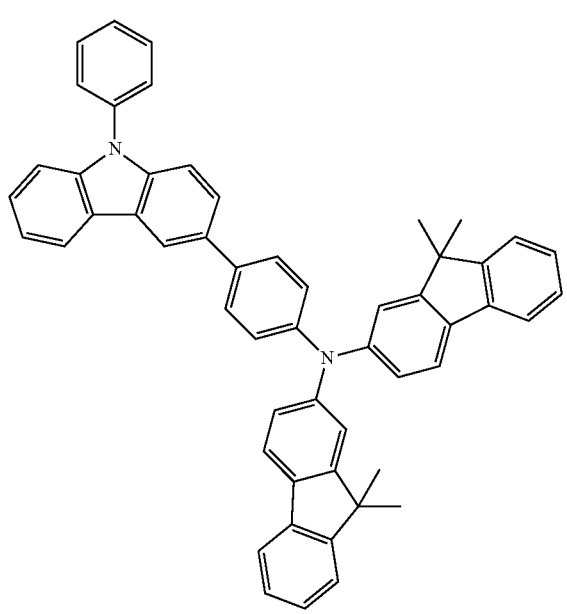
316
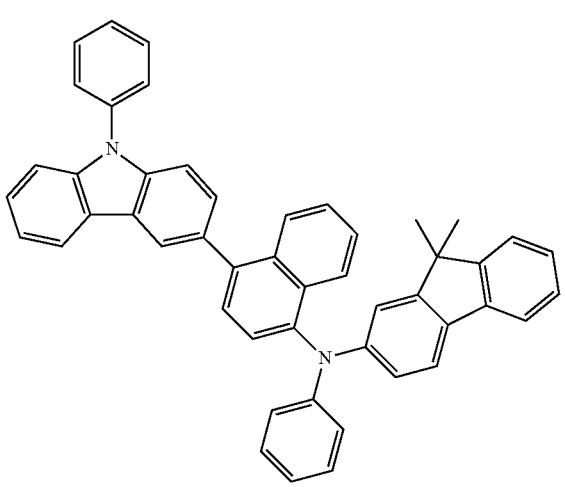

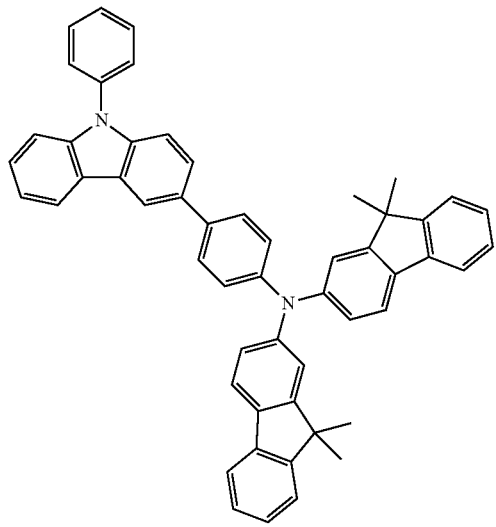

317

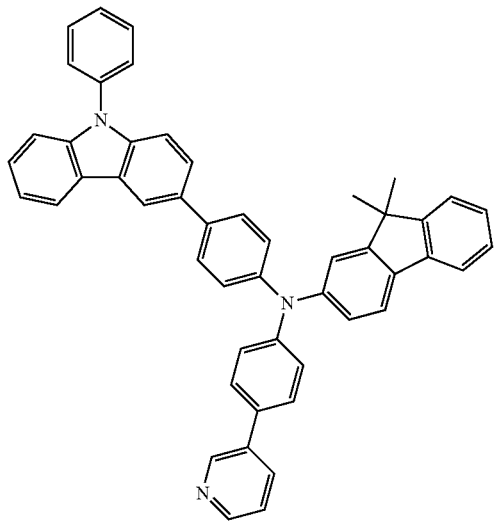

318

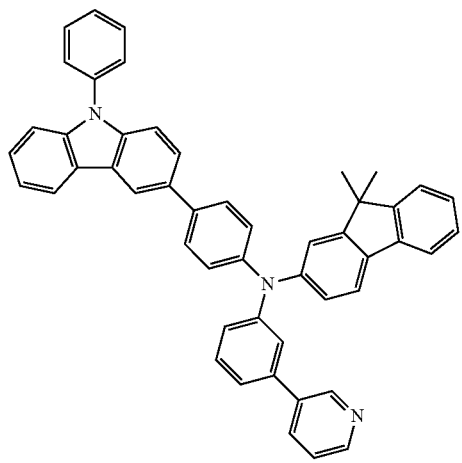

319

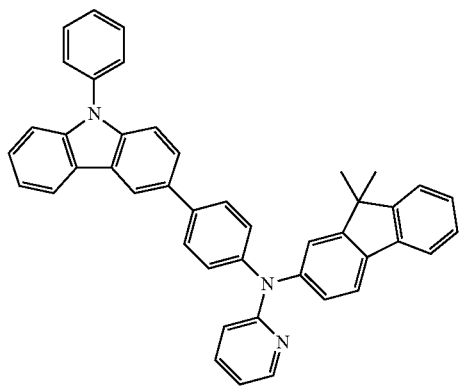

320

At least one of the HIL, HTL, and H-functional layer may further include a charge-generating material for improved layer conductivity, in addition to a hole injection material, a hole transport material, and/or a material having both hole injection and hole transport capabilities, as described above.

The charge-generating material may be, for example, a p-dopant. The p-dopant may be selected from quinone derivatives, metal oxides, and compounds with a cyano group, but are not limited thereto. Non-limiting examples of the p-dopant include quinone derivatives such as tetracyano-quinonedimethane (TCNQ), 2,3,5,6-tetrafluoro-tetracyano-1,4-benzoquinonedimethane (F4-CTNQ), and the like; metal oxides such as tungsten oxide, molybdenum oxide, and the like; and cyano-containing compounds such as Compound 200 below.

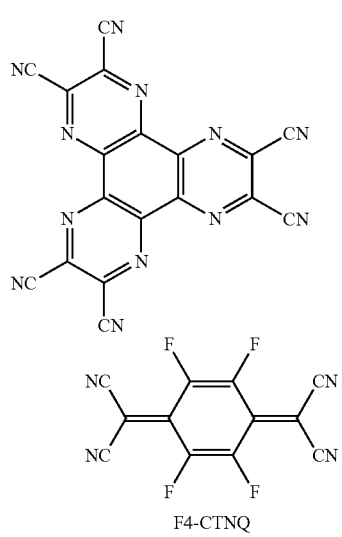

Compound 20

F4-CTNQ

When the hole injection layer, hole transport layer, or H-functional layer further includes a charge-generating material, the charge-generating material may be homogeneously dispersed or inhomogeneously distributed in the layer.

A buffer layer may be disposed between at least one of the HIL, HTL, and H-functional layer, and the EML. The buffer layer may compensate for an optical resonance distance of light according to a wavelength of the light emitted from the EML, and thus may increase efficiency. The butter layer may include any known hole injecting material or hole transporting material. In some other embodiments, the buffer layer may include the same material as one of the materials included in the HIL, HTL, and H-functional layer that underlie the buffer layer.

Then, an EML may be formed on the HTL, H-functional layer, or buffer layer by vacuum deposition, spin coating, casting, Langmuir-Blodget (LB) deposition, or the like. When the EML is formed using vacuum deposition or spin coating, the deposition or coating conditions may be similar to those for the formation of the HIL, though the conditions for deposition or coating may vary according to the material that is used to form the EML.

The EML may include the compound of Formula 1.

The EML may further include a host, in addition to the compound of Formula 1 above.

Examples of the host include $Alq_3$, 4,4'-N,N'-dicarbazole-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di-2-naphthylanthracene (TBADN), E3, distyrylarylene (DSA), dmCBP (see the formula below), and Compounds 501 to 509 below, but are not limited thereto.

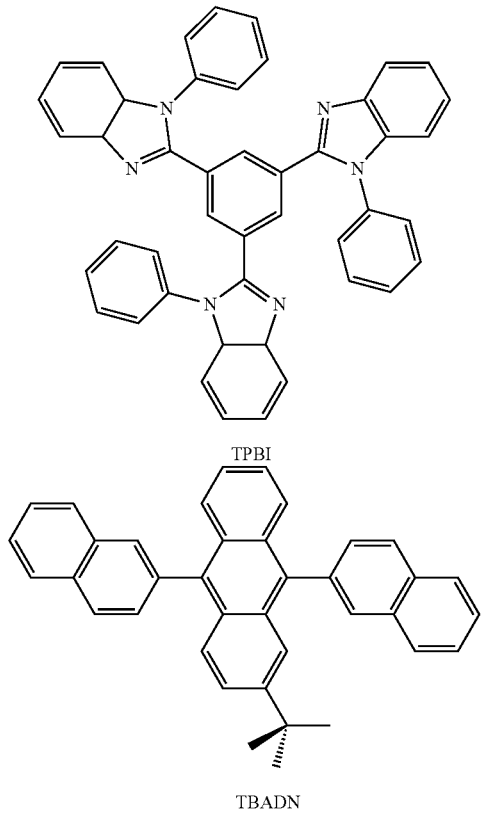

TPBI

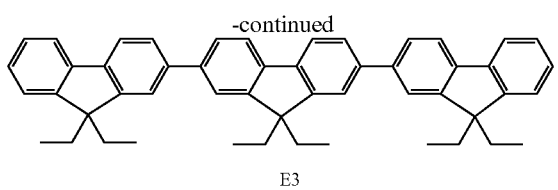

E3

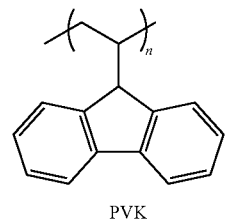

PVK

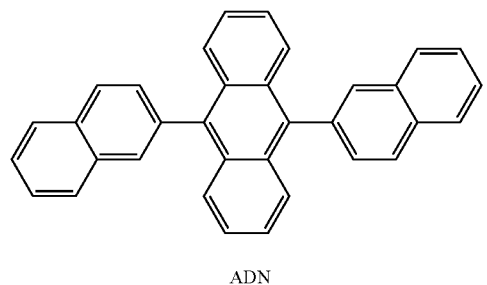

ADN

TBADN

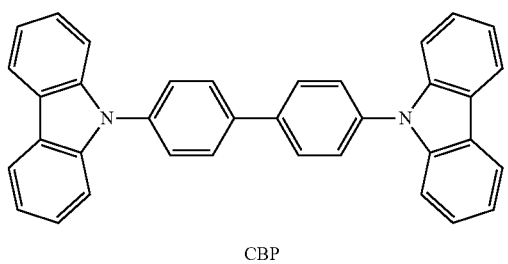

CBP

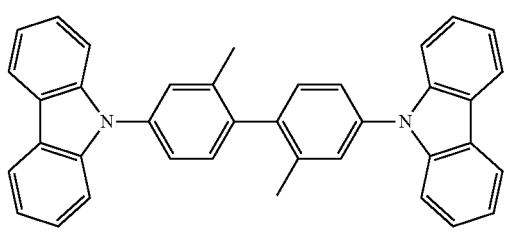

dmCBP

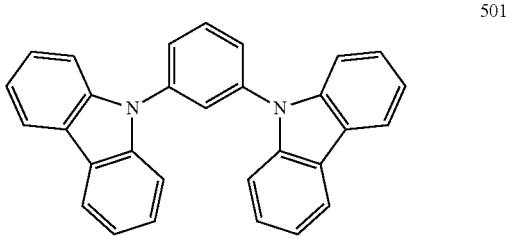

501

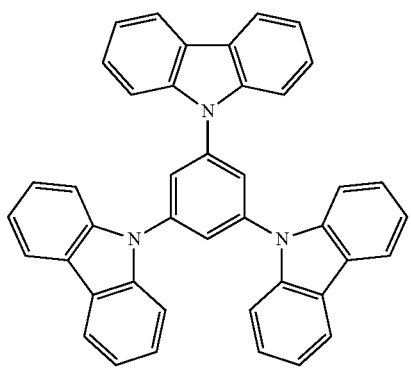
502
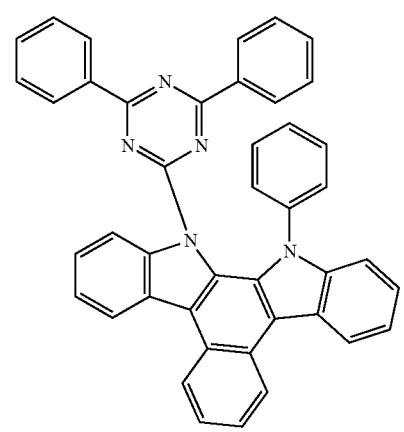
503
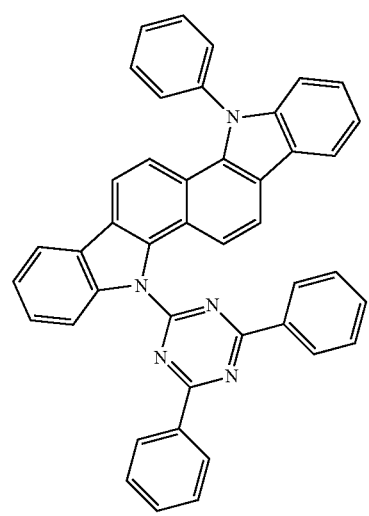
504
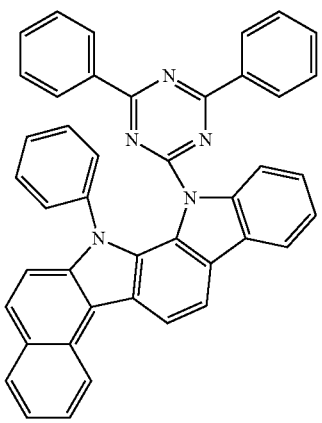
505
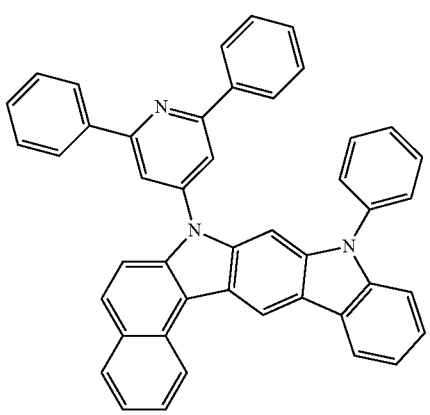
506
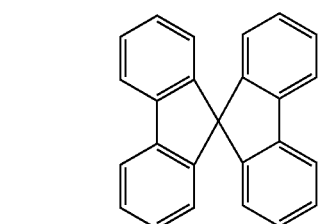
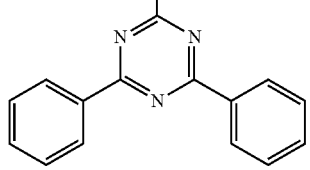
507
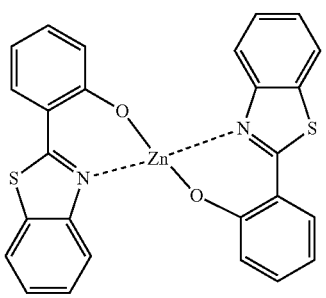
508

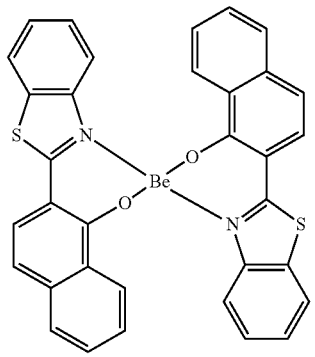

509

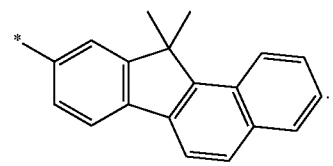 [SMILES: *c1ccc2c(c1)C(C)(C)c1c-2ccc2ccccc12]

For example, the anthracene compound of Formula 400 above may be one of the compounds represented by the following formulae, but is not limited thereto.

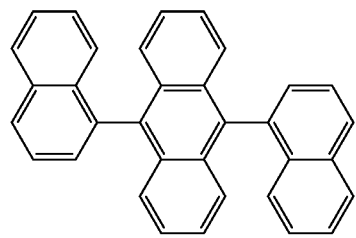

In some embodiments, an anthracene-based compound represented by Formula 400 below may be used as the host.

Formula 400

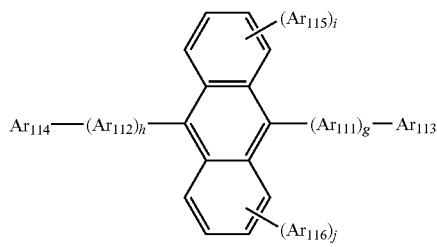

In Formula 400, $Ar_{111}$ and $Ar_{112}$ are each independently a substituted or unsubstituted $C_6$-$C_{60}$ arylene group. $Ar_{113}$ to $Ar_{116}$ are each independently a substituted or unsubstituted $C_1$-$C_{10}$ alkyl group or a substituted or unsubstituted $C_6$-$C_{60}$ aryl group. Also, g, h, I, and j are each independently an integer from 0 to 4.

In some non-limiting embodiments, $Ar_{111}$ and $Ar_{112}$ in Formula 400 may be each independently a phenylene group, a naphthylene group, a phenanthrenylene group, or a pyrenylene group; or a phenylene group, a naphthylene group, a phenanthrenylene group, a fluorenyl group, or a pyrenylene group substituted with at least one of a phenyl group, a naphthyl group, or an anthryl group.

In Formula 400 above, g, h, l, and j may be each independently 0, 1, or 2.

In some non-limiting embodiments, $Ar_{113}$ to $Ar_{116}$ in Formula 400 may be each independently one of a $C_1$-$C_{10}$ alkyl group substituted with at least one of a phenyl group, a naphthyl group, or an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, or a fluorenyl group substituted with at least one of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl croup, a phenanthrenyl group, or a fluorenyl group; or

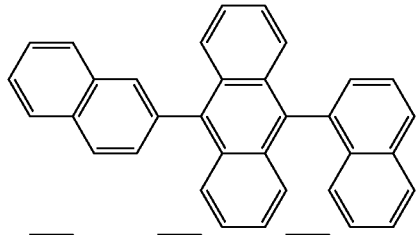

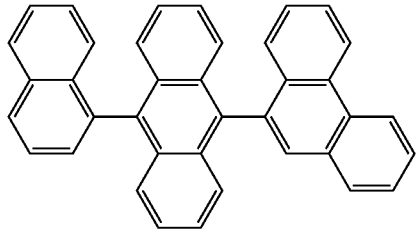

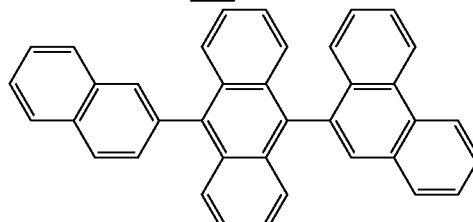

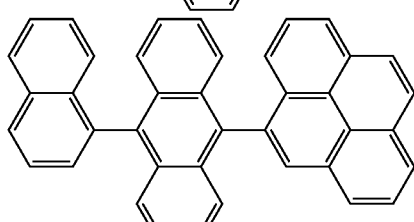

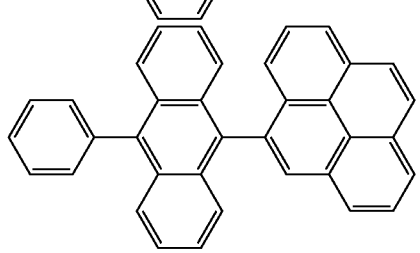

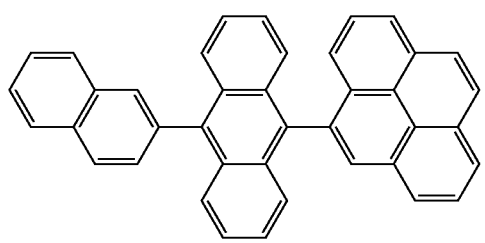
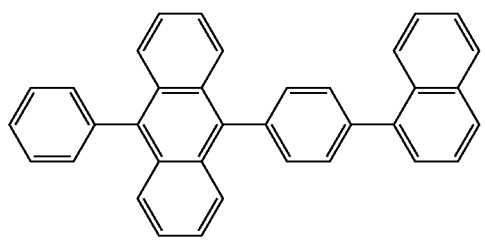
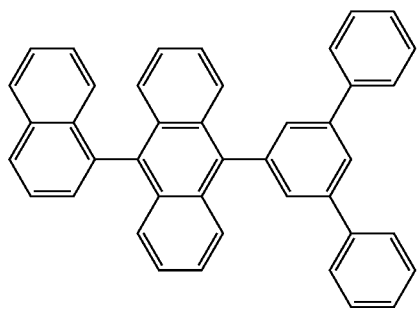
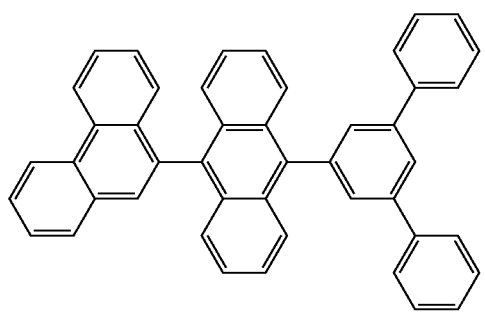
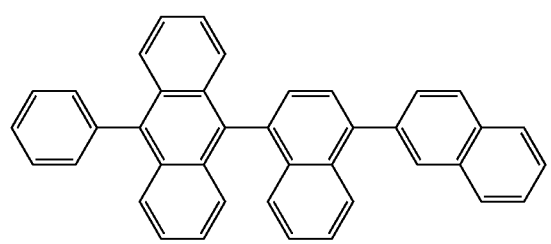
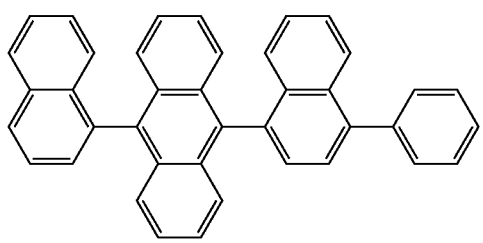
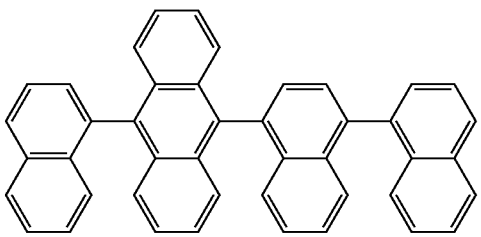
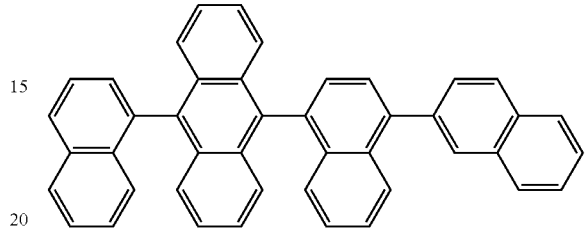
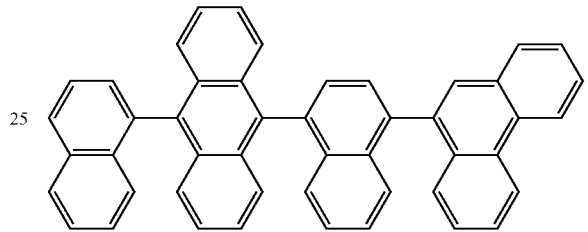
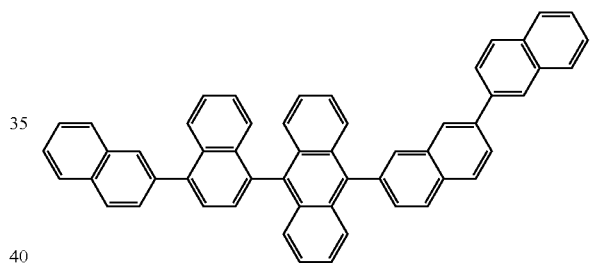
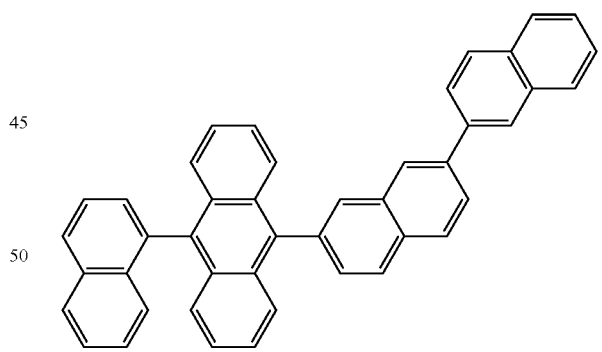
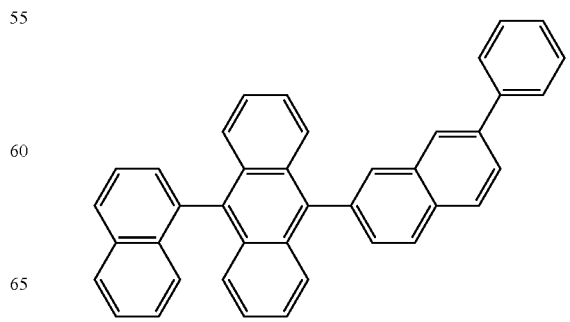

51
-continued
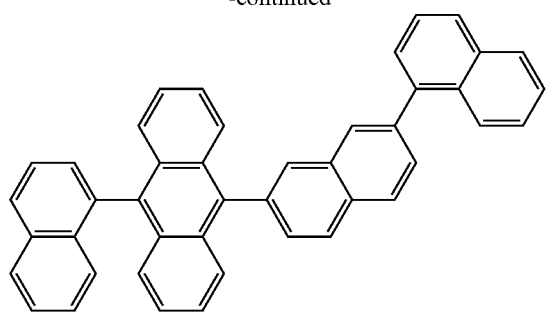
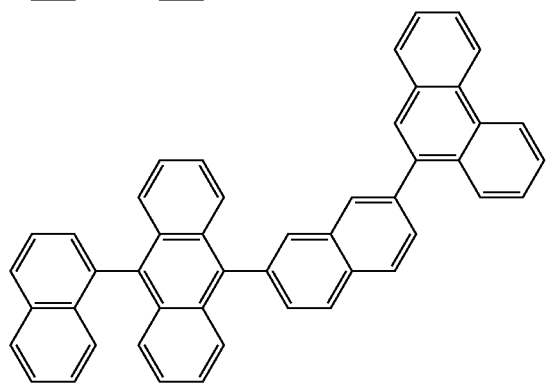
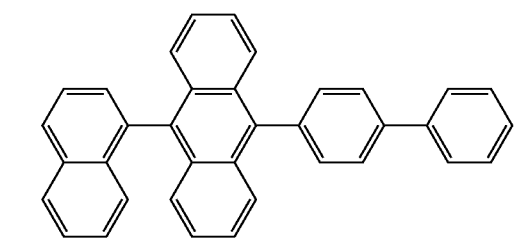
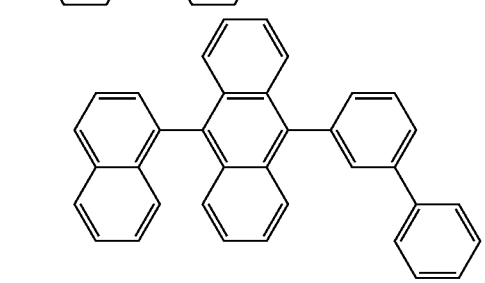
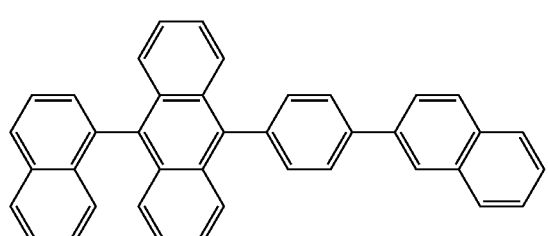
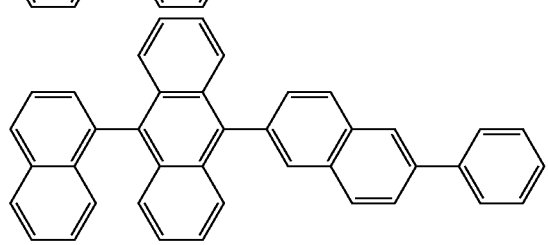
52
-continued
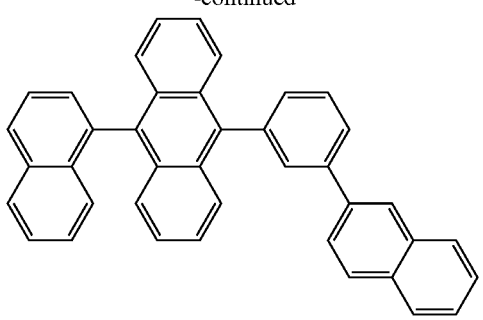
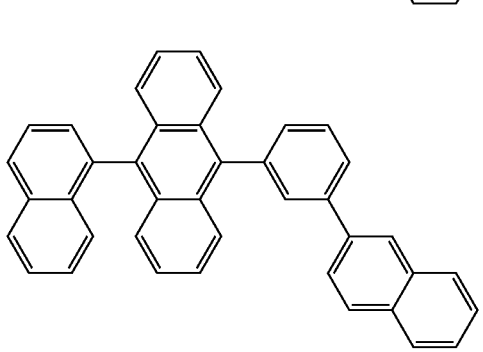
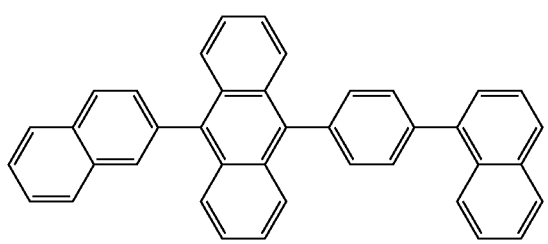
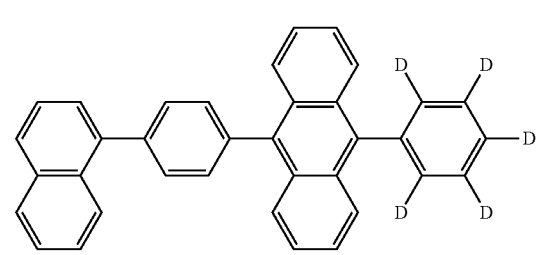
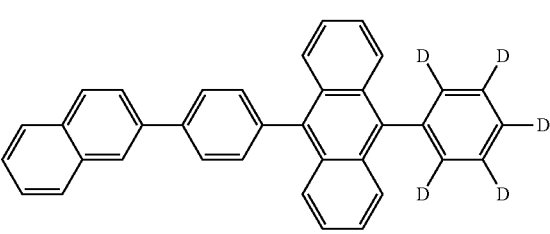
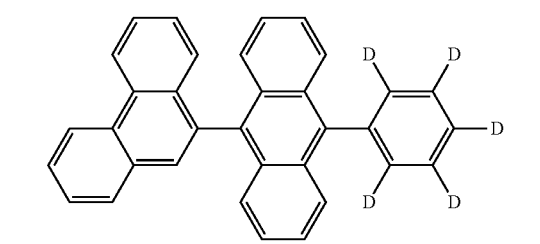

53
-continued
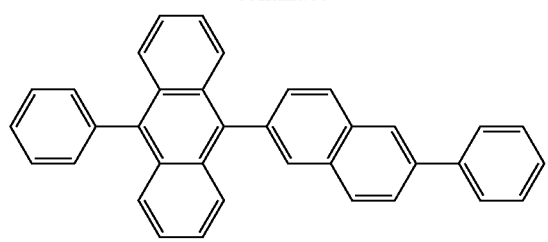
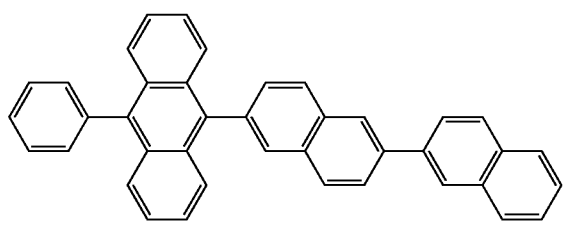
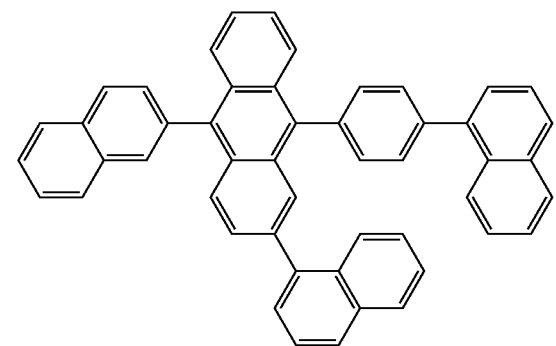
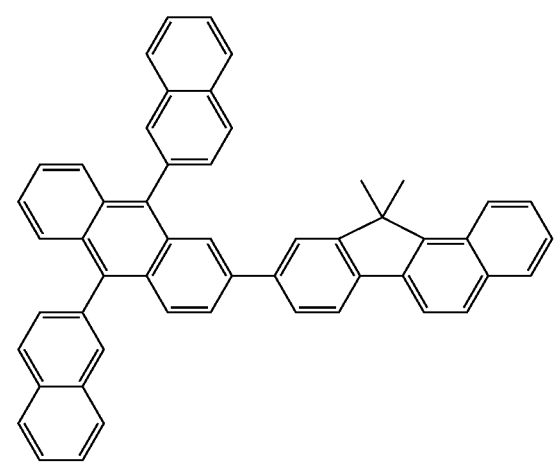
54
-continued
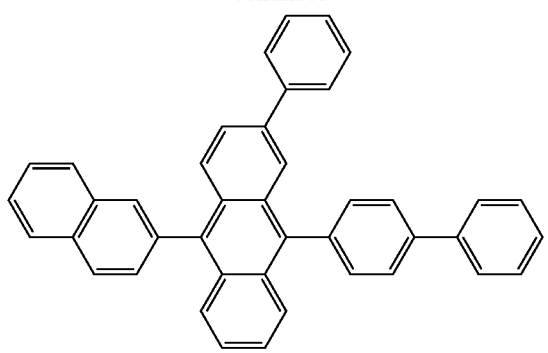
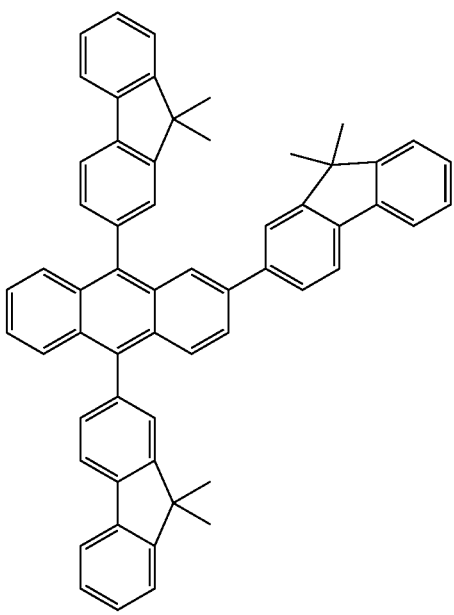
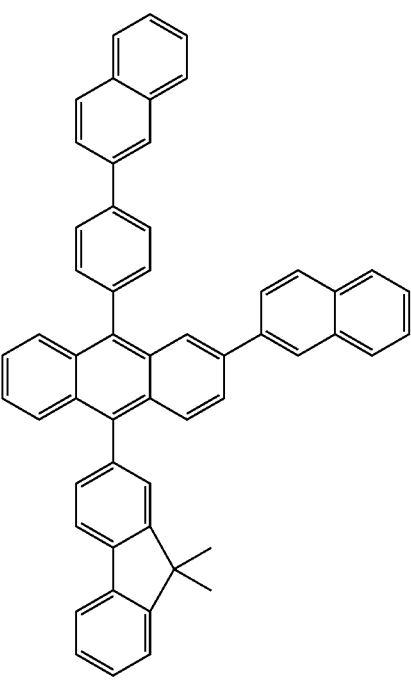

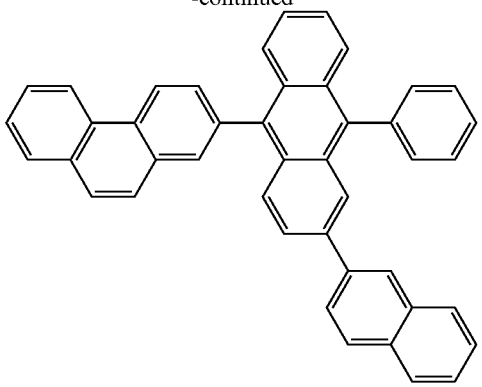

In some embodiments, an anthracene-based compound represented by Formula 401 below may be used as the host.

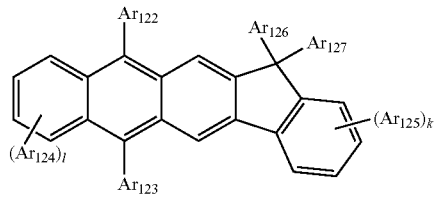

Formula 401

$Ar_{122}$ to $Ar_{125}$ in Formula 401 are similar to $Ar_{113}$ of Formula 400, and thus detailed descriptions thereof will not be provided here.

$Ar_{126}$ and $Ar_{127}$ in Formula 401 above may be each independently a $C_1$-$C_{10}$ alkyl group, for example, a methyl group, an ethyl group, or a propyl group.

In Formula 401, k and l may be each independently an integer from 0 to 4, for example, 0, 1, or 2.

For example, the anthracene compound of Formula 401 above may be one of the compounds represented by the following formulae, but is not limited thereto.

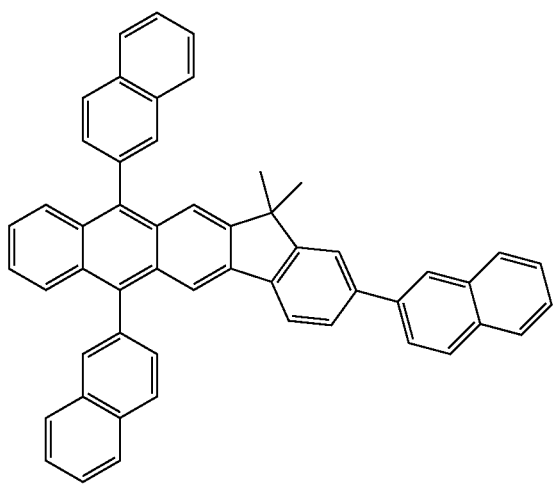

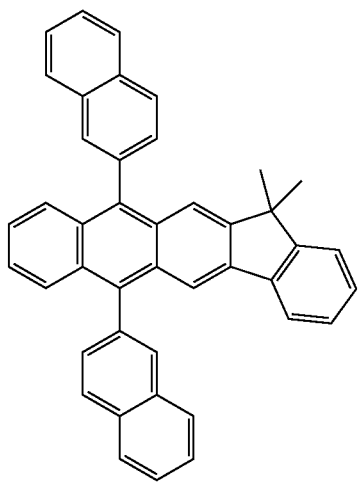

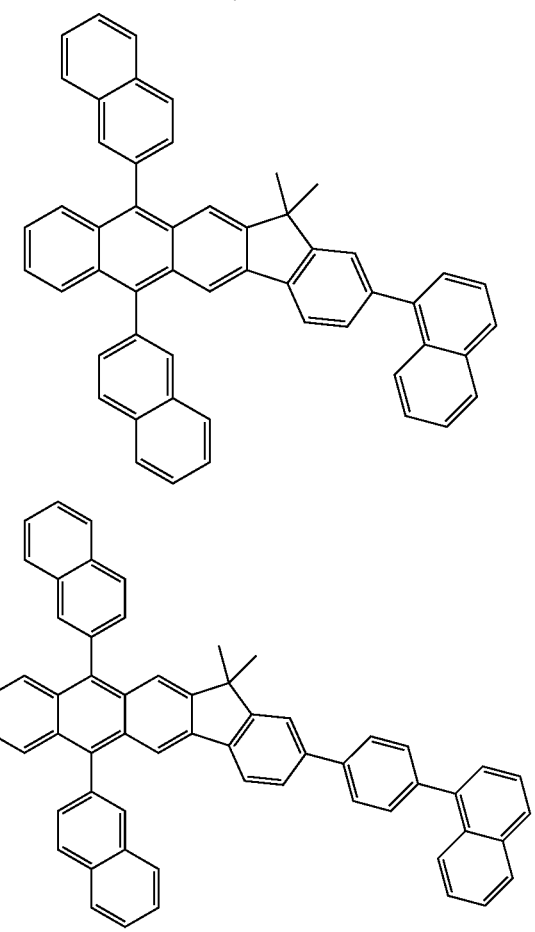

When the organic light-emitting device is a full color organic light-emitting device, the emission layer may be patterned into a red emission layer, a green emission layer, and a blue emission layer. The EML may further include the compound of Formula 1 as a blue fluorescent host.

At least one of the red EML, the green EML, and the blue EML may include a dopant, as discussed below (ppy=phenylpyridine).

Non-limiting examples of the blue dopant include compounds represented by the following formulae.

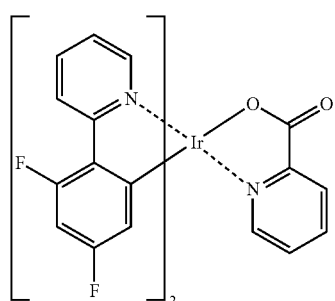
F₂Irpic
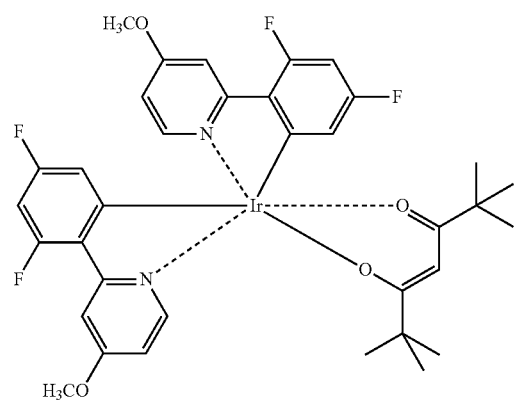
(F₂ppy)₂Ir(tmd)
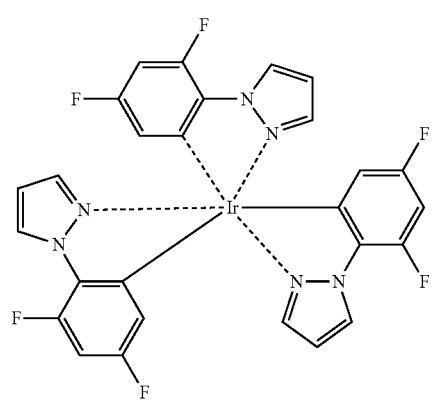
Ir(dfppz)₃
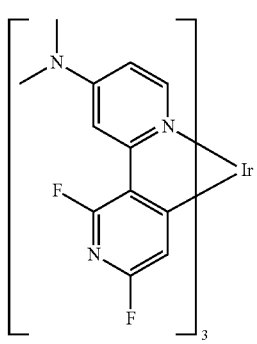
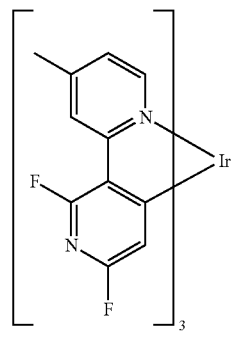
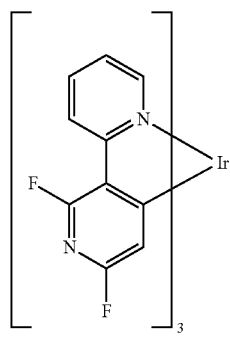
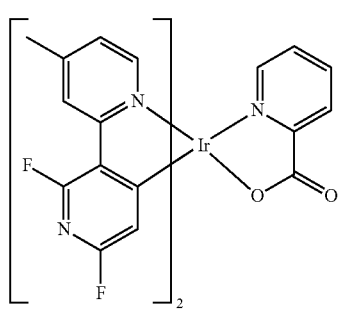
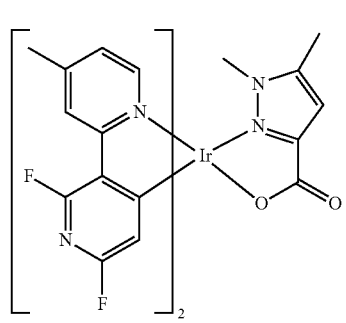
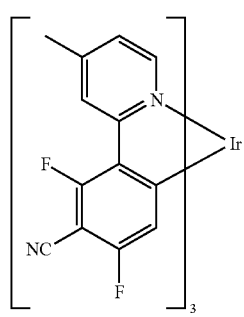
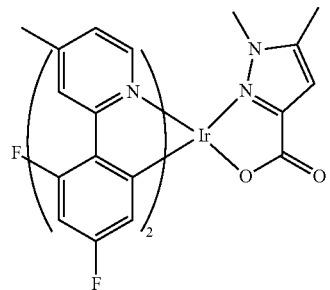
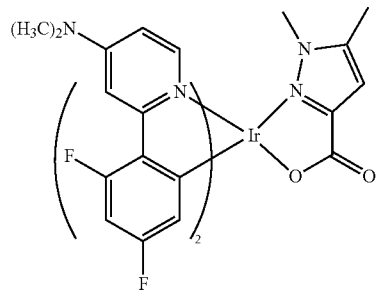

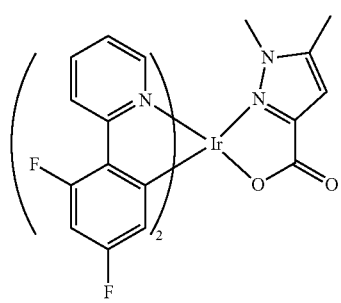
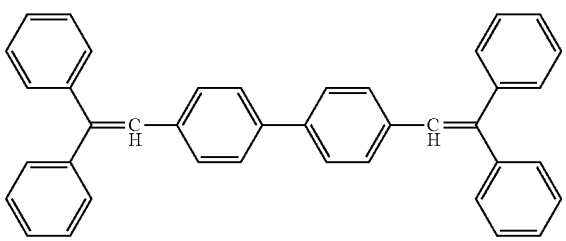
DPVBi
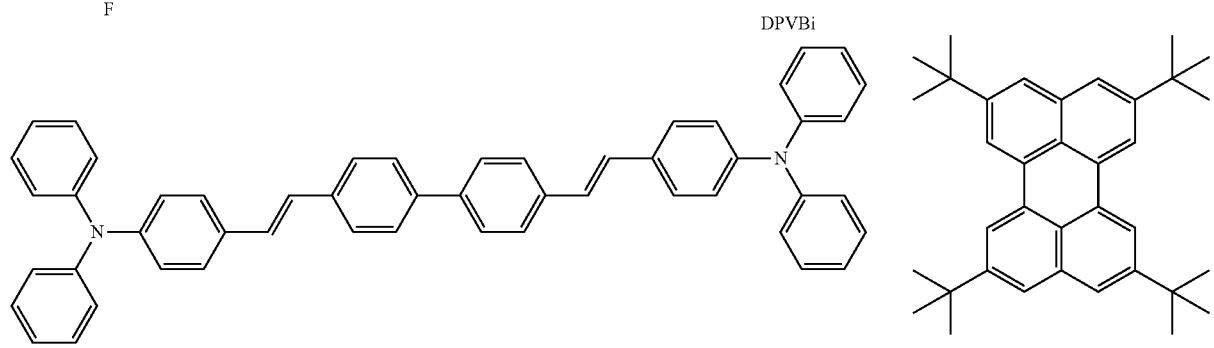
DPAVBi
TBPe
Non-limiting examples of the red dopant include compounds represented by the following formulae.
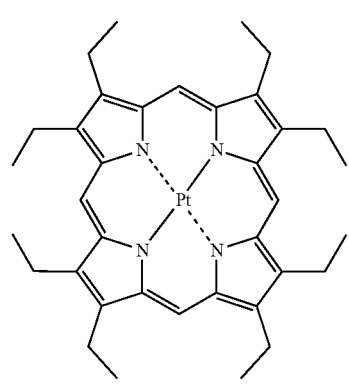
PtOEP
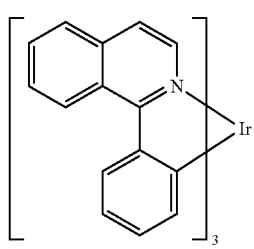
Ir(piq)₃
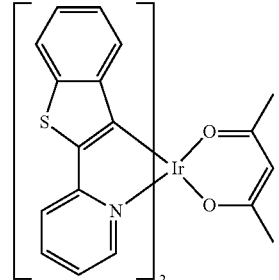
Btp₂Ir(acac)
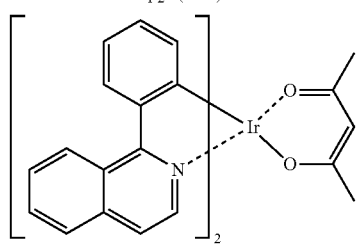
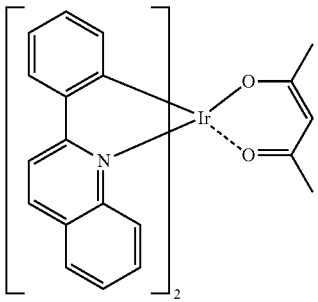
Ir(pq)₂(acac)

-continued
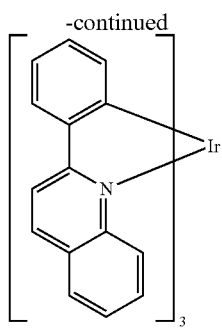
Ir(2-phq)₃
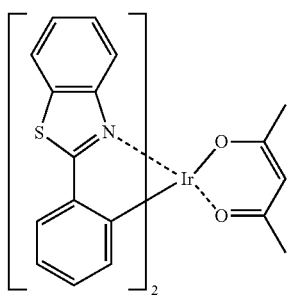
Ir(BT)₂(acac)
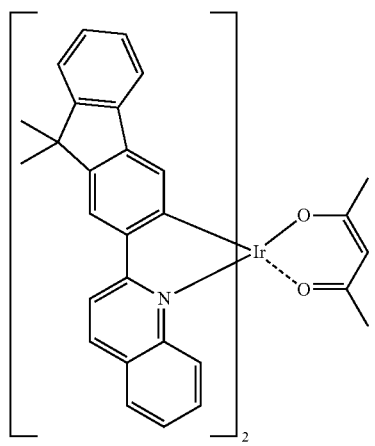
Ir(flq)₂(acac)
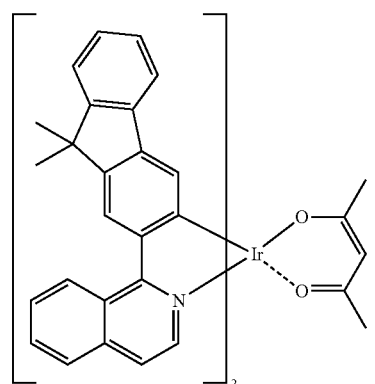
Ir(fliq)₂(acac)
-continued
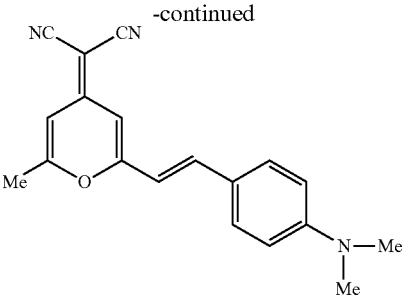
DCM
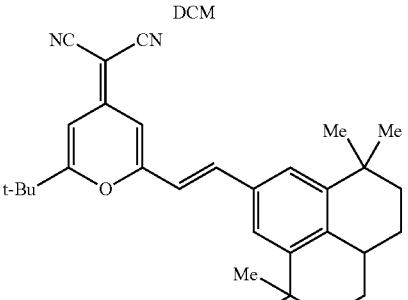
DCJTB
Non-limiting examples of the green dopant include compounds represented by the following formulae.
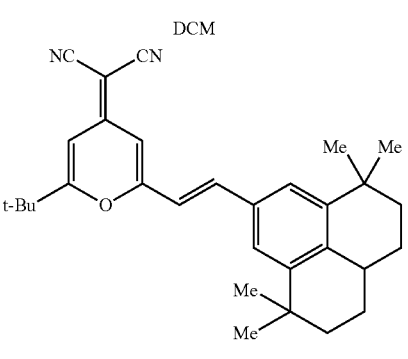
Ir(ppy)₃
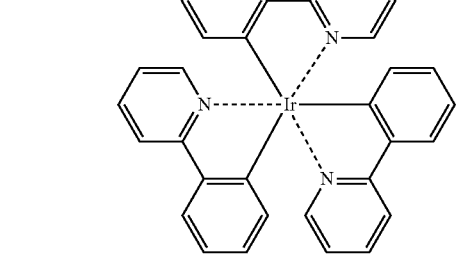
Ir(ppy)₂(acac)   Ir(mpyp)₃
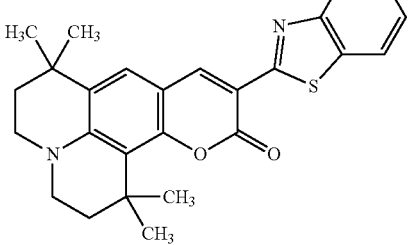
C545T Non-limiting examples of the dopant that may be used in the EML include Pt complexes represented by the following formulae.
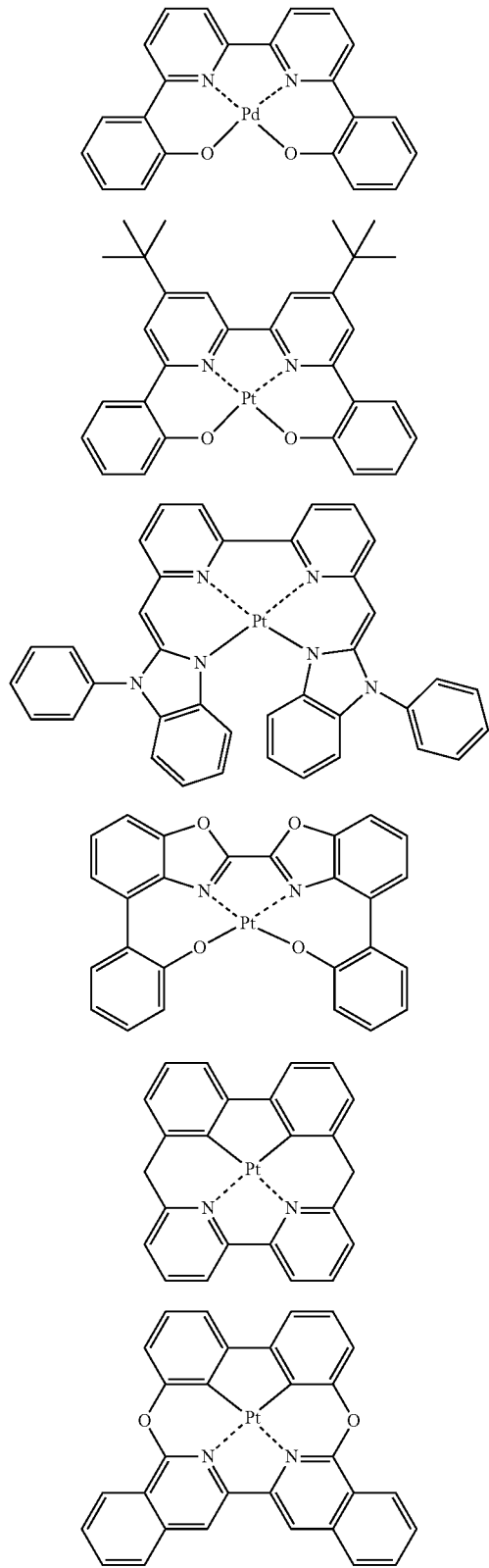
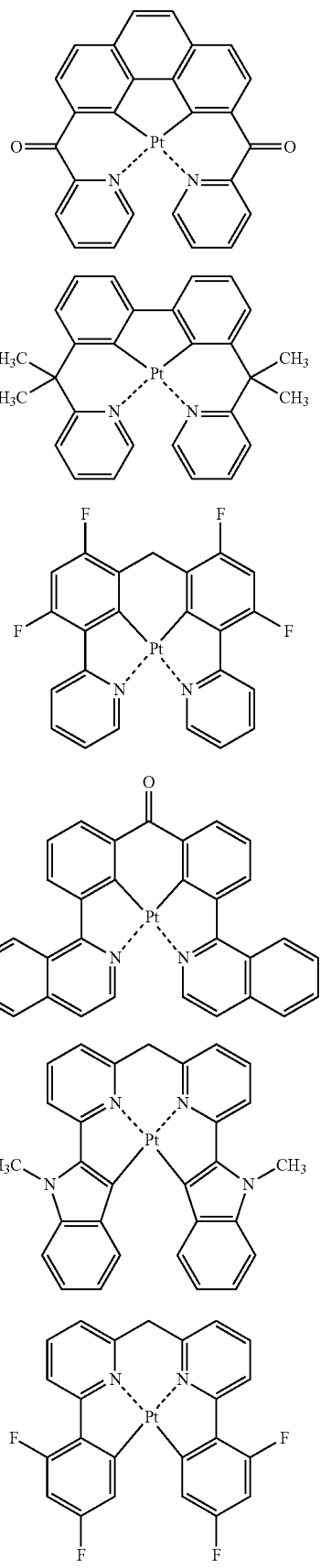

-continued
D13
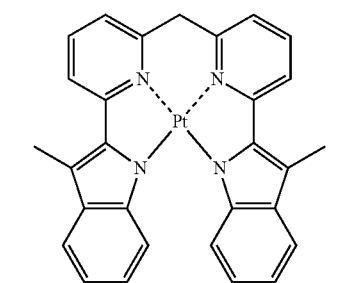
D14
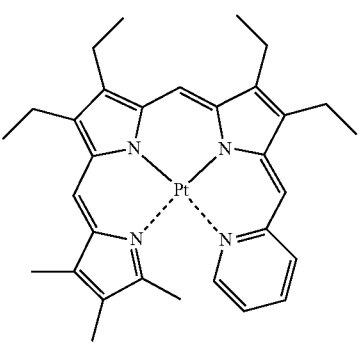
D15
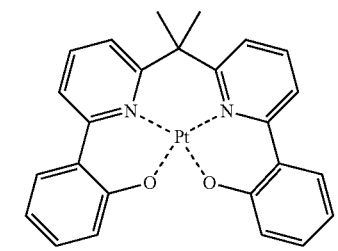
D16
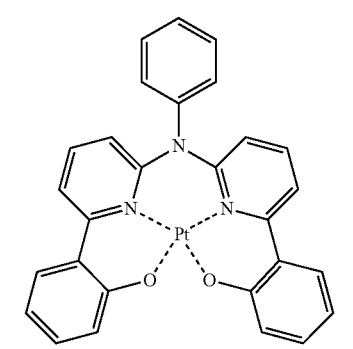
D17
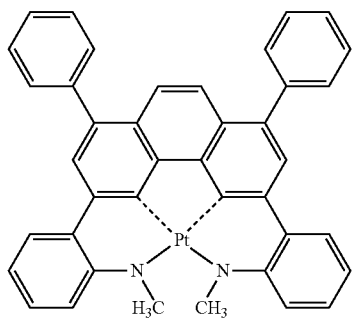
-continued
D18
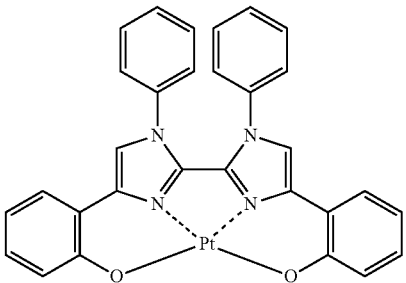
D19
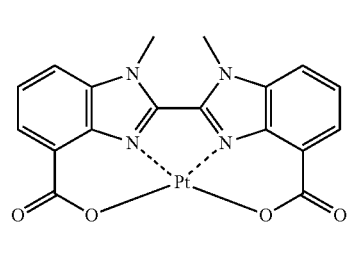
D20
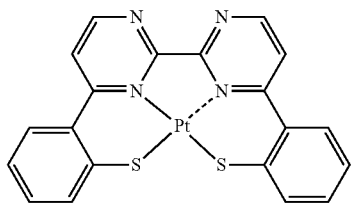
D21
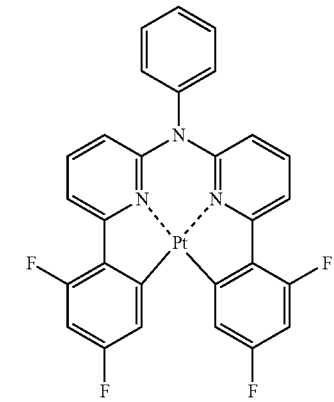
D22
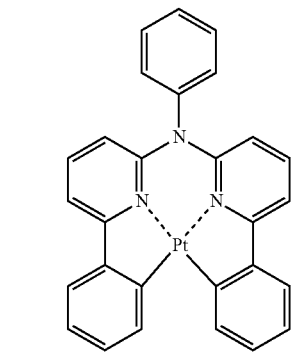

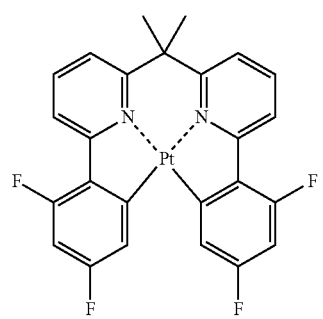
D23
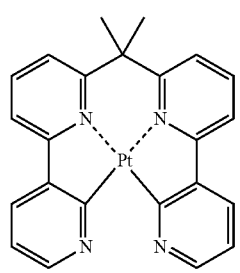
D24
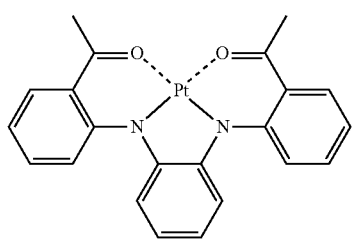
D25
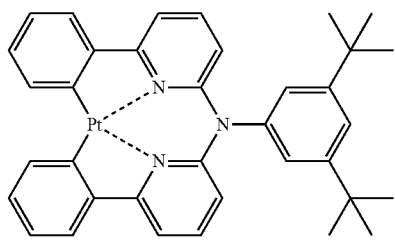
D26
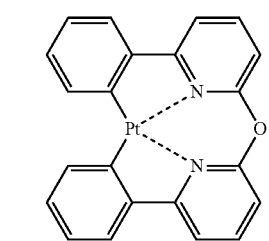
D27
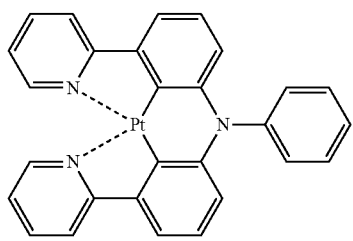
D28
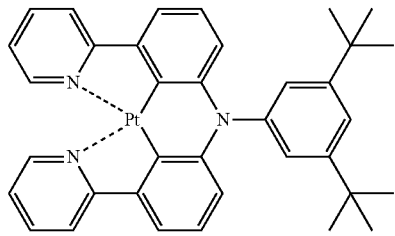
D29
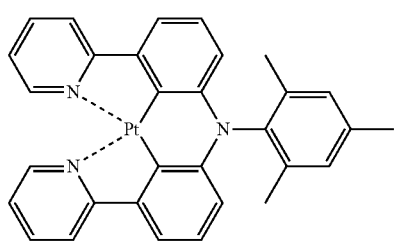
D30
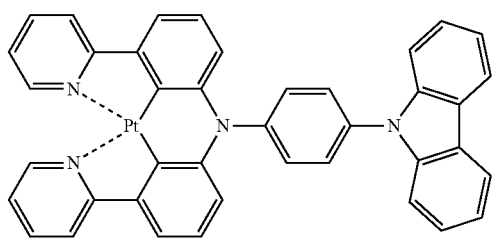
D31
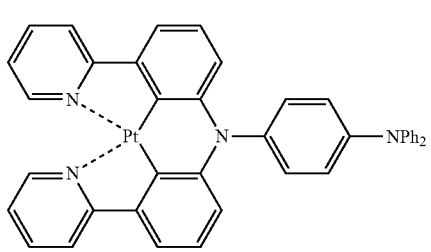
D32
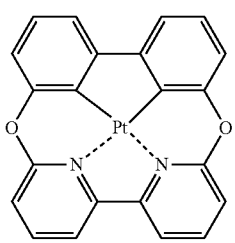
D33
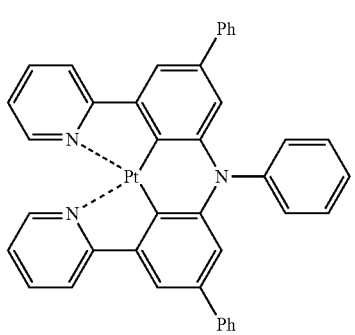
D34

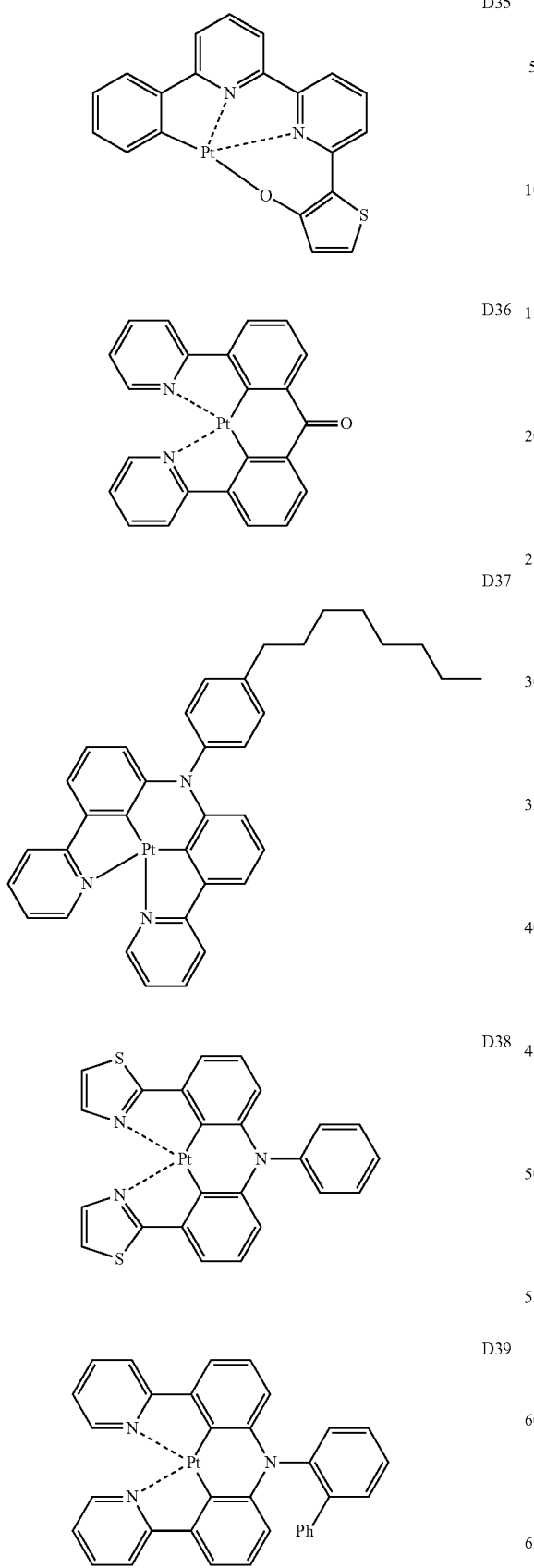
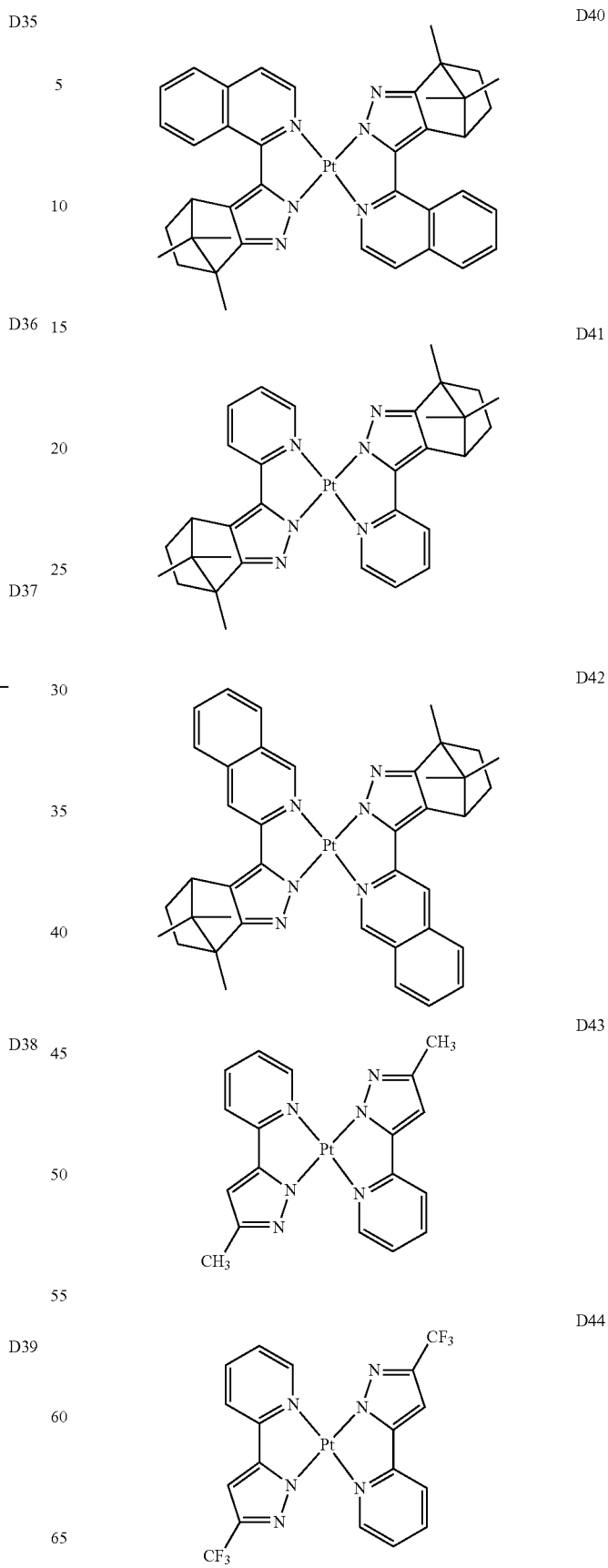

D45
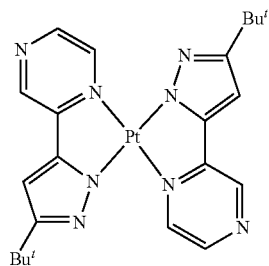
D46
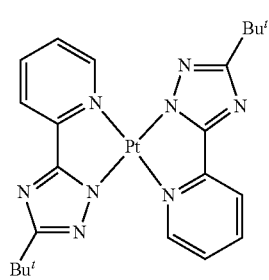
D47
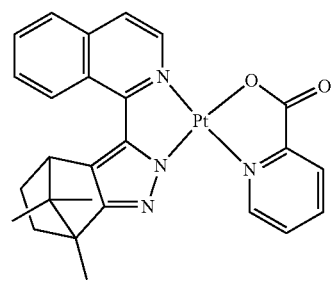
D48
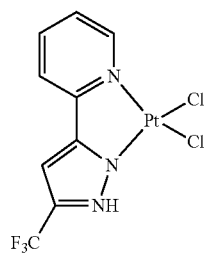
D49
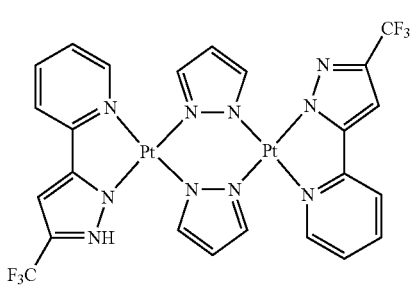
D50
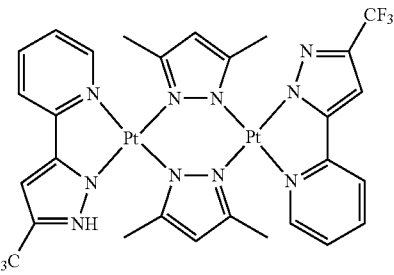
Non-limiting examples of the dopant that may be used in the EML include Os complexes represented by the following formulae.
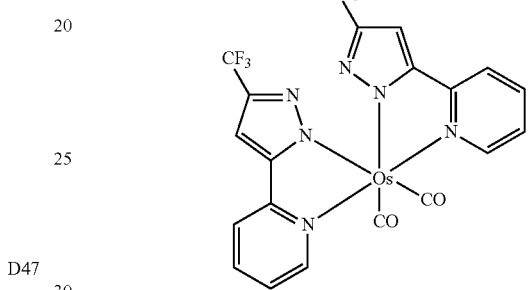
Os(fppz)$_2$(CO)$_2$
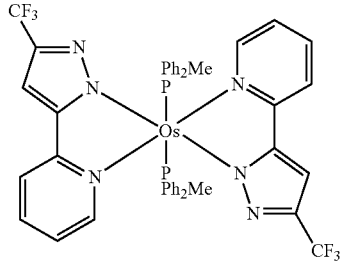
Os(fppz)$_2$(PPh$_2$Me)$_2$
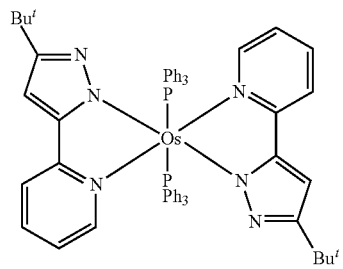
Os(bppz)$_2$(PPh$_3$)$_2$
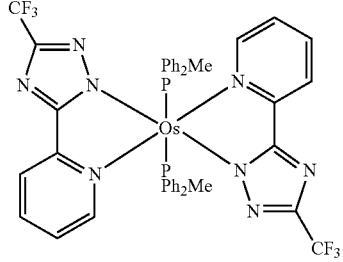
Os(fptz)$_2$(PPh$_2$Me)$_2$

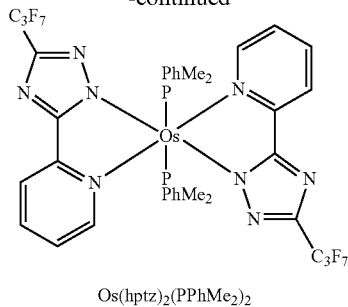

Os(hptz)₂(PPhMe₂)₂

When the EML includes both a host and a dopant, the amount of the dopant may be from about 0.01 to about 15 parts by weight based on 100 parts by weight of the host. However, the amount of the dopant is not limited to this range.

The thickness of the EML may be about 100 Å to about 1000 Å, for example, about 200 Å to about 600 Å. When the thickness of the EML is within these ranges, the EML may have good light emitting without substantially increasing driving voltage.

Then, an ETL may be formed on the EML by vacuum deposition, spin coating, casting, or the like. When the ETL is formed using vacuum deposition or spin coating, the deposition or coating conditions may be similar to those for the formation of the HIL, though the deposition or coating conditions may vary according to the compound that is used to form the ETL. A material for forming the ETL may be any material that can stably transport electrons injected from an electron injecting electrode (cathode). Examples of materials for forming the ETL include, but are not limited to, a quinoline derivative, such as tris(8-quinolinorate)aluminum (Alq3), TAZ, BAlq, beryllium bis(benzoquinolin-10-olate) (Bebq₂), 9,10-di(naphthalene-2-yl)anthracene (ADN), Compound 201, and Compound 202.

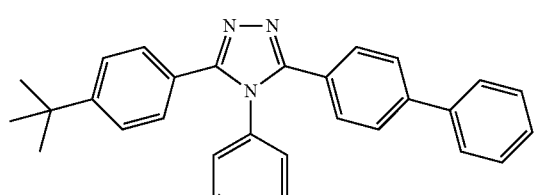

TAZ

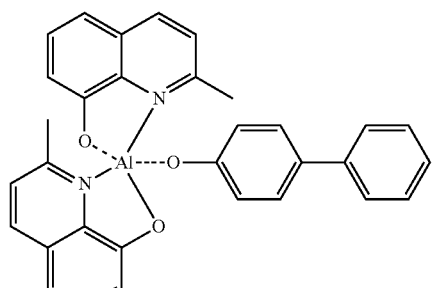

BAlq

Compound 201

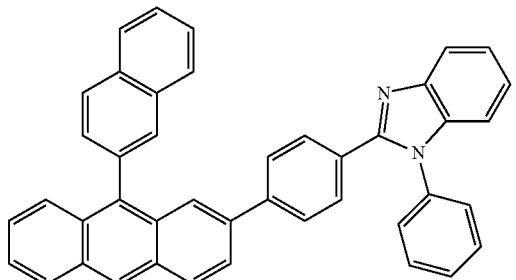

Compound 202

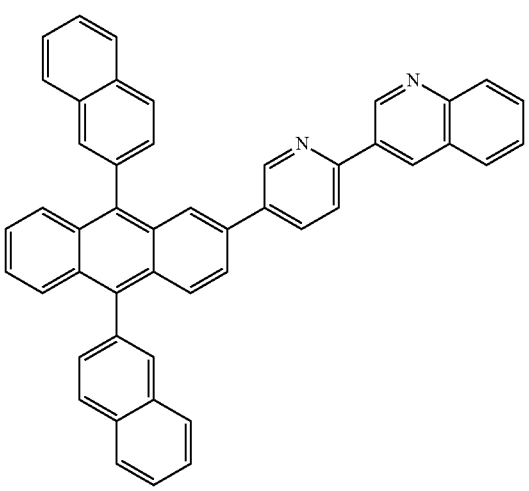

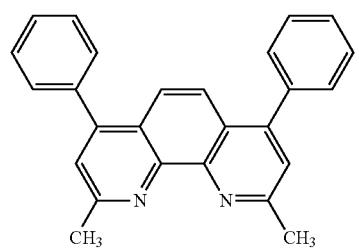

BCP

The thickness of the ETL may be in a range of about 100 Å to about 1,000 Å, for example, about 150 Å to about 500 Å. When the thickness of the ETL is within these ranges, the ETL may have satisfactory electron transporting ability without substantially increasing driving voltage.

In some embodiments, the ETL may further include a metal-containing material, in addition to an electron-transporting organic compound.

The metal-containing material may include a lithium (Li) complex. Non-limiting examples of the Li complex include lithium quinolate (LiQ) and Compound 203 below.

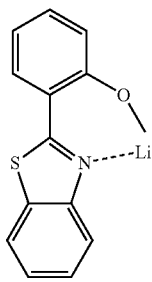

Compound 203

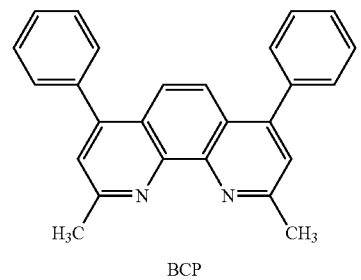 [SMILES: Cc1cc(-c2ccccc2)c2ccc3c(-c4ccccc4)cc(C)nc3c2n1 ; "BCP"]

BCP

Then, an EIL, which facilitates injection of electrons from the cathode, may be formed on the ETL. Any suitable electron-injecting material may be used to form the EIL.

Examples of materials for forming the EIL include LiF, NaCl, CsF, $Li_2O$, and BaO. The deposition or coating conditions for forming the EIL may be similar to those for the formation of the HIL, though the deposition or coating conditions may vary according to the material that is used to form the EIL.

The thickness of the EIL may be about 1 Å to about 100 Å, for example, about 3 Å to about 90 Å. When the thickness of the EIL is within these ranges, the EIL may have satisfactory electron injection ability without substantially increasing driving voltage.

Finally, the second electrode is disposed on the organic layer. The second electrode may be a cathode that is an electron injection electrode. A material for forming the second electrode may be a metal, an alloy, an electro-conductive compound (all of which have low work functions), or a mixture thereof. In this regard, the second electrode may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmissive electrode. In some embodiments, to manufacture a top-emission light-emitting device, the transmissive electrode may be formed of indium tin oxide (ITO) or indium zinc oxide (IZO).

Although the organic light-emitting device of FIG. 1 is described above, the present invention is not limited thereto.

When a phosphorescent dopant is used in the EML, a HBL may be formed between the HTL and the EML or between the H-functional layer and the EML by vacuum deposition, spin coating, casting, Langmuir-Blodgett (LB) deposition, or the like, in order to prevent diffusion of triplet excitons or holes into the ETL. When the HBL is formed by vacuum deposition or spin coating, the conditions for deposition or coating may be similar to those for the formation of the HIL, although the conditions for deposition or coating may vary according to the material that is used to form the HBL. Any known hole-blocking material may be used. Non-limiting examples of hole-blocking materials include oxadiazole derivatives, triazole derivatives, and phenanthroline derivatives. For example, 2,9-dimethyl-4,7-diphenyl-1,10-phenanthroline (BCP) represented by the following formula may be used as a material for forming the HBL.

The thickness of the HBL may be in the range of about 20 Å to about 1000 Å, for example, about 30 Å to about 300 Å. When the thickness of the HBL is within these ranges, the HBL may have improved hole blocking ability without substantially increasing driving voltage.

According to embodiments of the present invention, the organic light-emitting device may be included in various types of flat panel display devices, such as in passive matrix organic light-emitting display devices or in active matrix organic light-emitting display devices. In particular, when the organic light-emitting device is included in an active matrix organic light-emitting display device including a thin-film transistor, the first electrode on the substrate may function as a pixel electrode, and be electrically connected to a source electrode or a drain electrode of the thin-film transistor. Moreover, the organic light-emitting device may also be included in flat panel display devices having double-sided screens.

In some embodiments the organic layer of the organic light-emitting device may be formed of the compound of Formula 1 by using a deposition method or may be formed using a wet method of coating a solution of the compound of Formula 1.

Hereinafter, the present invention will be described with reference to the following synthesis examples and other examples. However, these examples are presented for illustrative purposes only and are not intended to limit the scope of the present invention.

EXAMPLES

Synthesis Example 1

Synthesis of Intermediate I-1 (Synthetic Pathway 1)

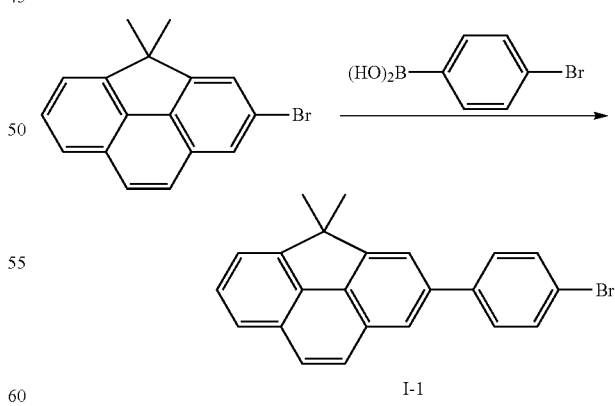

Synthesis of Intermediate I-1

2.971 g (10 mmol) of 2-bromo-4,4-dimethyl-cyclopentaphenanthrene, 2.200 g (11 mmol) of 4-bromophenyl boronic acid, 0.577 g (0.5 mmol) of tetrakis(triphenylphosphine)palladium ($Pd(PPh_3)_4$), and 1.658 g (12 mmol) of K$_2$CO$_3$ were dissolved in 100 mL of a mixed solution of tetrahydrofuran (THF) and H$_2$O (2:1 by volume) to obtain a solution, which was then stirred at about 80° C. for about 5 hours. The reaction solution was cooled to room temperature, and 40 mL of water was added thereto, followed by extraction three times with 50 mL of ethyl ether. The organic phase was collected and dried using magnesium sulfate, and the solvent was evaporated. The residue was separated using silica gel column chromatography to obtain 2.132 g (5.73 mmol) of Intermediate I-1 (Yield: 57.3%). This compound was identified using mass spectroscopy/fast atom bombardment (MS/FAB). [calc.: 372.05, found: 373.22].

Synthesis Example 2

Synthesis of Intermediate I-4 (Synthetic Pathway 2)

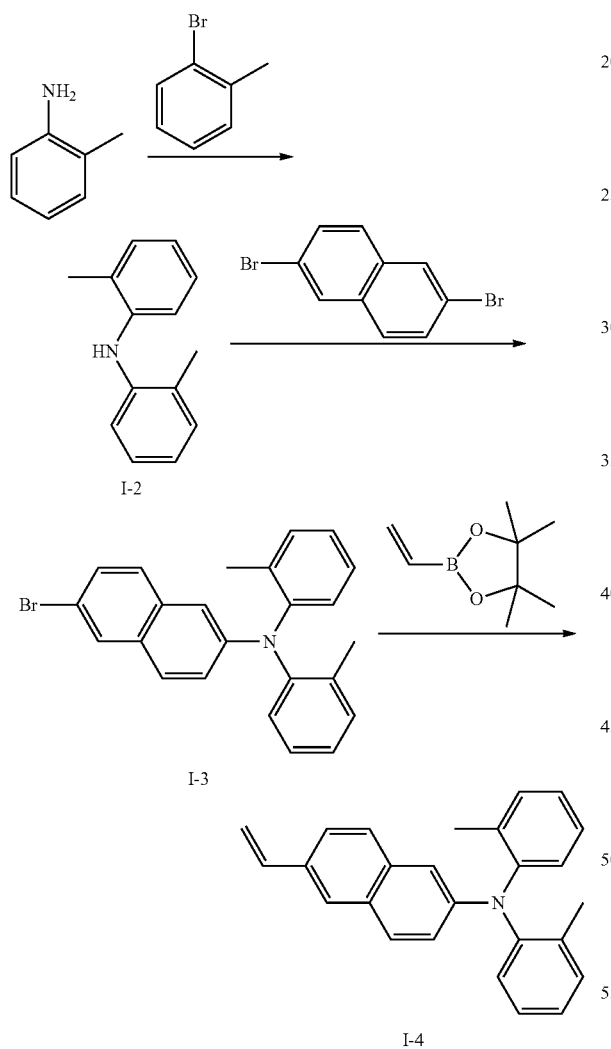

Synthesis of Intermediate I-2

3.566 g (30 mmol) of o-toluenamine, 3.420 g (20 mmol) of 2-bromotoluene, 0.915 g (0.1 mmol) of tris(dibenzylideneacetone)dipalladium) (Pd$_2$(dba)$_3$), 0.202 g (0.1 mmol) of PtBu$_3$, and 2.883 g (30 mmol) of KOtBu were dissolved in 100 mL of toluene to obtain a solution, which was then stirred at about 85° C. for about 4 hours. The reaction solution was cooled to room temperature, followed by extraction three times with 100 mL of water and 100 mL of diethyl ether. The organic phase was collected and dried using magnesium sulfate, and the solvent was evaporated. The residue was separated using silica gel column chromatography to obtain 3.349 g (17 mmol) of Intermediate I-2 (Yield: 79%). This compound was identified using MS/FAB. [calc.: 197.28, found: 198.10]

Synthesis of Intermediate I-3

4.812 g (12 mmol) of Intermediate I-3 was synthesized using 3.349 g (17 mmol) of Intermediate I-2 and 7.291 g (25.5 mmol) of 2,6-dibromonaphthalene in the same manner as in the synthesis of Intermediate I-2 (Yield: 70.5%). This compound was identified using MS/FAB. [calc.: 401.08, found: 402.20].

Synthesis of Intermediate I-4

2.135 g (7.1 mmol) of Intermediate I-3 was synthesized using 4.010 g (10 mmol) of Intermediate I-3 and 2.310 g (15 mmol) of vinylboronic acid pinacol ester in the same manner as in the synthesis of Intermediate I-1 (Yield: 71%). This compound was identified using MS/FAB. [calc.: 349.47, found: 350.10].

Synthesis Example 3

Synthesis of Intermediate I-5 (Synthetic Pathway 3)

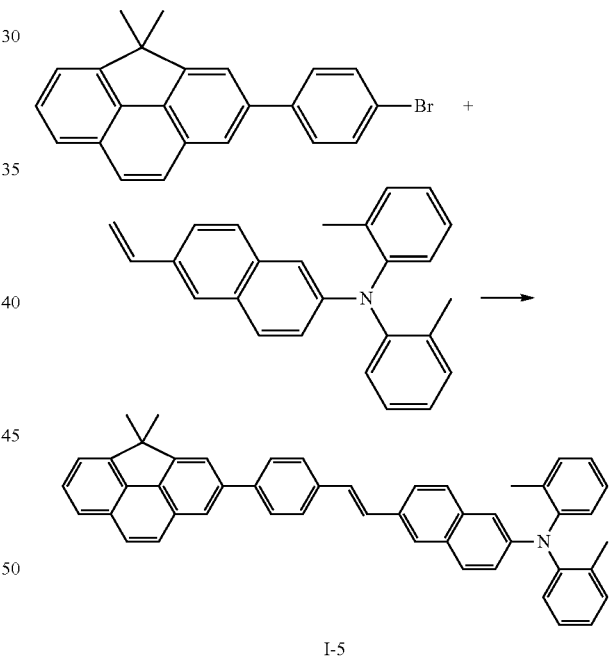

0.744 g (2 mmol) of Intermediate I-1, 0.700 g (2 mmol) of Intermediate I-4, 0.022 g (0.1 mmol) of Pd(OAc)$_2$, 0.030 g (0.1 mmol) of tri(o-tolyl)phosphine ((p-tolyl)$_3$P), and 0.202 g (2 mmol) of triethylamine (Et$_3$N) were dissolved in 10 mL of dimethylacetamide (DMAc) to obtain a solution, which was then stirred at about 85° C. for about 4 hours. The reaction solution was cooled to room temperature, followed by extraction three times with 30 mL of water and 30 mL of diethyl ether. The organic phase was collected and dried using magnesium sulfate and the solvent was evaporated. The residue was separated using silica gel column chromatography to obtain 1.284 g (1.2 mmol) of Intermediate I-5 (Yield: 60%). This compound was identified using MS/FAB. [calc.: 641.31, found: 642.20]

Synthesis Example 4

Synthesis of Compound 50 (Synthetic Pathway 4)

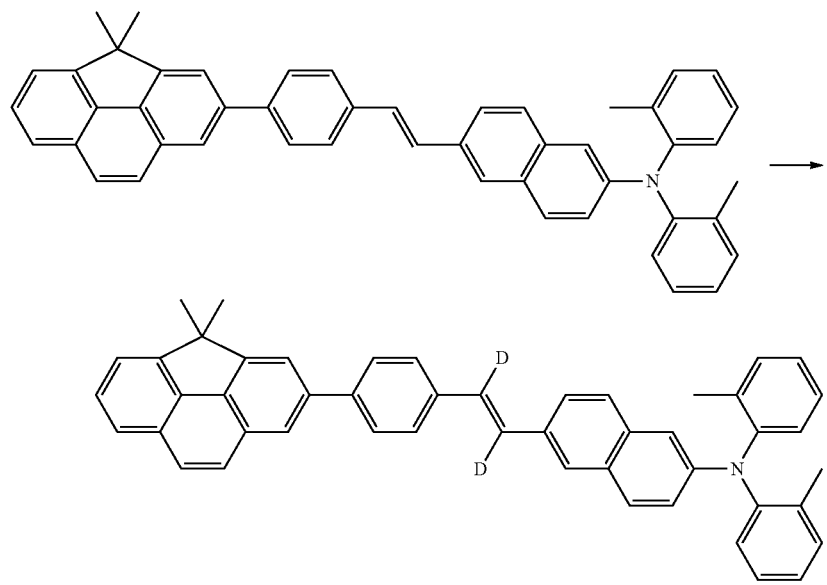

1.282 g (1.2 mmol) of Intermediate I-5, 0.081 g (0.08 mmol) of (carbonyl)chloro(hydrido)tris(triphenylphosphine) ruthenium(II) ([(Ph$_3$)P]$_3$Ru(CO)(Cl)H), and 0.56 g (28.0 mmol) of D$_2$O were dissolved in 30 mL of 1,4-dioxane to obtain a solution, which was then stirred at about 80° C. for about 12 hours. The reaction solution was cooled to room temperature, followed by solvent removal, and extraction three times with 50 mL of water and 50 mL of dichloromethane. The organic phase was collected and dried using magnesium sulfate, and the solvent was evaporated. The residue was separated using silica gel column chromatography to obtain 1.201 g (2.12 mmol) of Compound 50 (Yield: 94%). This compound was identified using MS/FAB. [calc.: 643.32, found: 644.44].

Compounds 1, 2, 4, 7, 9-10, 12, 19, 22-23, 26, 28, 33, 41, 45, 48-49, 53-54, 60, 61-63, 66, 69, 75, 80-81, 83-84, 86, and 90 were synthesized using appropriate source materials in the same manner as in Synthetic pathways 1, 2, 3, or 4, and were identified using 1H NMR and MS/FAB. The results are shown in Table 1 below.

For example, Compound I was synthesized via Synthetic pathway 2 using 4-bromotriphenylamine, instead of Intermediate I-3, and then via the same pathway as in Synthetic pathway 3 except that 2-bromo-4,4-dimethyl-cyclopentaphenanthrene was used.

Synthetic pathways and source materials for the other compounds of Table 1 would be apparent to those of ordinary skill in the art based on the synthetic pathways and source materials described above.

TABLE 1

| Compound | $^1$H NMR (CDCl$_3$, 400 MHz) | MS/FAB found | calc. |
|---|---|---|---|
| 1 | 7.84 (d, 1H), 7.75-7.58 (m, 4H), 7.50-7.38 (m, 4H), 7.31 (t, 1H), 7.16-7.04 (m, 5H), 7.20-7.05 (m, 5H), 6.78-6.70 (m, 4H), 6.21-6.18 (m, 4H), 1.86 (d, 6H) | 488.51 | 487.23 |
| 2 | 7.84 (d, 1H), 7.73-7.55 (m, 4H), 7.47-7.29 (m, 5H), 7.16 (d, 1H), 7.05-6.94 (m, 4H), 6.82-6.78 (m, 2H), 6.63-6.61 (m, 2H), 6.52-6.50 (m, 2H), 1.87(m, 6H), 1.84 (d, 6H) | 516.44 | 515.26 |
| 4 | 7.85 (d, 1H), 7.75-7.58 (m, 4H), 7.50-7.31 (m, 7H), 7.16-7.04 (m, .H), 6.78-6.63 sm, 4H), 6.23-6.19 (m, 2H), 1.86 (d, 6H) | 520.45 | 519.24 |
| 7 | 7.85 (d, 1H), 7.74-7.42 (m, 19H), 7.31-7.29 (m, 1H), 7.16-7.03 (m, 4H), 6.68-6.60 (m, 2H), 6.14-6.12 (m, 4H), 1.83(d, 6H) | 658.33 | 657.28 |
| 9 | 7.92-7.83 (m, 4H), 7.73-7.58 (m, 4H), 7.49-7.40 (m, 7H), 7.33-7.04 (m, 8H), 6.84-6.63 (m, 6H), 6.49 (dd, 1H), 6.31(dd, 2H), 5.48 (d, 1H), 1.87 (d, 6H) | 726.33 | 725.31 |
| 10 | 8.10-8.05 (m, 2H), 7.78-7.62 (m, 8H), 7.43-7.34 (m, 5H), 7.25-7.04 (m, 12H), 6.97(dd, 1H), 6.65 (t, 2H), 6.26 (t, 1H) 6.18 (dd, 4H) | 662.45 | 661.28 |

TABLE 1-continued

| Compound | ¹H NMR (CDCl₃, 400 MHz) | MS/FAB found | MS/FAB calc. |
|---|---|---|---|
| 12 | 8.10-8.01 (m, 2H), 7.85 (d, 1H), 7.74-7.60 (m, 6H), 7.50 (d, 1H), 7.41 (d, 1H), 7.33-7.19 (m, 4H), 7.04-6.94 (m, 4H), 6.82-6.78 (m, 2H), 6.60 (dd, 2H), 1.90 (m, 6H), 1.86 (d, 6H). | 566.37 | 565.28 |
| 19 | 8.13 (d, 1H), 7.88-7.60 (m, 9H), 7.52-7.18 (m, 8H), 7.10-6.92 (m, 5H), 6.83 (dd, 1H), 6.63 (t, 1H), 6.27 (dd, 2H), 3H), 1.83 (d, 6H) | 643.84 | 643.23 |
| 22 | 7.85 (d, 1H), 7.74-7.60 (m, 7H), 7.43-7.29 (m, 4H), 7.09-7.04 (m, 4H), 6.93 (d, 1H), 6.67-6.63 (m, 3H), 6.46 (d, 1H), 6.15 (dd, 4H), 1.86 (d, 6H), 1.61 (d, 6H) | 604.10 | 603.29 |
| 23 | 7.85 (d, 1H), 7.78-7.52 (m, 12H), 7.43-7.29 (m, 4H), 7.10-7.05 (m, 3H), 6.93 (d, 1H), 6.71-6.63 (m, 2H), 6.53 (d, 1H), 6.22 (dd, 2H), 1.86 (d, 6H), 1.61 (d, 6H) | 654.45 | 653.31 |
| 26 | 8.18 (s, 1H), 8.02 (s, 1H), 7.74-7.50 (m, 8H), 7.31 (t, 1H), 7.04-6.94 (m, 4H), 6.82-6.78 (m, 2H), 6.63-6.51 (m, 3H), 6.30 (d, 1H), 2.00 (m, 6H), 1.86 (m, 6H), 1.84 (s, 6H), 1.63 (s, 6H) | 660.40 | 659.36 |
| 28 | 7.85 (d, 1H), 7.74-7.62 (m, 7H), 7.38-7.29 (m, 3H), 7.15-7.07 (m, 2H), 7.00-6.93 (m, 4H), 6.69-6.58 (m, 3H), 6.47 (d, 1H), 1.86 (d, 6H), 1.61 (d, 6H) | 642.33 | 641.29 |
| 29 | 7.85 (d, 1H), 7.75-7.65 (m, 7H), 7.38-7.29 (m, 3H), 6.67-6.65 (dd, 1H), 6.47 (d, 1H), 1.86 (d, 6H), 1.61 (d, 6H) | 616.28 | 615.37 |
| 33 | 7.85 (d, 1H), 7.78-7.60 (m, 8H), 7.52-7.29 (m, 7H), 7.08-7.03 (m, 4H), 6.93 (d, 1H), 6.81-6.77 (m, 2H), 6.65 (t, 2H), 6.16 (dd, 4H), 1.86 (d, 6H), 1.61 (d, 6H) | 595.44 | 594.21 |
| 41 | 7.85-7.81 (m, 2H), 7.74-7.60 (m, 5H), 7.52-7.48 (m, 1H), 7.35-7.18 (m, 5H), 7.05-6.79 (m, 6H), 6.63-6.50 (m, 3H), 6.19-6.15 (m, 2H), 1.88 (s, 3H), 1.84 (d, 6H) | 552.88 | 551.72 |
| 45 | 8.86 (d, 1H), 8.28 (d, 1H), 8.13 (s, 1H), 7.81-7.58 (m, 8H), 7.45 (s, 1H), 7.38-7.04 (m, 11H), 6.95 (dd, 1H), 6.77-6.63 (m, 3H), 6.24 (dd, 2H), 1.84 (d, 6H) | 691.02 | 689.86 |
| 48 | 8.46 (dd, 2H), 8.23 (d, 1H), 8.00 (s, 1H), 7.85-7.62 (m, 9H), 7.49-7.23 (m, 12H), 7.10-6.97 (m, 3H), 6.81 (dd, 1H), 6.66 (t, 1H), 6.30-6.27 (m, 2H), 1.84 (d, 6H) | 755.42 | 754.33 |
| 49 | 8.18 (s, 1H), 8.07 (dd, 1H), 7.95 (d, 1H), 7.75-7.51 (m, 6H), 7.49-7.41 (m, 6H), 7.31 (t, 1H), 7.23 (d, 1H), 7.08-6.95 (m, 6H), 6.65 (t, 2H), 6.18 (dd, 4H), 1.84 (d, 6H) | 614.20 | 613.28 |
| 50 | 8.18 (s, 1H), 8.07 (dd, 1H), 7.95 (d, 1H), 7.75-7.51 (m, 4H), 7.49-7.41 (m, 6H), 7.31 (t, 1H), 7.23 (d, 1H), 7.08-6.95 (m, 6H), 6.65 (t, 2H), 6.18 (dd, 4H), 1.84 (d, 6H), 1.60 (s, 6H) | 643.32 | 644.44 |
| 53 | 8.90 (d, 1H), 8.10-8.05 (m, 4H), 7.85-7.56 (m, 9H), 7.43-7.29 (m, 3H), 7.08-6.95 (m, 5H), 6.65 (t, 2H), 6.18 (d, 4H), 1.83 (d, 6H) | 615.33 | 614.27 |
| 54 | 8.90 (d, 1H), 8.10-8.05 (m, 4H), 7.85-7.56 (m, 9H), 7.43-7.29 (m, 3H), 7.08-6.95 (m, 5H), 6.77-6.63 (m, 3H), 6.24 (dd, 2H), 1.82 (d, 6H) | 642.10 | 641.28 |
| 60 | 8.19 (s, 1H), 8.10-8.04 (m, 2H), 7.79-7.61 (m, 8H), 7.52-7.40 (m, 5H), 7.32 (s, 1H), 7.19 (d, 1H), 7.08-6.95 (m, 5H), 6.65 (t, 2H), 6.18 (dd, 4H), 1.83 (d, 6H) | 614.30 | 613.28 |
| 61 | 8.19 (s, 1H), 8.10-8.04 (m, 2H), 7.86 (d, 1H), 7.79-7.61 (m, 8H), 7.52-7.40 (m, 6H), 7.32 (s, 1H), 7.25 (d, 1H), 7.16-7.05 (m, 14H), 6.89-6.79 (m, 2H), 6.66-6.50 (m, 3H), 6.22 (dd, 2H), 1.83 (d, 6H) | 853.52 | 853.37 |
| 62 | 8.19 (d, 1H), 7.89 (dd, 1H), 7.77-7.61 (m, 6H), 7.52-7.40 (m, 5H), 7.32-7.18 (m, 4H), 6.96-6.92 (m, 1H), 6.76 (d, 1H), 1.83 (d, 6H) | 624.40 | 623.34 |
| 63 | 8.19-8.15 (m, 2H), 7.88-7.83 (m, 2H), 7.77-7.61 (m, 6H), 7.54-7.23 (m, 17H), 7.10-6.87 (m, 5H), 6.65-6.54 (m, 2H), 6.27-6.24 (m, 2H), 1.87 (d, 6H) | 779.20 | 778.33 |
| 66 | 8.24 (s, 1H), 7.94 (q, 2H), 7.79-7.70 (m, 3H), 7.61 (dd, 2H), 7.50-7.35 (m, 7H), 7.25-7.03 (m, 6H), 6.78-6.63 (m, 5H), 6.23-6.20 (m, 2H), 1.87 (d, 6H) | 639.30 | 638.27 |
| 69 | 8.27 (s, 1H), 8.15 (s, 1H), 8.00-7.78 (m, 6H), 7.72-7.35 (m, 19H), 7.16-7.03 (m, 4H), 6.68-6.60 (m, 3H), 6.14 (m, 2H), 1.87 (d, 6H) | 784.40 | 783.33 |
| 75 | 8.65-8.53 (m, 2H), 8.34 (d, 1H), 8.10-7.98 (m, 3H), 7.81-7.48 (m, 12H), 7.41 (d, 1H), 7.32 (d, 1H), 7.24-6.94 (m, 7H), 6.80 (t, 2H), 6.60 (d, 2H), 1.92 (d, 6H), 1.84 (d, 6H) | 742.58 | 741.34 |
| 80 | 8.12 (d, 2H), 7.85 (d, 1H), 7.74-7.64 (m, 3H), 7.59 (d, 1H), 7.56-7.50 (m, 4H), 7.40-7.20 (m, 10H), 1.84 (d, 6H) | 486.30 | 485.21 |
| 81 | 8.37-8.29 (m, 3H), 8.06 (dd, 1H), 7.85 (d, 1H), 7.74-7.49 (m, 12H), 7.40-7.30 (m, 6H), 7.25 (d, 1H), 1.84 (d, 6H) | 526.10 | 535.23 |
| 83 | 7.78-7.64 (m, 7H), 7.55 (d, 1H), 7.43-7.34 (m, 6H), 7.25 (d, 1H), 7.15-7.04 (m, 11H), 6.67-6.63 (m, 3H), 6.46 (d, 1H), 6.26 (t, 1H), 6.16 (m, 4H), 1.61 (d, 6H) | 728.20 | 727.32 |

TABLE 1-continued

| Compound | $^1$H NMR (CDCl$_3$, 400 MHz) | MS/FAB found | MS/FAB calc. |
|---|---|---|---|
| 84 | 7.78-7.64 (m, 9H), 7.58-7.52 (m, 4H), 7.43-7.34 (m, 7H), 7.25 (d, 1H), 7.19-7.08 (m, 10H), 6.71-6.62 (m, 2H), 6.52 (d, 1H), 6.26 (t, 1H), 6.22 (dd, 2H), 1.61 (d, 6H) | 778.40 | 777.34 |
| 86 | 7.78 (d, 1H), 7.70-7.64 (d, 6H), 7.55 (d, 1H), 7.43-7.34 (m, 6H), 7.25 (d, 1H), 7.15-6.94 (m, 11H), 6.94 (dd, 2H), 6.63 (d, 2H), 6.54 (dd, 1H), 6.37 (d, 1H), 6.26 (t, 1H), 1.84 (d, 6H), 1.61 (d, 6H) | 756.40 | 755.36 |
| 90 | 8.09 (d, 1H), 8.03 (d, 1H), 7.78-7.49 (m, 16H), 7.27-7.24 (m, 4H), 7.11-7.07 (m, 7H), 6.97 (dd, 1H), 6.26 (t, 1H) | 818.30 | 817.28 |

Example 1

To manufacture an anode, a corning 15 Ω/cm$^2$ (500 Å) ITO glass substrate was cut to a size of 50 mm×50 mm×0.7 mm and then sonicated in isopropyl alcohol and pure water each for five minutes, and then cleaned by irradiation with ultraviolet rays for 30 minutes, and exposure to ozone. The resulting glass substrate was loaded into a vacuum deposition device.

Then, 2-TNATA, which is a HIL material, was vacuum-deposited on the glass substrate to form a HIL having a thickness of about 600 Å. Then, 4,4'-bis[N-(1-naphthyl)-N-phenylamino]biphenyl (NPB), which is a hole transporting compound, was vacuum-deposited on the HIL to form a HTL having a thickness of about 300 Å.

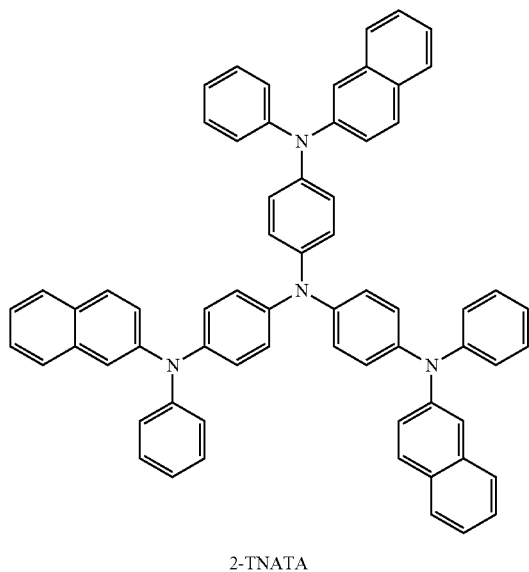

2-TNATA

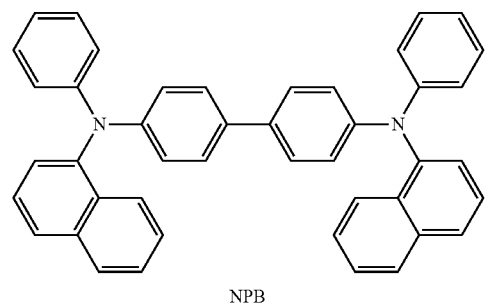

NPB

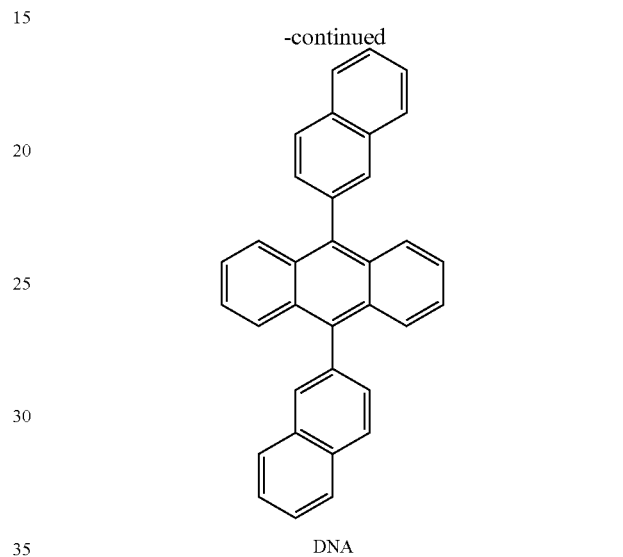

DNA

A blue fluorescent host, 9,10-di-naphthalene-2-yl-anthracene (DNA), and Compound 1 of Synthesis Example 1, which is a blue fluorescent dopant, were simultaneously deposited on the HTL at a weight ratio of 98:2 to form an EML having a thickness of 300 Å.

Then, Alq3 was deposited on the EML to form an ETL having a thickness of 300 Å, and then LiF, which is a halogenated alkali metal, was deposited on the ETL to form an EIL having a thickness of 10 Å. Then, Al was vacuum-deposited on the EIL to form a cathode having a thickness of 3000 Å, thereby forming an LiF/Al electrode and completing the manufacture of an organic light-emitting device.

The organic light-emitting device had a driving voltage of about 6.13V at a current density of 50 mA/cm$^2$, a luminosity of 3140 cd/m$^2$, a luminescent efficiency of 6.28 cd/A, and a half life-span (hr @100 mA/cm$^2$) of about 334 hours.

Example 2

An organic light-emitting device was manufactured in the same manner as Example 1, except that Compound 23 was used instead of Compound 1 to form the EML.

The organic light-emitting device had a driving voltage of about 6.27V at a current density of 50 mA/cm$^2$, a luminosity of 3425 cd/m$^2$, a luminescent efficiency of 6.85 cd/A, and a half life-span (hr @100 mA/cm$^2$) of about 328 hours.

Example 3

An organic light-emitting device was manufactured in the same manner as Example 1, except that Compound 33 was used instead of Compound I to form the EML.

The organic light-emitting device had a driving voltage of about 5.96V at a current density of 50 mA/cm$^2$, a luminosity of 3155 cd/m$^2$, a luminescent efficiency of 6.31 cd/A, and a half life-span (hr @100 mA/cm$^2$) of about 273 hours.

Example 4

An organic light-emitting device was manufactured in the same manner as Example 1, except that Compound 50 was used instead of Compound 1 to form the EML.

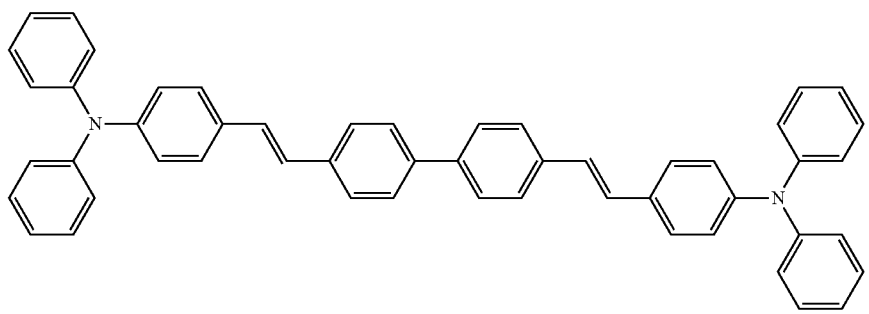

DPAVBi

The organic light-emitting device had a driving voltage of about 6.22V at a current density of 50 mA/cm$^2$, a luminosity of 3380 cd/m$^2$, a luminescent efficiency of 6.76 cd/A, and a half life-span (hr @100 mA/cm$^2$) of about 347 hours.

Example 5

An organic light-emitting device was manufactured in the same manner as Example 1, except that Compound 69 was used instead of Compound 9 to form the EML.

The organic light-emitting device had a driving voltage of about 6.29V at a current density of 50 mA/cm$^2$, a luminosity of 3410 cd/m$^2$, a luminescent efficiency of 6.82 cd/A, and a half life-span (hr @100 mA/cm$^2$) of about 308 hours.

Example 6

An organic light-emitting device was manufactured in the same manner as Example 1, except that Compound 80 was used instead of Compound 1 to form the EML.

The organic light-emitting device had a driving voltage of about 6.12V at a current density of 50 mA/cm$^2$, a luminosity of 3405 cd/m$^2$, a luminescent efficiency of 6.81 cd/A, and a half life-span (hr @100 mA/cm$^2$) of about 258 hours.

Example 7

An organic light-emitting device was manufactured in the same manner as Example 1, except that Compound 84 was used instead of Compound 1 to form the EML.

The organic light-emitting device had a driving voltage of about 6.25V at a current density of 50 mA/cm$^2$, a luminosity of 3530 cd/m$^2$, a luminescent efficiency of 7.06 cd/A, and a half life-span (hr @100 mA/cm$^2$) of about 315 hours.

Comparative Example 1

An organic light-emitting device was manufactured in the same manner as Example 1, except that a blue fluorescent dopant, 4,4'-bis[2-(4-(N,N-diphenylamino)phenyl)vinyl]biphenyl (DPAVBi), was used instead of Compound 1 to form the EML.

The organic light-emitting device had a driving voltage of about 7.35V at a current density of 50 mA/cm$^2$, a luminosity of 2065 cd/m$^2$, a luminescent efficiency of 4.13 cd/A, and a half life-span (hr @100 mA/cm$^2$) of about 145 hours.

Comparative Example 2

An organic light-emitting device was manufactured in the same manner as Example 1, except that Compound 1000 was used instead of Compound 1 to form the EML.

The organic light-emitting device had a driving voltage of about 6.34V at a current density of 50 mA/cm$^2$, a luminosity of 3108 cd/m$^2$, a luminescent efficiency of 6.21 cd/A, and a half life-span (hr @100 mA/cm$^2$) of about 290 hours.

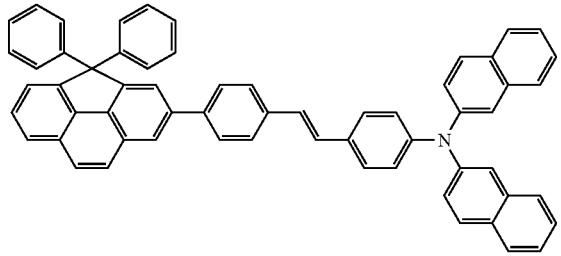

1000

The characteristics and lifetimes of the organic light-emitting devices of Examples 1-7 and Comparative Examples 1 and 2 are shown in Table 2 below.

TABLE 2

|  | EML material | Driving voltage (V) | Current density (mA/cm$^2$) | Luminance (cd/m$^2$) | Luminescent efficiency (cd/A) | Emitting color | Half life-span (hr @ 100 mA/cm$^2$) |
|---|---|---|---|---|---|---|---|
| Ex. 1 | Comp. 1 | 6.13 | 50 | 3,140 | 6.28 | blue | 334 hr |
| Ex. 2 | Comp. 23 | 6.27 | 50 | 3,425 | 6.85 | blue | 328 hr |
| Ex. 3 | Comp. 33 | 5.96 | 50 | 3,155 | 6.31 | blue | 273 hr |
| Ex. 4 | Comp. 50 | 6.22 | 50 | 3,380 | 6.76 | blue | 347 hr |
| Ex. 5 | Comp. 69 | 6.29 | 50 | 3,410 | 6.82 | blue | 308 hr |
| Ex. 6 | Comp. 80 | 6.12 | 50 | 3,405 | 6.81 | bluish green | 258 hr |
| Ex. 7 | Comp. 84 | 6.25 | 50 | 3,530 | 7.06 | blue | 315 hr |
| Comp. Ex. 1 | DPAVBi | 7.35 | 50 | 2,065 | 4.13 | blue | 145 hr |
| Comp. Ex. 2 | Form. 1000 | 6.34 | 50 | 3,108 | 6.21 | blue | 290 hr |

The organic light-emitting devices manufactured using the compounds represented by Formula 1 according to embodiments of the present invention as blue dopants for the EML had lower driving voltages and much higher I-V-L characteristics, as compared to the devices manufactured using the widely-known material, DPVBi. In particular, the organic light-emitting devices according to embodiments of the present invention had markedly improved lifetimes.

The novel compounds of Formula 1, described above, may be used as a blue dopant in a fluorescent device with high light-emission characteristics. Therefore, organic light-emitting devices having high efficiency, low driving voltages, high luminance, and long lifetimes may be manufactured using the compounds.

The compound of Formula 1 may have a high glass transition temperature (Tg) or melting point. Thus, the compound of Formula 1 has high heat resistance against Joule's heat generated between organic layers, or between an organic layer and a metal electrode when light emission occurs, and has high durability in high-temperature environments. An organic light-emitting device manufactured using the compound of Formula 1 described above may have high durability when stored or operated.

While the present invention has been illustrated and described with reference to exemplary embodiments thereof, it will be understood by those of ordinary skill in the art that various changes may be made to the described embodiments without departing from the spirit and scope of the present invention as defined by the following claims.

What is claimed is:

1. A compound for an organic light-emitting device represented by Formula 1:

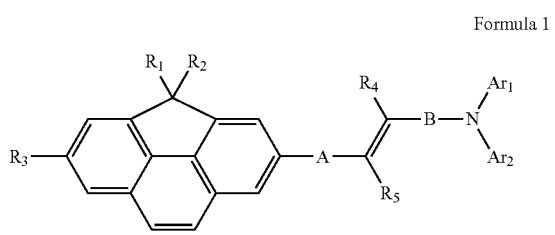

Formula 1 wherein, $R_1$, $R_2$, $R_3$, $R_4$, and $R_5$ are each independently a hydrogen atom, a deuterium atom, a halogen group, a cyano group, a substituted or unsubstituted $C_1$-$C_{60}$ alkyl group, a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group;

$Ar_1$ and $Ar_2$ are each independently a substituted or unsubstituted $C_6$-$C_{60}$ aryl group, a substituted or unsubstituted $C_3$-$C_{60}$ heteroaryl group, or a substituted or unsubstituted $C_6$-$C_{60}$ condensed polycyclic group; and A and B are each independently:

a bond, a divalent linker including a substituted or unsubstituted $C_6$-$C_{60}$ arylene group, a substituted or unsubstituted $C_3$-$C_{60}$ heteroarylene group, or a substituted or unsubstituted $C_6$-$C_{60}$ condensed polycyclic group, or a linker including at least two linked groups selected from substituted or unsubstituted $C_6$-$C_{60}$ arylene groups, substituted or unsubstituted $C_3$-$C_{60}$ heteroarylene groups, and substituted or unsubstituted $C_6$-$C_{60}$ condensed polycyclic groups, except that A and B are not both a phenylene group or a bond.

2. The compound of claim 1, wherein $R_1$, $R_2$, $R_3$, $R_4$, and $R_5$ are each independently a hydrogen atom, a deuterium atom, a halogen group, a cyano group, a substituted or unsubstituted $C_1$-$C_{30}$ alkyl group, a substituted or unsubstituted $C_6$-$C_{30}$ aryl group, a substituted or unsubstituted $C_3$-$C_{30}$ heteroaryl group, or a substituted or unsubstituted $C_6$-$C_{30}$ condensed polycyclic group;

$Ar_1$ and $Ar_2$ are each independently a substituted or unsubstituted $C_6$-$C_{30}$ aryl group, a substituted or unsubstituted $C_3$-$C_{30}$ heteroaryl group, or a substituted or unsubstituted $C_6$-$C_{30}$ condensed polycyclic group; and A and B are each independently a bond, or a divalent linker including a substituted or unsubstituted $C_6$-$C_{30}$ arylene group, a substituted or unsubstituted $C_3$-$C_{30}$ heteroarylene group, a substituted or unsubstituted $C_6$-$C_{30}$ condensed polycyclic group.

3. The compound of claim 1, wherein $R_4$ to $R_5$ are each independently a hydrogen atom, a deuterium atom, a substituted or unsubstituted $C_1$-$C_{30}$ alkyl group, or a substituted or unsubstituted $C_6$-$C_{30}$ aryl group.

4. The compound of claim 1, wherein $R_1$, $R_2$, $R_3$, $R_4$, and $R_5$ are each independently a hydrogen atom, a deuterium atom, a halogen) group, a cyano group, a substituted or unsubstituted $C_1$-$C_{20}$ alkyl group, or a group represented by one of Formulae 2a to 2e:

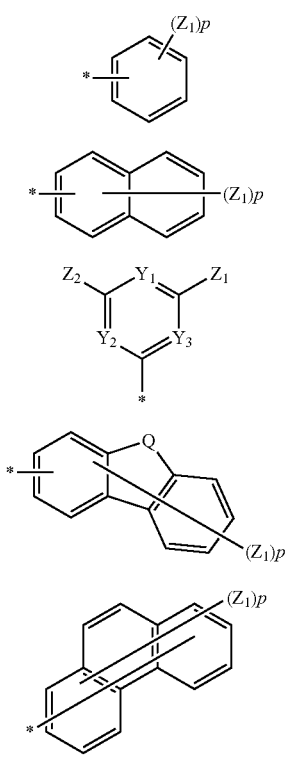

wherein:

Y₁, Y₂, and Y₃ are each independently a linking group represented by —N=, —N(R₂₀)—, or —C(R₂₁)=;

Q is a linking group represented by —C(R₃₀)(R₃₁)—, —N(R₃₂)—, —S—, or —O—;

Z₁, Z₂, R₂₀, R₂₁, R₃₀, R₃₁, and R₃₂ are each independently a hydrogen atom, a deuterium atom, a substituted or unsubstituted C₁-C₂₀ alkyl group, a substituted or unsubstituted C₆-C₂₀ aryl group, a substituted or unsubstituted C₃-C₂₀ heteroaryl group, a substituted or unsubstituted C₆-C₂₀ condensed polycyclic group, a halogen group, a cyano group, a nitro group, a hydroxyl group, or a carboxyl group;

p in Formula 2a is an integer from 1 to 5, p on Formulae 2b and 2d is an integer from 1 to 7, and p in Formula 2e is an integer from 1 to 9; and

*indicates a binding site.

5. The compound of claim 1, wherein A and B are each independently a bond, a group represented by Formulae 3a to 3e, or a linker including at least two groups represented by Formulae 3a to 3e connected to each other:

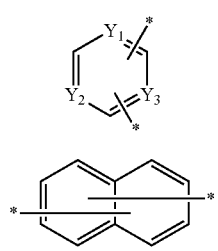

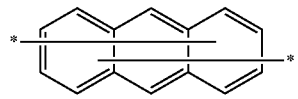

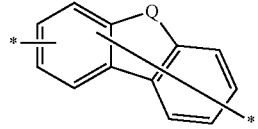

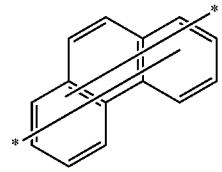

wherein,

Y₁, Y₂, and Y₃ are each independently a linking group represented by —N=, —N(R₂₀)—, or —C(R₂₁)=;

Q is a linking group represented by —C(R₃₀)(R₃₁)—, —N(R₃₂)—, —S—, or —O—;

R₂₀, R₂₁, R₃₀, R₃₁, and R₃₂ are each independently a hydrogen atom, a deuterium atom, a substituted or unsubstituted C₁-C₂₀ alkyl group, a substituted or unsubstituted C₆-C₂₀ aryl group, a substituted or unsubstituted C₃-C₂₀ heteroaryl group, a substituted or unsubstituted C₆-C₂₀ condensed polycyclic group, a halogen group, a cyano group, a nitro group, a hydroxyl group, or a carboxyl group; and

*indicates a binding site.

6. The compound of claim 1, wherein Ar₁ and Ar₂ are each independently a group represented by one of Formulae 4a to 4e:

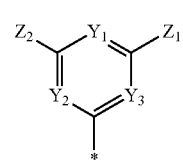

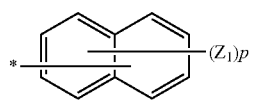

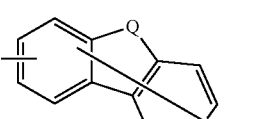

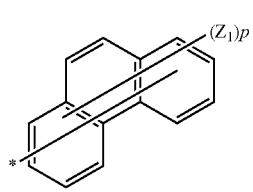

-continued

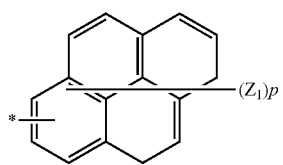

wherein,

Y₁, Y₂, and Y₃ are each independently a linking group represented by —N═, —N(R₂₀)—, or —C(R₂₁)═;

Q is a linking group represented by —C(R₃₀)(R₃₁)—, —N(R₃₂)—, —S—, or —O—;

$Z_1$, $Z_2$, $R_{20}$, $R_{21}$, $R_{30}$, $R_{31}$, and $R_{32}$ are each independently a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_3$-$C_{20}$ heteroaryl group, a substituted or unsubstituted $C_6$-$C_{20}$ condensed polycyclic group, a halogen group, a cyano group, a nitro group, a hydroxyl group, or a carboxyl group, wherein adjacent $R_{30}$ and $R_{31}$ groups may optionally link to form a ring;

p in Formulae 4b and 4c is an integer from 1 to 7, and p in Formulae 4d and 4e is an integer from 1 to 9; and

*indicates a binding site.

7. The compound of claim 1, wherein Ar₁ and Ar₂ in Formula 1 are linked to form a ring.

8. The compound of claim 1, wherein the compound of Formula 1 is one of Compounds 1 through 91:

1

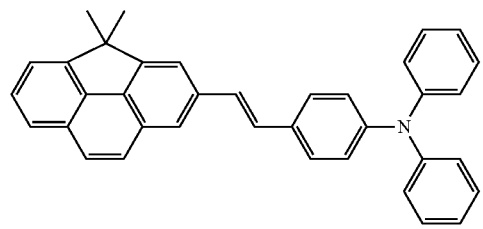

2

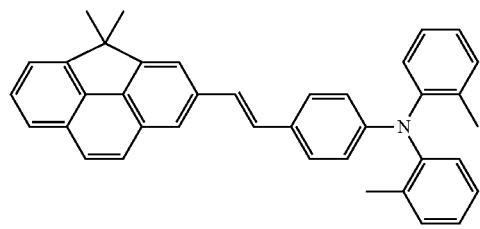

3

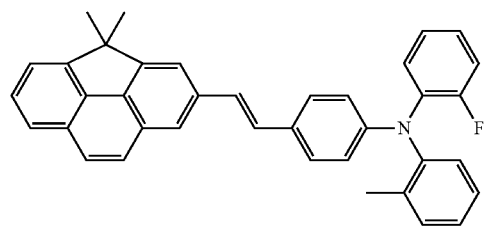

4

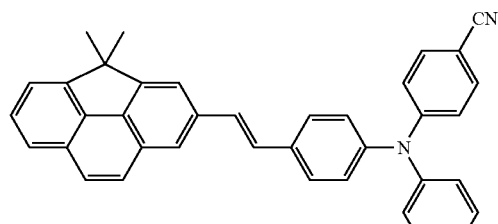

5

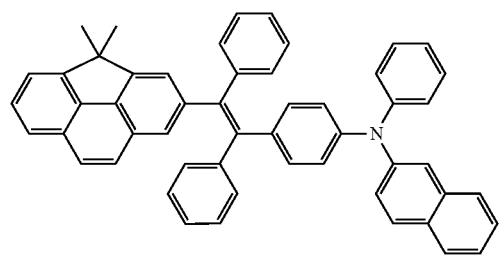

6

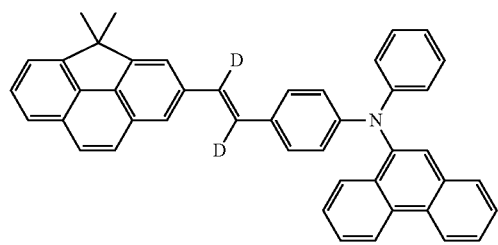

7

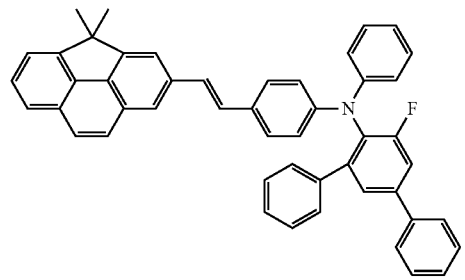

8

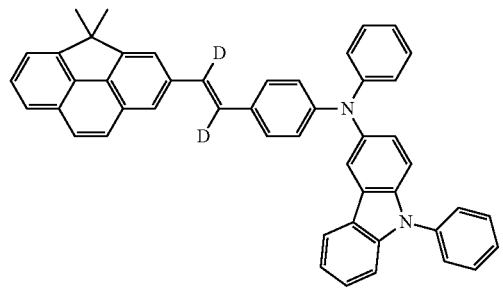

-continued
9
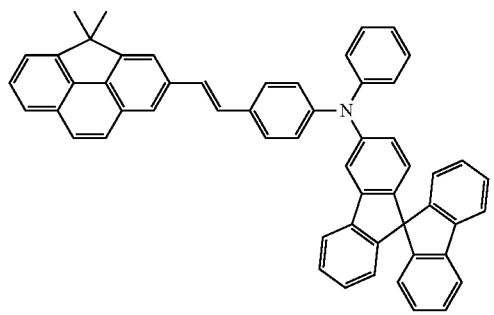
10
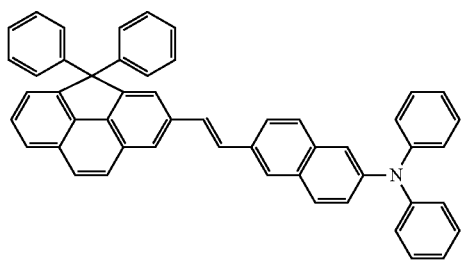
11
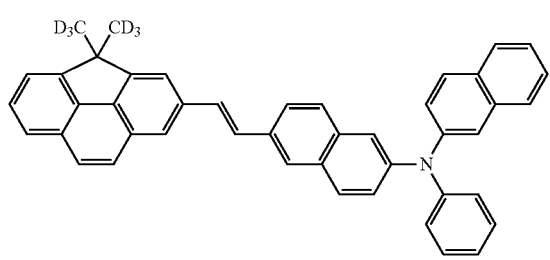
12
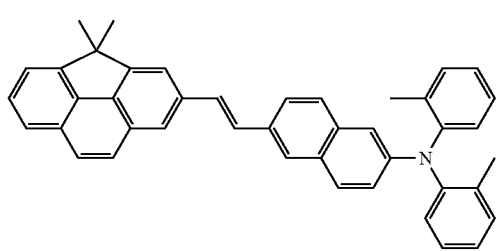
13
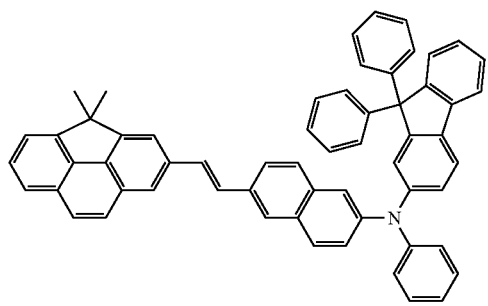
14
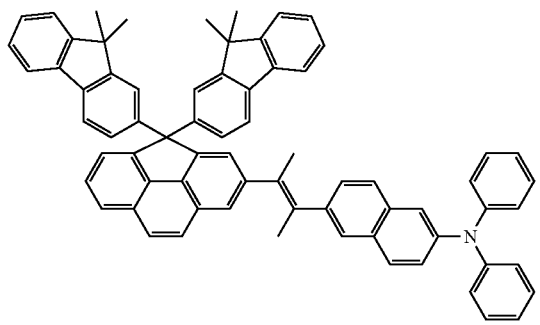
15
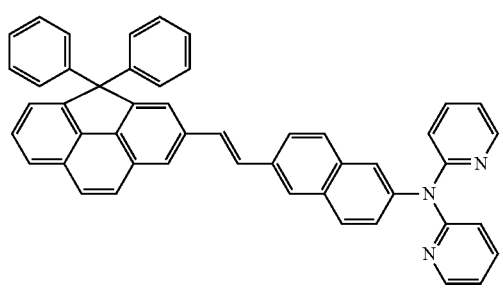
16
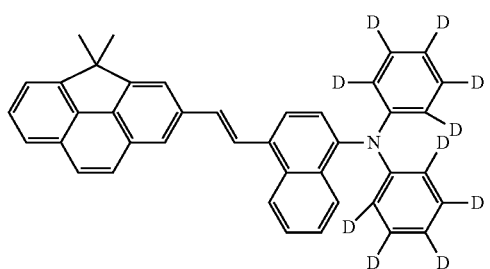
17
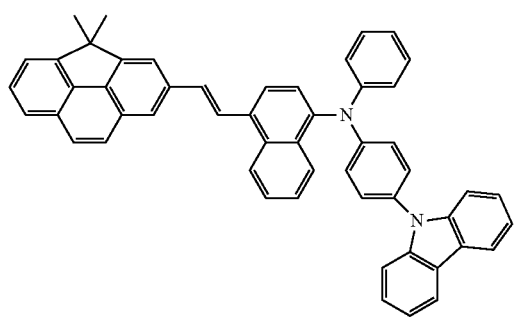
18
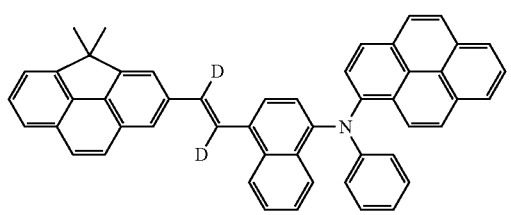

-continued
19
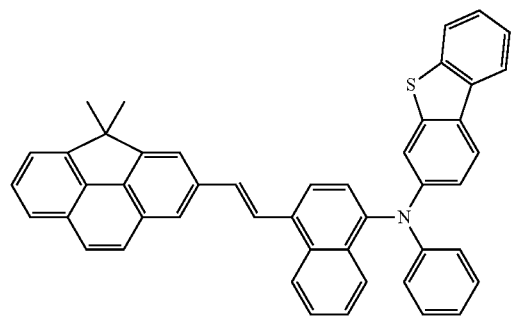
20
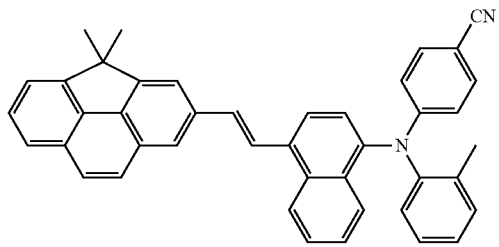
21
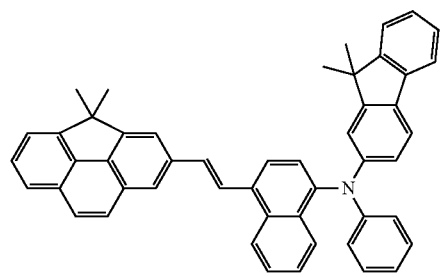
22
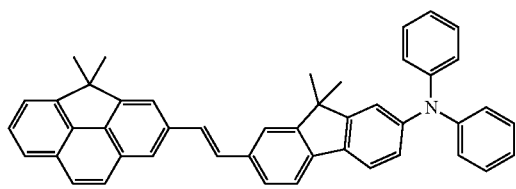
23
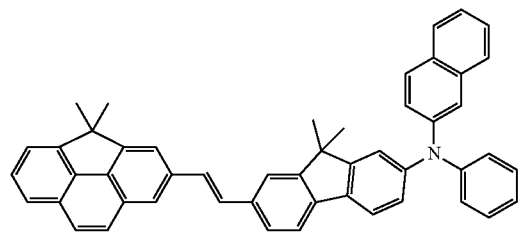
24
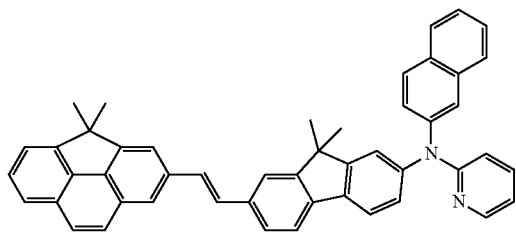
25
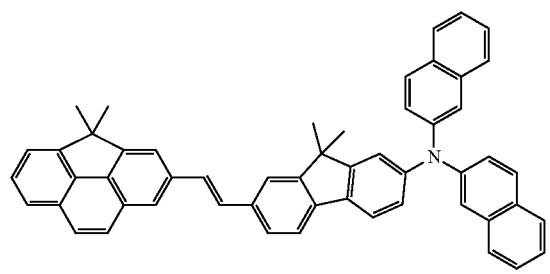
26
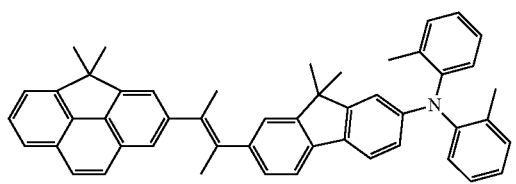
27
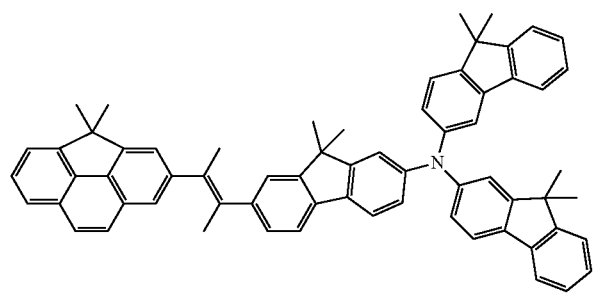
28
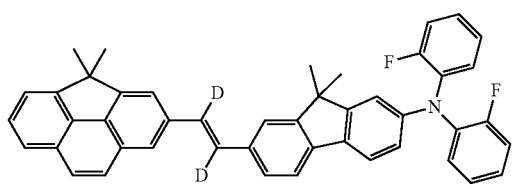

-continued
29
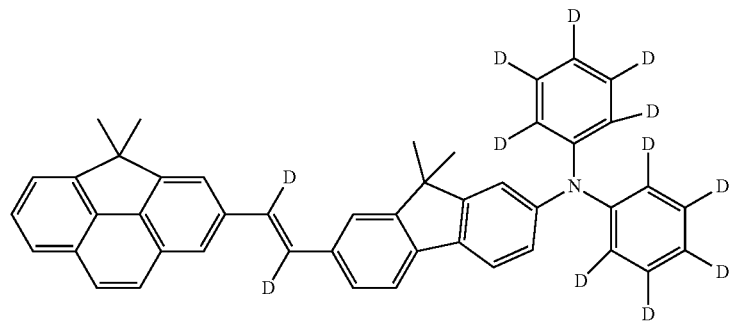
30
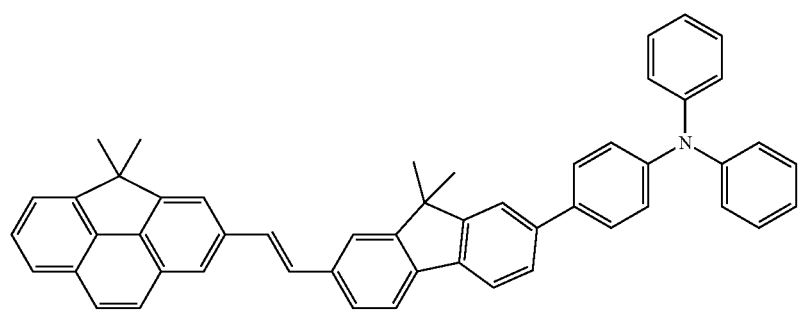
31
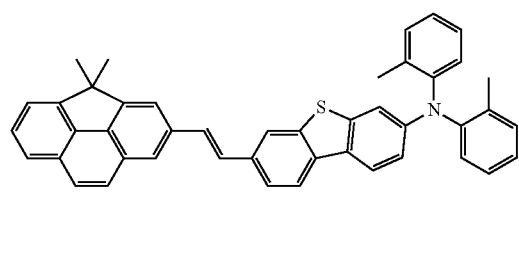
32
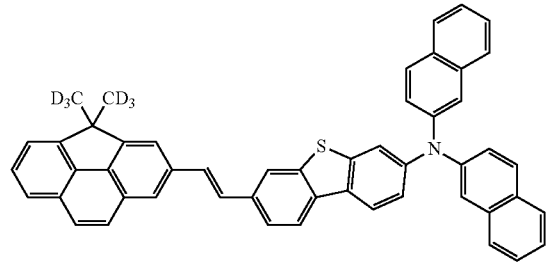
33
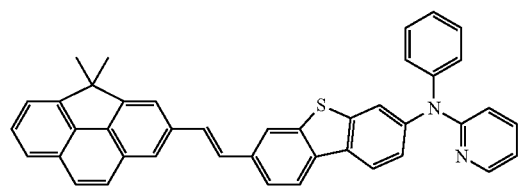
34
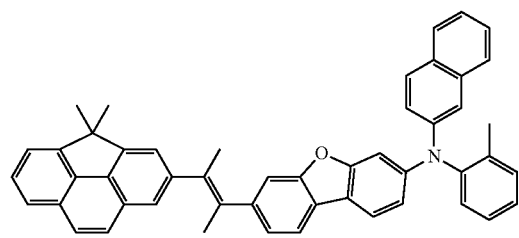
35
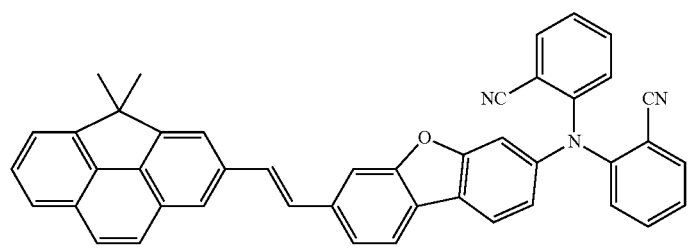

-continued
36
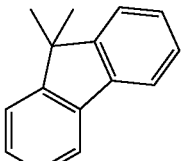
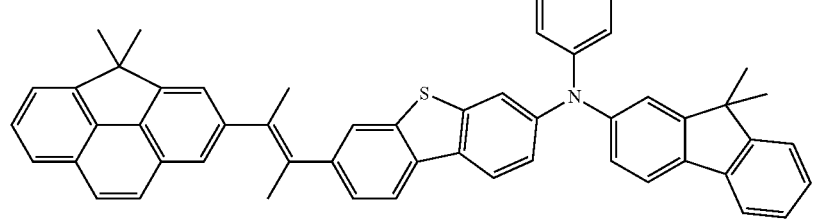
37
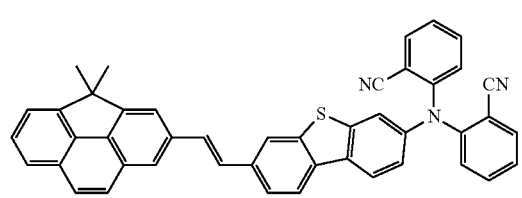
38
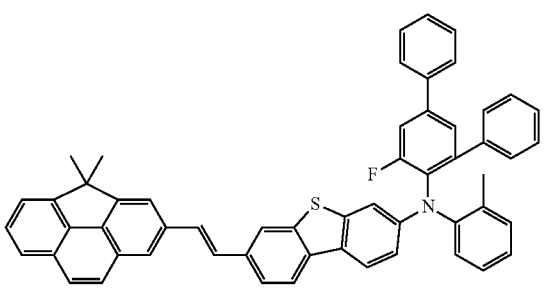
39
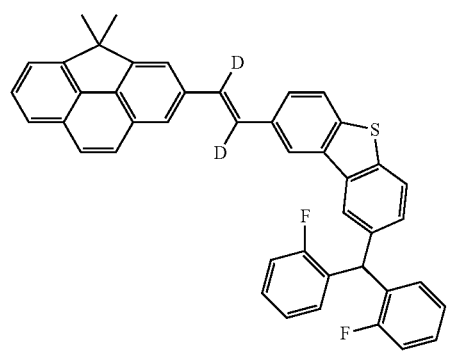
40
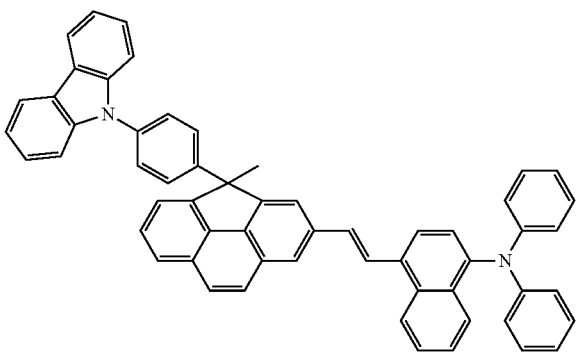
41
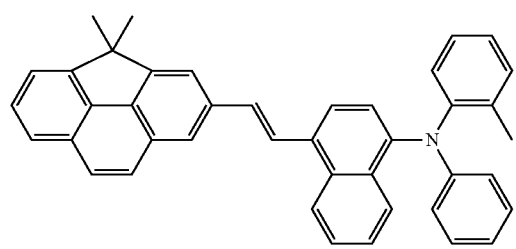
42
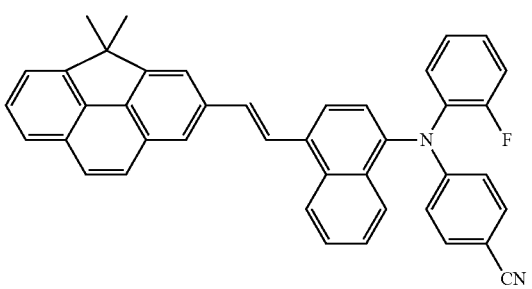

-continued
43
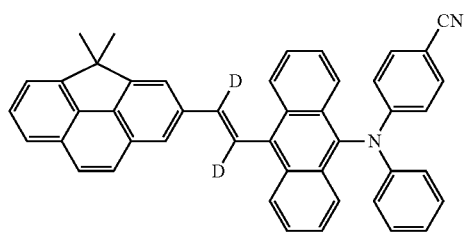
44
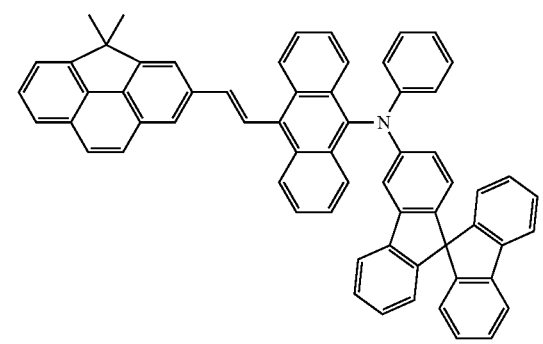
45
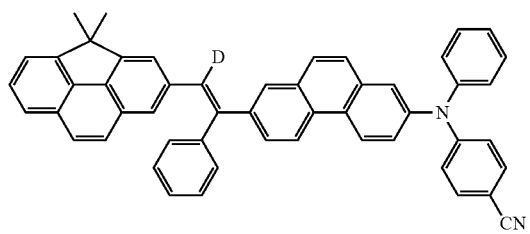
46
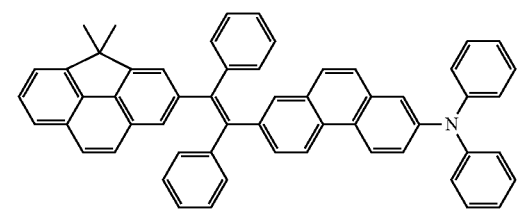
47
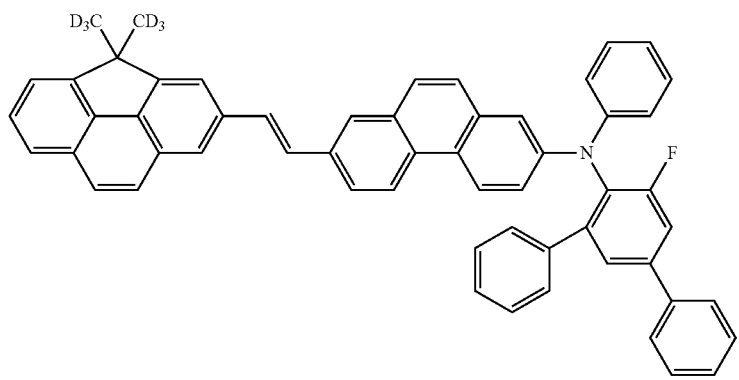
48
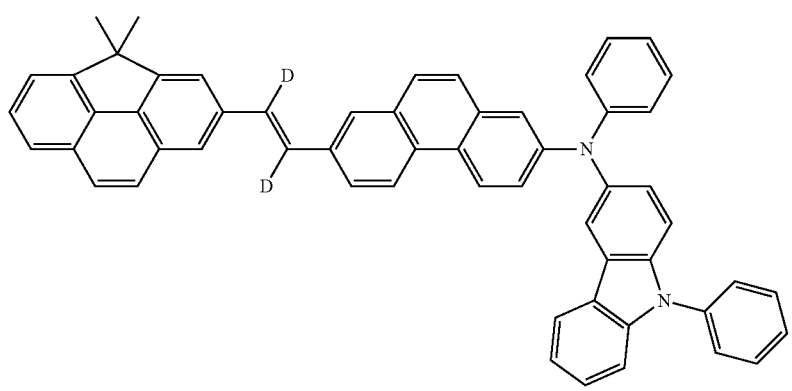
49
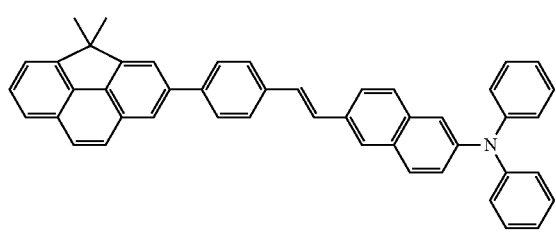
50
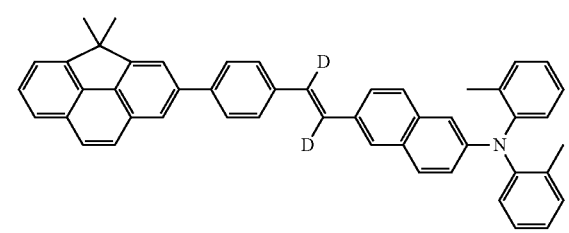

-continued
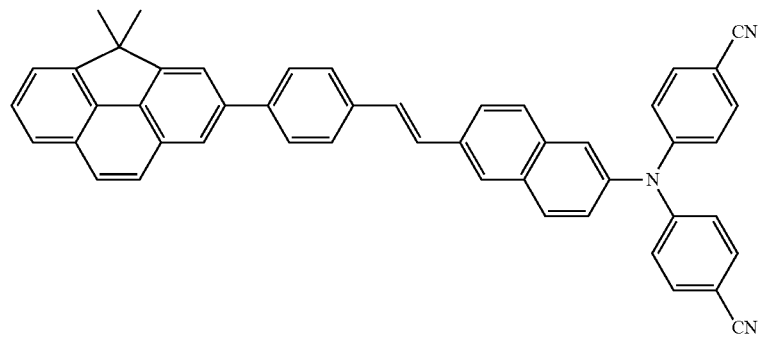
51
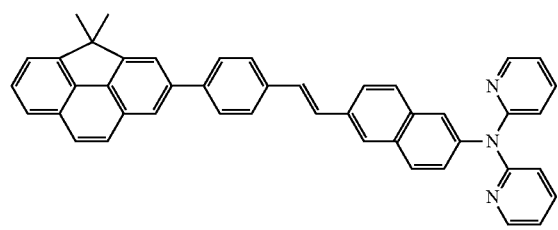
52
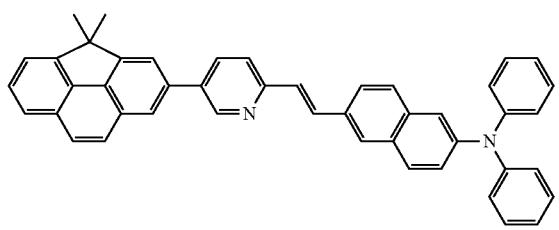
53
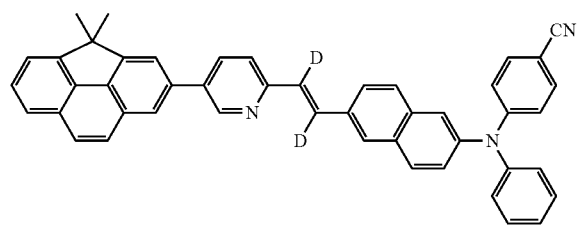
54
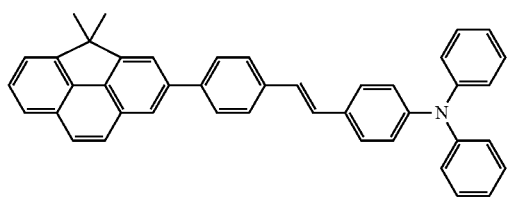
55
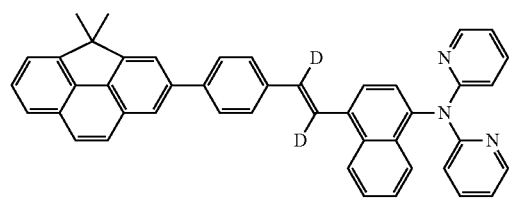
56
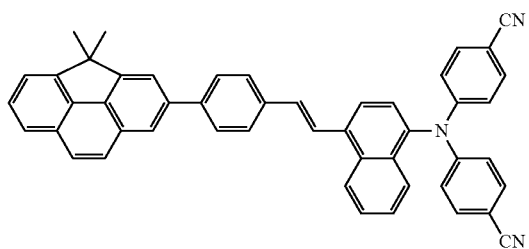
57
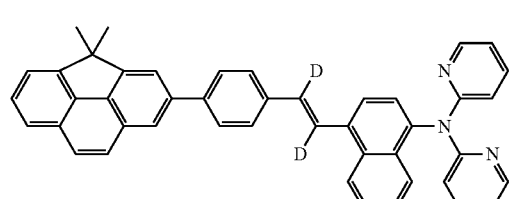
58
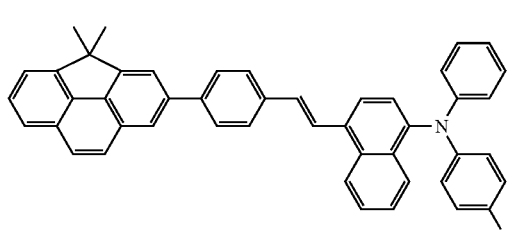
59
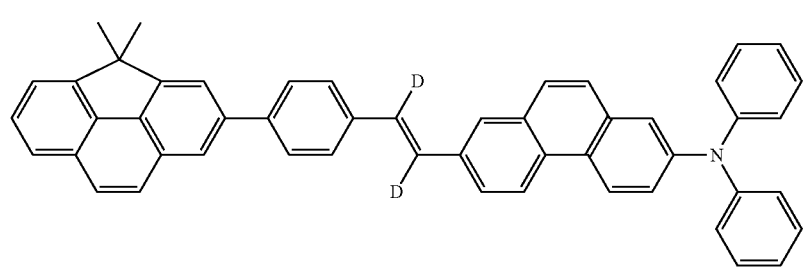
60

-continued
61
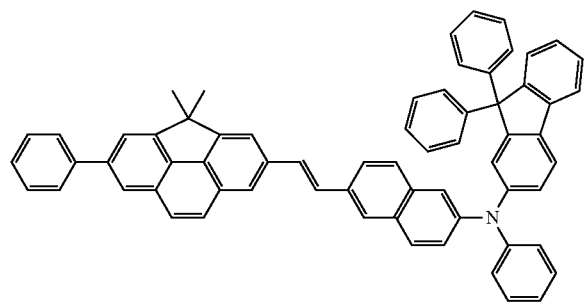
62
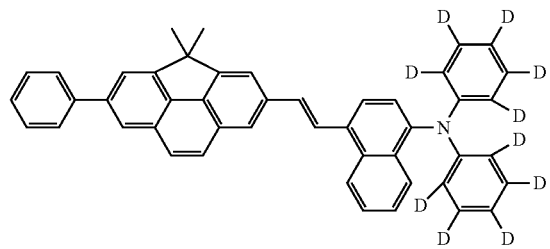
63
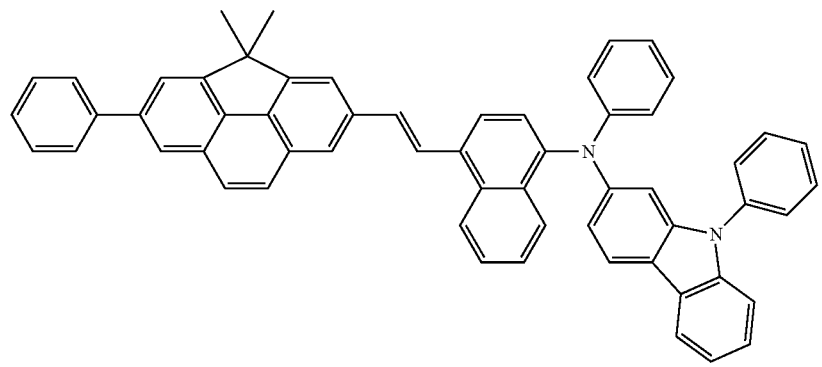
64
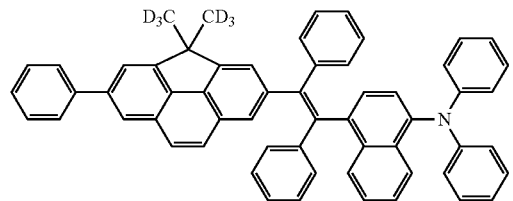
65
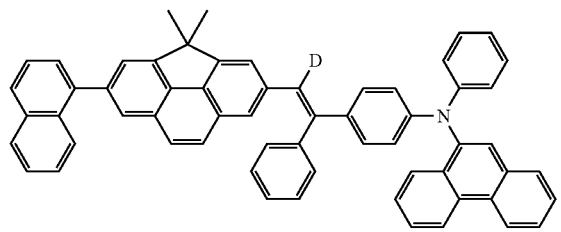
66
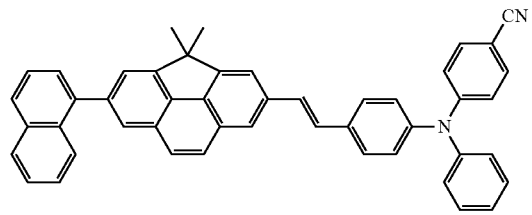
67
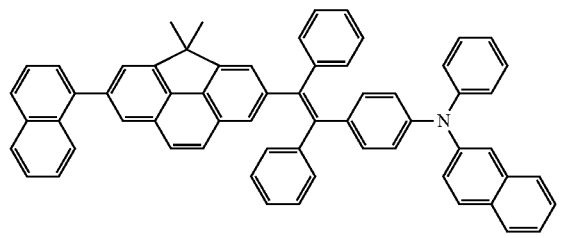
68
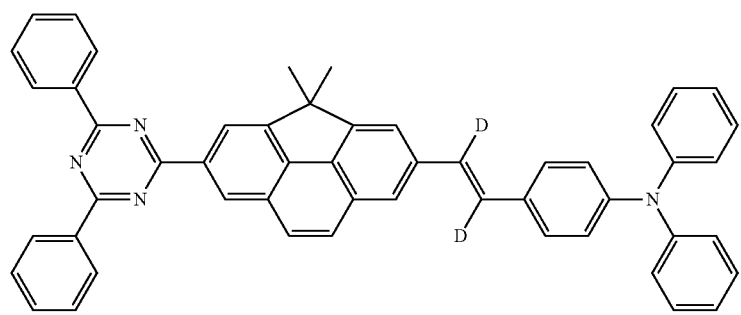

-continued
69
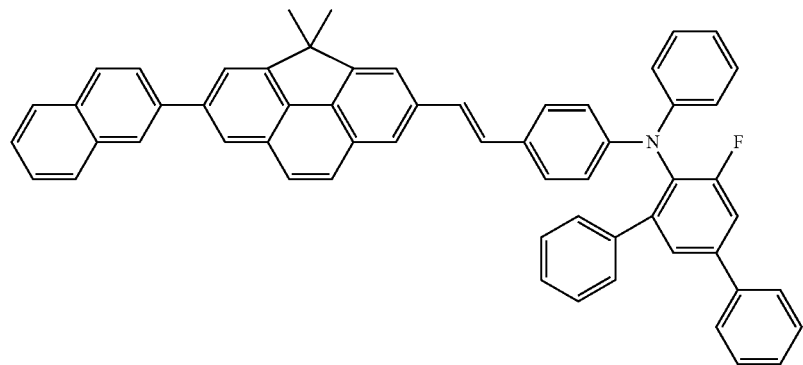
70
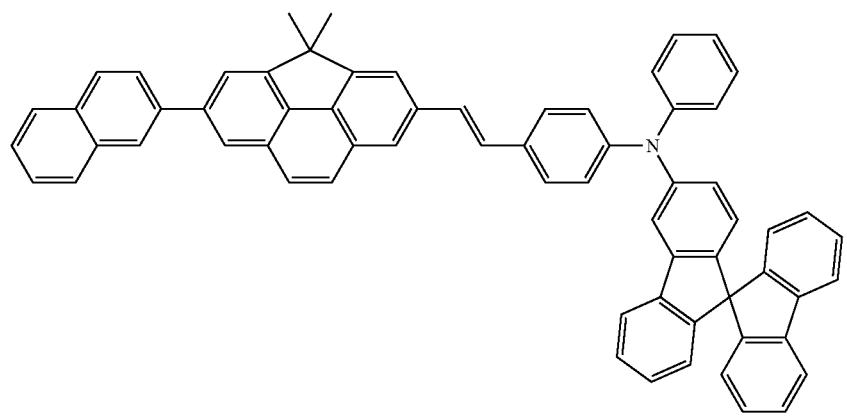
71
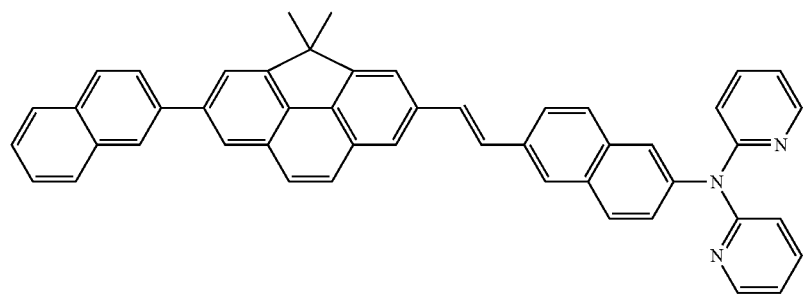
72
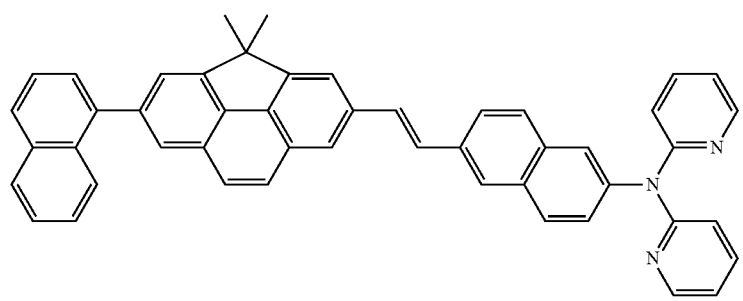
73
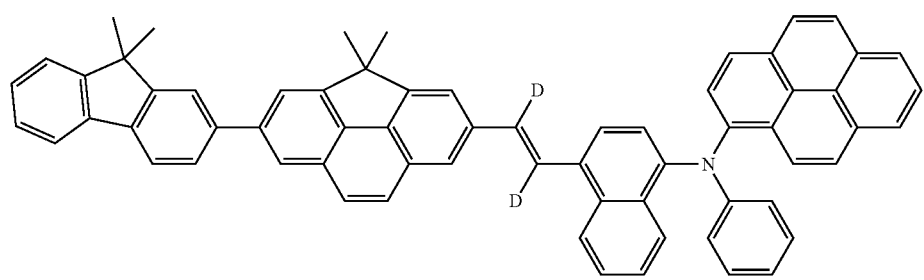

74
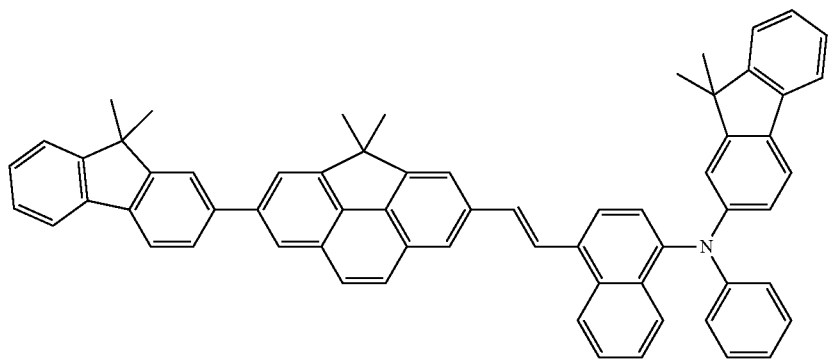
75
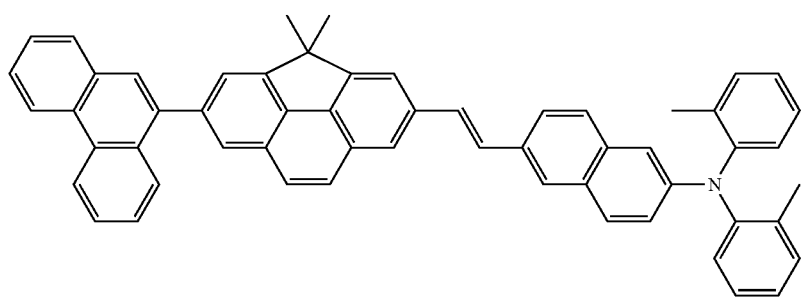
76
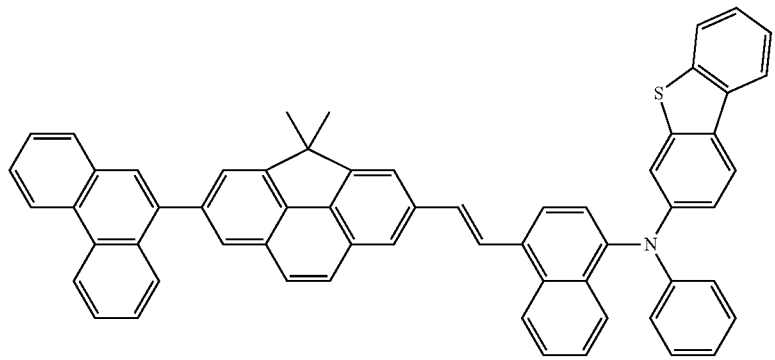
77
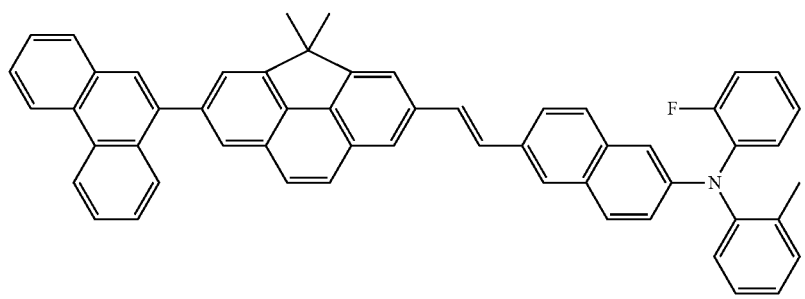
78
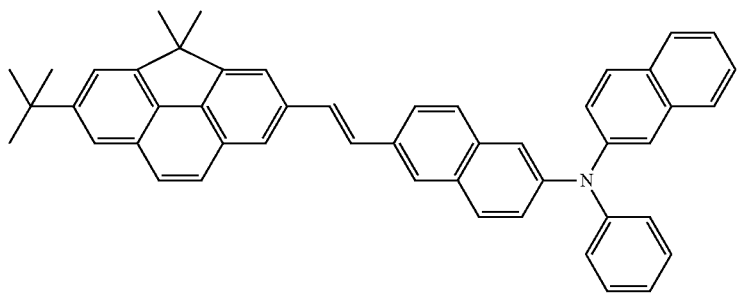

79
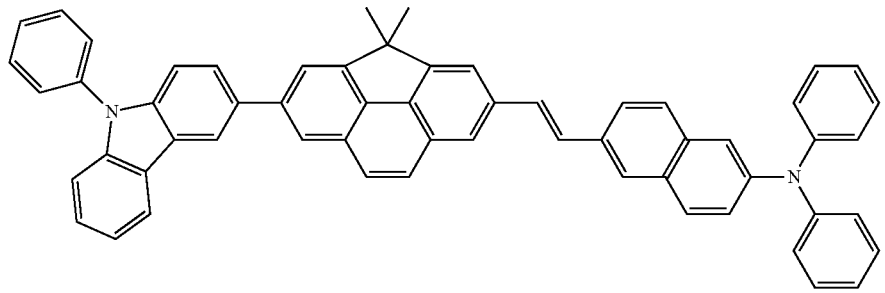
80
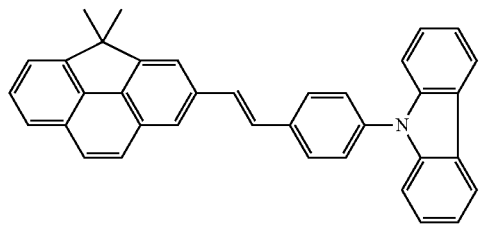
81
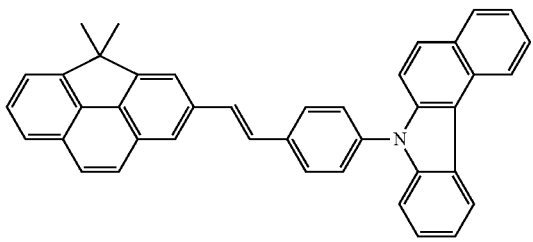
82
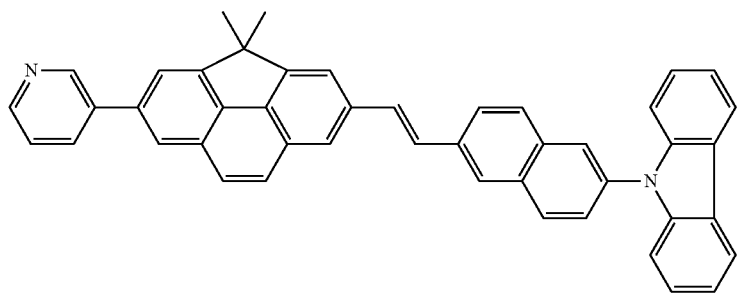
83
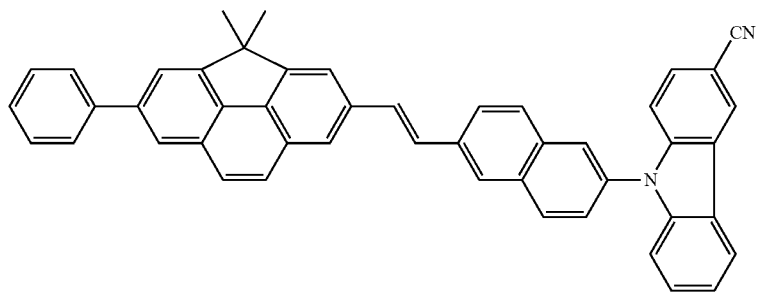
84
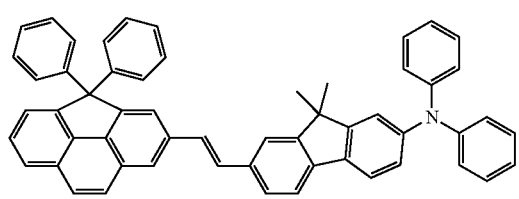
85
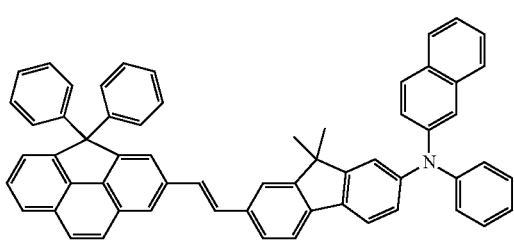
86
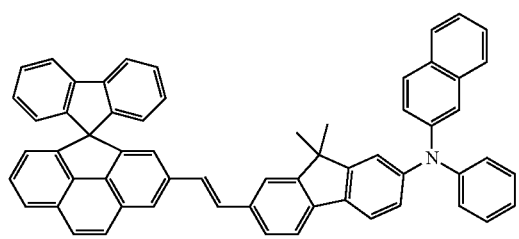
87
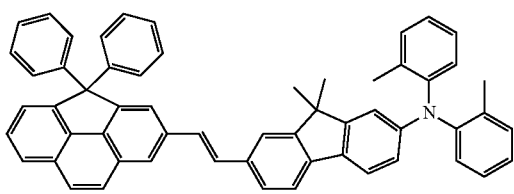

88

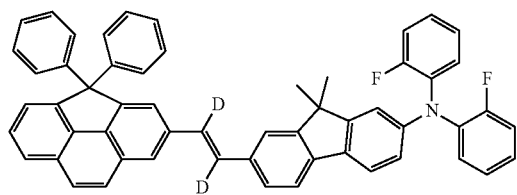

89

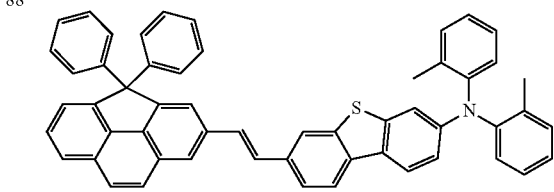

90

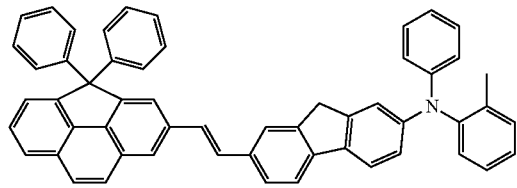

91

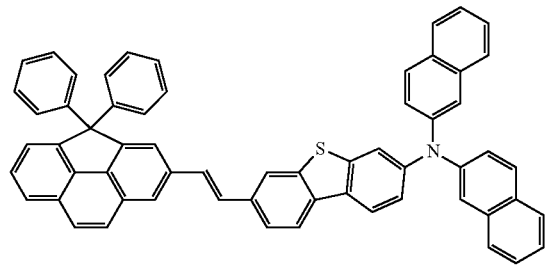

9. An organic light-emitting device comprising:
a first electrode;
a second electrode; and
an organic layer between the first electrode and the second electrode, the organic layer comprising the compound for an organic light-emitting device according to claim 1.

10. The organic light-emitting device of claim 9, wherein the organic layer comprises an emission layer, and the compound represented by Formula 1 is a host or dopant for a fluorescent or phosphorescent device.

11. The organic light-emitting device of claim 9, wherein the organic layer comprises a hole injection layer, a hole transport layer, or a functional layer having both hole injection and hole transport capabilities.

12. The organic light-emitting device of claim 9, wherein the organic layer comprises a blue emission layer.

13. The organic light-emitting device of claim 9, wherein the organic layer comprises a blue emission layer, and the compound of Formula 1 is a blue fluorescent dopant.

14. The organic light-emitting device of claim 9, wherein the organic light-emitting device comprises an emission layer, a hole injection layer, a hole transport layer, or a functional layer having both hole injection and transport capabilities; the emission layer, the hole injection layer, the hole transport layer, or the functional layer having both hole injection and transport capabilities comprises the compound of claim 1; and the emission layer comprises an anthracene compound, an arylamine compound, or a styryl compound.

15. The organic light-emitting device of claim 9, wherein the organic light-emitting device comprises an emission layer, a hole injection layer, a hole transport layer, or a functional layer having both hole injection and hole transport capabilities; and at least one red, green, blue, or white layer of the emission layer comprises a phosphorescent compound.

16. The organic light-emitting device of claim 15, wherein at least one of the hole injection layer, the hole transport layer, and the functional layer having both hole injection and hole transport capabilities further comprises a charge-generating material.

17. The organic light-emitting device of claim 16, wherein the charge-generating material is a p-dopant, and the p-dopant is a quinone derivative, a metal oxide or a cyano group-containing compound.

18. The organic light-emitting device of claim 9, wherein the organic layer further comprises an electron transport layer, and the electron transport layer comprises an electron transporting organic compound and a metal complex.

19. The organic light-emitting device of claim 9, wherein the organic layer is formed from the compound represented by Formula 1 using a wet process.

20. A flat panel display device comprising the organic light-emitting device of claim 9, wherein the first electrode of the organic light-emitting device is electrically connected to a source electrode or a drain electrode of a thin-film transistor.

* * * * *